US011302805B2

(12) United States Patent
Naito

(10) Patent No.: US 11,302,805 B2
(45) Date of Patent: Apr. 12, 2022

(54) SEMICONDUCTOR DEVICE AND MANUFACTURING METHOD TO MANUFACTURE SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/283,837

(22) Filed: Feb. 25, 2019

(65) Prior Publication Data
US 2019/0288095 A1 Sep. 19, 2019

(30) Foreign Application Priority Data

Mar. 16, 2018 (JP) .............................. JP2018-049601

(51) Int. Cl.
H01L 29/73 (2006.01)
H01L 29/739 (2006.01)
(Continued)

(52) U.S. Cl.
CPC .... H01L 29/7397 (2013.01); H01L 21/31111 (2013.01); H01L 21/31116 (2013.01); H01L 27/0664 (2013.01); H01L 29/0653 (2013.01); H01L 29/0696 (2013.01); H01L 29/1095 (2013.01); H01L 29/401 (2013.01); H01L 29/402 (2013.01); H01L 29/407 (2013.01);
(Continued)

(58) Field of Classification Search
CPC ................................................ H01L 29/7397
See application file for complete search history.

(56) References Cited

U.S. PATENT DOCUMENTS 6,534,836 B1  3/2003  Osanai
10,190,948 B2  2/2019  Nagata
(Continued)

FOREIGN PATENT DOCUMENTS

JP   2001345444 A   12/2001
JP   2003078004 A    3/2003
(Continued)

OTHER PUBLICATIONS

Office Action issued for counterpart Japanese Application No. 2018-049601, issued by the Japan Patent Office dated Jan. 4, 2022 (drafted on Dec. 28, 2021).

Primary Examiner — Trang Q Tran

(57) ABSTRACT

The present invention provides a semiconductor device comprising (a) a semiconductor substrate, (b) a gate trench portion provided from an upper surface of the semiconductor substrate into the semiconductor substrate and extends on an upper surface of the semiconductor substrate in a predetermined extending direction, (c) a gate insulating film provided on an inner wall of the gate trench portion, (d) an interlayer dielectric film provided above the semiconductor substrate; and (e) a protective insulating film, which is, in contact with the gate insulating film, provided between the interlayer dielectric film and the gate trench portion in the depth direction of the semiconductor substrate, and is made of a different material from the interlayer dielectric film and the gate insulating film.

17 Claims, 35 Drawing Sheets

(51) Int. Cl.
  *H01L 27/06*   (2006.01)
  *H01L 29/423*  (2006.01)
  *H01L 21/311*  (2006.01)
  *H01L 29/417*  (2006.01)
  *H01L 29/40*   (2006.01)
  *H01L 29/06*   (2006.01)
  *H01L 29/10*   (2006.01)
  *H01L 29/66*   (2006.01)

(52) U.S. Cl.
  CPC ...... *H01L 29/417* (2013.01); *H01L 29/41708* (2013.01); *H01L 29/4236* (2013.01); *H01L 29/42376* (2013.01); *H01L 29/66348* (2013.01)

(56) References Cited

U.S. PATENT DOCUMENTS

| | | | |
|---|---|---|---|
| 10,210,130 B2 | 2/2019 | Siemieniec | |
| 10,276,672 B2* | 4/2019 | Osuga | ............... H01L 29/41766 |
| 2004/0175889 A1 | 9/2004 | Huang | |
| 2010/0327313 A1* | 12/2010 | Nakamura | .......... H01L 29/0834 |
| | | | 257/133 |
| 2014/0080227 A1 | 3/2014 | Tomioka | |
| 2015/0091021 A1 | 4/2015 | Yoshie | |
| 2015/0372090 A1 | 12/2015 | Oosawa | |
| 2016/0284824 A1* | 9/2016 | Nagata | ............... H01L 21/76895 |
| 2017/0207330 A1* | 7/2017 | Enomoto | .......... H01L 21/26506 |
| 2018/0175150 A1* | 6/2018 | Mauder | ............. H01L 21/02255 |

FOREIGN PATENT DOCUMENTS

| | | |
|---|---|---|
| JP | 2010098101 A | 4/2010 |
| JP | 2014063847 A | 4/2014 |
| JP | 2014158013 A | 8/2014 |
| JP | 2015070192 A | 4/2015 |
| JP | 2015135982 A | 7/2015 |
| JP | 2016184622 A | 10/2016 |
| JP | 2017220667 A | 12/2017 |
| WO | 2009122486 A1 | 10/2009 |

* cited by examiner

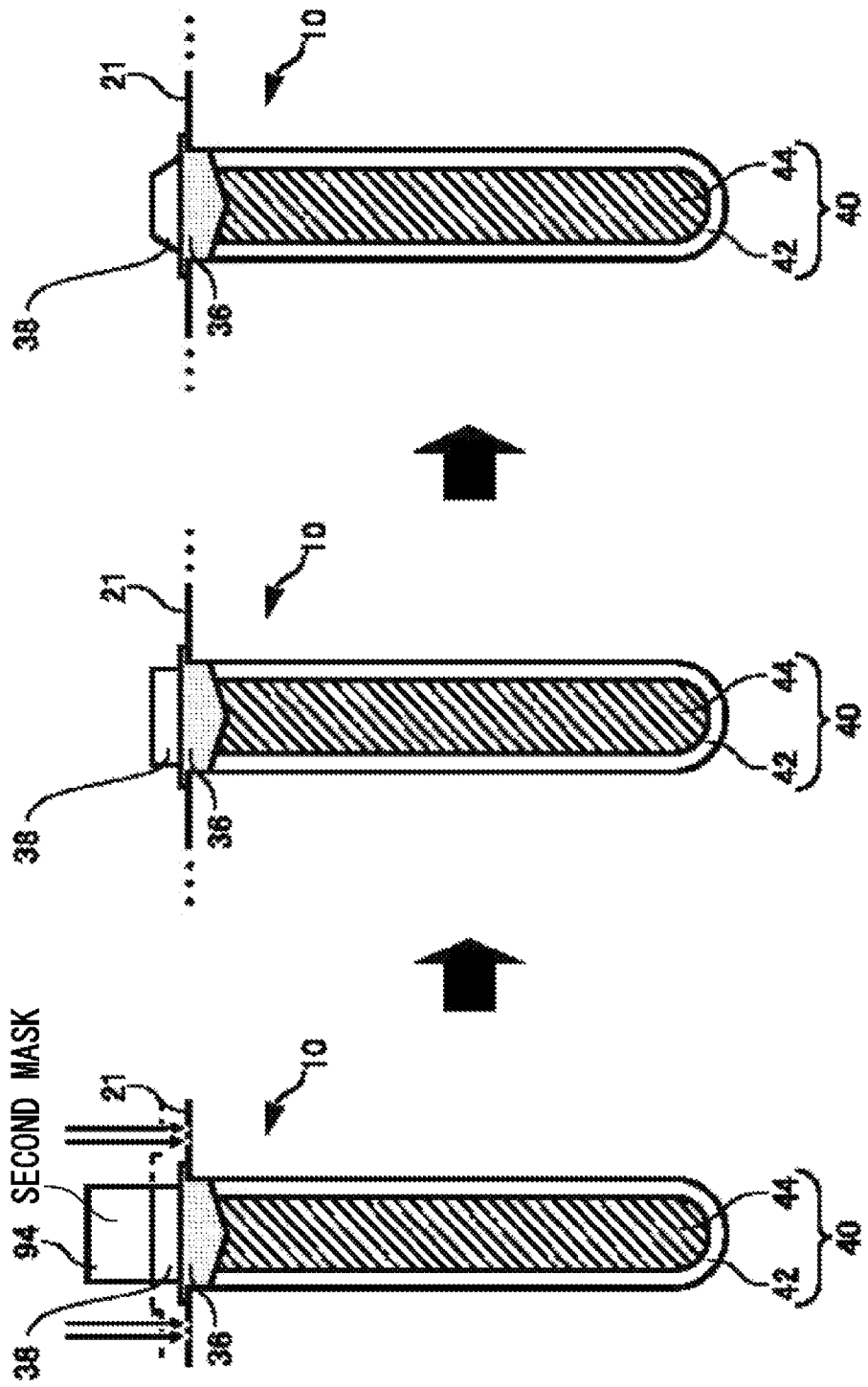

SEMICONDUCTOR DEVICE AND MANUFACTURING METHOD TO MANUFACTURE SEMICONDUCTOR DEVICE

The contents of the following Japanese patent application (s) are incorporated herein by reference:
No. 2018-049601 filed on Mar. 16, 2018.

BACKGROUND

1. Technical Field

The present invention relates to a semiconductor device and a manufacturing method of a semiconductor device.

2. Related Art

Conventionally, a semiconductor device such as an insulated gate bipolar transistor (IGBT) is known. (For example, see Patent document 1 and 2.)
Patent document 1 Japanese Patent Application Publication No. 2015-135982
Patent document 2 Japanese Patent Application Publication No. 2015-070192
Further miniaturization is preferable in a semiconductor device.

SUMMARY

A first aspect of the present invention provides a semiconductor device which includes a semiconductor substrate, a gate trench portion provided from an upper surface of the semiconductor substrate into the semiconductor substrate and extends on an upper surface of the semiconductor substrate in a predetermined extending direction, a gate insulating film provided on an inner wall of the gate trench portion, and an interlayer dielectric film provided above the semiconductor substrate. The semiconductor device includes, in the depth direction of the semiconductor substrate, a protective insulating film which is in contact with the gate insulating film, is provided between the interlayer dielectric film and the gate trench portion, and is made of a different material from the interlayer dielectric film and the gate insulating film.

The semiconductor device may further include a gate conductive portion surrounded by a gate insulating film inside the gate trench portion. The protective insulating film may be in contact with the gate conductive portion.

The upper end of the gate conductive portion may be placed below the upper surface of the semiconductor substrate in the depth direction of the semiconductor substrate. A protective insulating film may be provided above at least part of the gate conductive portion in a direction parallel to the upper surface of the semiconductor substrate.

The semiconductor device may further include a mesa portion in contact with the gate trench portion in an arrangement direction orthogonal to the extending direction. In the depth direction of the semiconductor substrate, the position of the upper surface of the mesa portion may be equal to the position of the upper surface of the protective insulating film.

The semiconductor device may further include a mesa portion in contact with the gate trench portion in an arrangement direction orthogonal to the extending direction. The mesa portion may be in contact with the protective insulating film.

In the depth direction of the semiconductor substrate, the interlayer dielectric film and protective insulating film may be in contact with each other. On the boundary where the interlayer dielectric film and the protective insulating film are in contact with each other, the width of the interlayer dielectric film in an arrangement direction orthogonal the extending direction may be equal to the width of the protective insulating film in the arrangement direction.

The width of the protective insulating film in an arrangement direction orthogonal to the extending direction may be larger than the width of the interlayer dielectric film in the arrangement direction. In the depth direction of the semiconductor substrate, the thickness of the protective insulating film may be smaller than the thickness of the interlayer dielectric film. The protective insulating film may be a nitride film.

A second aspect of the present invention provides a manufacturing method of a semiconductor device. The manufacturing method of a semiconductor device includes a first step to form a protective insulating film on a semiconductor substrate, a second step to pattern and etch a protective insulating film to expose the upper surface of the semiconductor substrate, a third step to form a interlayer dielectric film on the protective insulating film, and a fourth step to pattern and etch a interlayer dielectric film to expose the protective insulating film on the upper surface of the semiconductor substrate.

In the manufacturing method of a semiconductor device, the second step and the fourth step may be performed using dry etching. An etching gas in the second step may be different from an etching gas in the fourth step.

The manufacturing method of a semiconductor device may further include a fifth step to etch a side surface and an upper surface of the interlayer dielectric film using wet etching.

The summary clause does not necessarily describe all necessary features of the embodiments of the present invention. The present invention may also be a sub-combination of the features described above.

BRIEF DESCRIPTION OF THE DRAWINGS

FIG. 2b shows an enlarged view of the region A1 in FIG. 2a.

FIG. 3b shows an enlarged view of the region A2 in FIG. 3a.

FIG. 4b shows an enlarged view of the region A3 in FIG. 4a.

FIG. 5b shows an enlarged view of the region A4 in FIG. 5a.

FIG. 7b shows an enlarged view of the region Z in FIG. 2a.

FIG. 8b shows an enlarged view of the region A4 in FIG. 8a.

FIG. 9b shows an enlarged view of the region A5 in FIG. 9a.

FIG. 10b shows an enlarged view of the region A6 in FIG. 10a.

FIG. 12b shows an enlarged view of the region B1 in FIG. 12a.

FIG. 13b shows an enlarged view of the region B2 in FIG. 13a.

FIG. 14b shows an enlarged view of the region B3 in FIG. 14a.

FIG. 15b shows an enlarged view of the region B4 in FIG. 15a.

FIG. 16b shows an enlarged view of the region B5 in FIG. 16a.

FIG. 17b shows an enlarged view of the region B6 in FIG. 17a.

FIG. 18b shows another example for the manufacturing method of the semiconductor device 100 according to the present embodiment.

DESCRIPTION OF EXEMPLARY EMBODIMENTS

Hereinafter, the present invention will be described with reference to embodiments of the invention. However, the following embodiments should not to be considered as limiting the claimed invention. Also, all the combinations of the features described in the embodiment(s) are not necessarily essential for means provided by aspects of the invention.

In this specification, one side in a direction parallel to the depth direction of a semiconductor substrate is referred to as the "upper" side, and the other side is referred to as the "lower" side. One of two main surfaces of a substrate, a layer or some other member is referred to as an upper surface, and the other surface is referred to as a lower surface. The "upper" and the "lower" directions are not limited by the direction of gravity or the direction of attachment to a substrate or the like at the time of implementation of a semiconductor device.

In this specification, technical matters may be described using orthogonal coordinate axes of X axis, Y axis and Z axis. In this specification, the X-Y plane is defined as a plane parallel to the upper surface of a semiconductor substrate, and Z axis is defined to be along a depth direction perpendicular to the upper surface of the semiconductor substrate.

Each implementation shows an example in which a first conductivity type is N type and a second conductivity type is P type. However, in other examples, the first conductivity type may be P type and the second conductivity type may be N type. In this case, conductivity types of substrates, layers, regions and the like in each implementation have opposite polarities, respectively. Also, the reference to P+ type (or N+ type) in this specification means that it has higher doping concentration than P type (or N type), while the reference to P− type (or N− type) means that it has higher doping concentration than P type (or N type).

In this specification, doping concentration refers to the concentration of impurities acting as donors or acceptors. In this specification, doping concentration may refer to the difference in concentration of donors and acceptors. In addition, the peak value of the doping concentration distribution in a doped region may refer to the doping concentration in the doped region.

Figure 1:
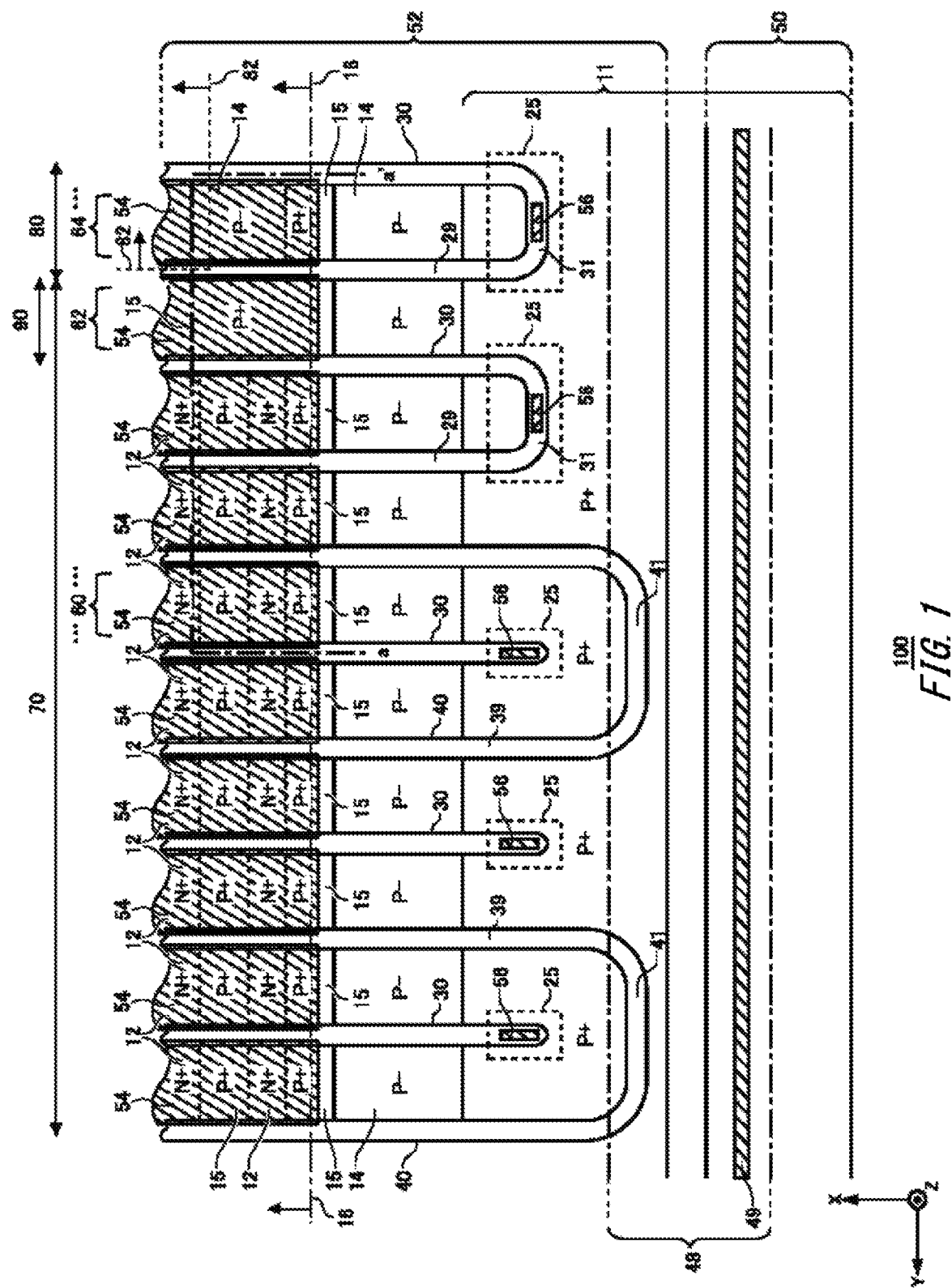
FIG. 1 shows a part of one example for an upper surface of the semiconductor device 100 according to the present embodiment.

FIG. 1 shows a part of one example of the upper surface of the semiconductor device 100 according to the present embodiment. The semiconductor device 100 in the present example is a semiconductor chip (die) including a transistor portion 70 and a diode portion 80 in contact with the transistor portion 70. The transistor portion 70 includes transistors such as IGBTs. The boundary portion 90 is a region in the transistor portion 70 in contact with the diode portion 80. The diode portion 80 includes a diode such as a FWD (Free Wheel Diode) on the upper surface of a semiconductor substrate. FIG. 1 shows an upper surface of the chip around the chip end, and other regions are not shown.

In addition, FIG. 1 shows an active region of the semiconductor substrate in the semiconductor device 100, but the semiconductor device 100 may include an edge termination structure portion surrounding the active region. The active region refers to a region through which main current flows between the upper surface and the lower surface of the semiconductor substrate while the semiconductor device 100 is controlled to be in the ON state. The edge termination structure portion mitigates the electric field concentration on the upper surface side of the semiconductor substrate. The edge termination structure portion includes, for example, a guard ring, field plate or a resurf structure, or combinations thereof.

The semiconductor device 100 of the present example is provided inside the semiconductor substrate, and includes gate trench portions 40, dummy trench portions 30, well regions 11, emitter regions 12, base regions 14 and contact regions 15, exposed on the upper surface of the semiconductor substrate. The semiconductor device 100 of the present example also includes an emitter electrode 52 and a gate metal layer 50 provided above the upper surface of the semiconductor substrate. The emitter electrode 52 and the gate metal layer 50 are provided separately from each other.

Although an interlayer dielectric film is provided between the emitter electrode 52 and the gate metal layer 50, and the upper surface of the semiconductor substrate, it is not shown in FIG. 1. In the present example, the interlayer dielectric film is provided with contact holes 56, contact holes 49 and contact holes 54 passing through the interlayer dielectric film.

The emitter electrode 52 is connected to dummy conductive portions inside the dummy trench portions 30 via the contact holes 56. The connection portions 25, formed of a conductive material such as impurity-doped polysilicon, may be provided between the emitter electrode 52 and the dummy conductive portions. An insulating film such as an oxide film is provided between the connection portions 25 and the upper surface of the semiconductor substrate.

The gate metal layer 50 contacts to a gate runner 48 through a contact hole 49. The gate runner 48 is formed of impurity-doped poly silicon or the like. The gate runner 48 is connected to gate conductive portions inside the gate trench portions 40 at the upper surface of the semiconductor substrate. The gate runner 48 is not connected to the dummy conductive portions inside the dummy trench portions 30.

The gate runner 48 in the present example is formed from below the contact hole 49 to the edge portion of the gate trench portion 40. An insulating film such as an oxide film or the like is formed between the gate runner 48 and the upper surface of the semiconductor substrate.

At the edge portion of the gate trench portion 40, the gate conductive portion is exposed on the upper surface of the semiconductor substrate. That is, at least part of the upper end of gate conductive portion is not covered with material constituting the semiconductor substrate. The upper end of the gate conductive portion may be placed below the upper surface of the semiconductor substrate. The gate trench portion 40 is in contact with a gate runner 48 through the exposed portion of the gate conductive portion.

The emitter electrode 52 and the gate metal layer 50 are formed of a metal-containing material. At least partial region of the emitter electrode 52 may be formed of aluminum or aluminum-silicon alloy.

At least partial region of the gate metal layer 50 may be formed of aluminum or aluminum-silicon alloy. The emitter electrode 52 and the gate metal layer 50 may include a barrier metal formed of titanium, titanium compound, and the like under the region formed of aluminum and the like. Additionally, the emitter electrode 52 and the gate metal layer 50 may include a plug formed of tungsten and the like in the contact hole.

One or more gate trench portions 40 and one or more dummy trench portions 30 are arrayed at predetermined intervals along a predetermined arrangement direction (Y-axis direction in the present example). The gate trench portion 40 in the present example may include two extending portion 39 which extend in an extending direction parallel to the upper surface of the semiconductor substrate and perpendicular to the arrangement direction (the X-axis direction in the present example) and a connecting portion 41 which connects the two extending portion 39. At least part of connecting portion 41 is preferably formed in a curved shape in a top view. Connecting the ends of the two extending portions 39 of the gate trench portion 40 can mitigate the electric field concentration at the ends of the extending portions 39. In this specification, each extending portion 39 of the gate trench portion 40 may be regarded as one gate trench portion 40. The gate runner 48 may be connected to the gate conductive portions at the connecting portions 41 of the gate trench portions 40.

The dummy trench portion 30 in the present example may have a U-shape on the upper surface of the semiconductor substrate, like the gate trench portion 40. That is, the dummy trench portion 30 in the present example may have two extending portions 29 extending along the extending direction, and connecting portions 31 to connect the two extending portions 29.

The emitter electrode 52 is formed above the gate trench portion 40, the dummy trench portion 30, the well region 11, the emitter region 12, the base region 14 and the contact region 15. The well region 11 is of a second conductivity type. The well region 11 is of, for example, the P+ type. The well region 11 is formed in a predetermined range from the end of the active region in the top view. The well region 11 may be provided deeper into the active region than the gate metal layer 50. A diffusion depth of the well region 11 may be greater than depths of the gate trench portion 40 and the dummy trench portion 30. Ends of the gate trench portion 40 and the dummy trench portion 30 in the extending direction are formed in the well region 11. The bottom in the Z-axis direction of the ends of the gate trench portion 40 and the dummy trench portion 30 may be covered with the well region 11.

In a plane parallel to the upper surface of the semiconductor substrate, the mesa portion is provided in contact with each trench portion in the Y-axis direction. The mesa portion is a portion of the semiconductor substrate sandwiched by two adjacent trench portions. The mesa portion may be a portion from the upper surface of the semiconductor substrate to the deepest portion or bottom of each trench portion. The mesa portion may be defined as a region sandwiched between two adjacent extending portions (29 or 39).

In the transistor portion 70, a first mesa portion 60 is provided in contact with each trench portion. On the boundary portion 90, a second mesa portion 62 is provided in the region sandwiched between adjacent dummy trench portions 30. In the diode portion 80, a third mesa portion 64 is provided in the region sandwiched between adjacent dummy trench portions 30.

On both end portions in the X-axis direction of the first mesa portion 60, the second mesa portion 62, and the third mesa portion 64, for example, a base region 14 of the second conductivity type is provided. The base region 14 is exposed on the upper surface of the semiconductor substrate. The base region 14 of the present example is, for example, of P– type. It is noted that FIG. 1 shows only one end in the X-axis direction of each mesa portion.

On the upper surface of the first mesa portion 60, an emitter region 12 is provided in contact with the gate trench portion 40. The emitter region 12 may be provided from one of two trench portions (in the present example, the extending portion 29 or 39), with the first mesa portion 60 sandwiched therebetween, to the other. The emitter region 12 is also provided below the contact hole 54. FIG. 1 shows, as a dashed line, the boundary of the emitter region 12 in the region which overlaps the contact hole 54 in the top view of the semiconductor substrate.

The emitter region 12 may or may not be in contact with the dummy trench portion 30. In the present example, the emitter region 12 may be provided in contact with the dummy trench portion 30. The emitter region 12 in the present example may be of the first conductivity type. The emitter region 12 in the present example is, for example, of the N+ type.

On the upper surface of the first mesa portion 60, a contact region 15 of the second conductivity type with a higher doping concentration than the base region 14 is provided. The contact region 15 in the present example is, for example, of the P+ type. In the first mesa portion 60, the emitter region 12 and the contact region 15 may be alternately provided in the extending direction of the gate trench portion 40. The contact region 15 may be provided from one of two trench portions, with the first mesa portion 60 sandwiched therebetween, to the other. The contact region 15 is also provided below the contact hole 54. FIG. 1 shows, as a dashed line, the boundary of the contact region 15 in the region which overlaps the contact hole 54 in the top view of the semiconductor substrate.

The contact region 15 may or may not be in contact with the gate trench portion 40. The contact region 15 may or may not be in contact with the dummy trench portion 30. In the present example, the contact region 15 may be provided in contact with the dummy trench portion 30 and the gate trench portion 40.

On the upper surface of the second mesa portion 62, a contact region 15 is provided. The area of the contact region 15 provided on the upper surface of one second mesa portion 62 may be larger than the area of the contact region 15 provided on the upper surface of one first mesa portion 60. The area of the contact region 15 provided on the upper surface of one second mesa portion 62 may be larger than the area of the contact region 15 provided on the upper surface of one third mesa portion 64. In the second mesa portion 62, the contact region 15 is also provided below the contact hole 54.

The contact region 15 on the upper surface of the second mesa portion 62 may be provided on the whole region sandwiched between two base regions 14. The two base regions 14 are provided on both end portions in the X-axis direction of the second mesa portion 62. In the second mesa portion 62, the carrier during the turn-off is extracted more easily as compared with the first mesa portion 60.

On the upper surface of the third mesa portion 64, a contact region 15 is provided at both end portions in the X-axis direction. On the upper surface of the third mesa portion 64, a base region 14 is provided in the region sandwiched between the contact regions 15 of both end portions. The base region 14 may be provided in the whole region sandwiched between the contact regions 15 in the X-axis direction. In the third mesa portion 64, the base region 14 is also provided below the contact hole 54. The contact region 15 may also be provided below the contact hole 54.

In the third mesa portion 64, the contact region 15 and the base region 14 are formed from one of the dummy trench portions 30, with the third mesa portion 64 sandwiched therebetween, to the other of the dummy trench portions 30. That is, on the upper surface of the semiconductor substrate, the width in the Y-axis direction of the third mesa portion 64 is equal to the width in the Y-axis direction of the contact region 15 or the base region 14 provided in the third mesa portion 64.

In the third mesa portion 64, the emitter region 12 may or may not be formed. In the present example, no emitter region 12 is formed in the third mesa portion 64.

In the semiconductor device 100 of the present example, the dummy trench portion 30 is provided in the diode portion 80. The dummy trench portion 30 includes an extending portion 29. Two adjacent extending portions 29 may be connected through the connecting portion 31. The third mesa portion 64 is a region sandwiched between each dummy trench portion 30 (the extending portion 29 in the present example).

The diode portion 80 includes a cathode region 82 of the first conductivity type on the lower surface side of the semiconductor substrate. The cathode region 82 of the present example is, for example, of the N+ type. FIG. 1 uses an alternate long and short dash line to show the region in which cathode region 82 is provided in the top view of the semiconductor substrate. The diode portion 80 may be a region through which the cathode region 82 passes when the cathode region 82 is projected to the upper surface of the semiconductor substrate. In addition, the diode portion 80 may include the whole third mesa portion 64 in which the cathode region 82 is partially provided, and the dummy trench portion 30 in contact with the third mesa portion 64. The region on the upper surface of the semiconductor substrate to which the cathode region 82 is projected may be separated from the contact region 15 in the X-axis direction. In the third mesa portion 64, the distance between the cathode region 82 and the well region 11 in the X-axis direction is larger than the distance between the contact region 15 and the well region 11 in the X-axis direction.

A collector region of the second conductivity type may be formed in the region on the lower surface of the semiconductor substrate where the cathode region 82 is not formed. The collector region of the present example is, for example, of the P+ type. A collector region may be formed in the position in the lower surface of the semiconductor substrate where the end in the X-axis direction of the contact hole 54 in the diode portion 80 is projected.

In the transistor portion 70 except the boundary portion 90, the contact hole 54 is formed above each region in the contact region 15 and the emitter region 12. In a part of or all of the first mesa portion 60, the contact hole 54 may or may not be provided such that it overlaps the gate trench portion 40 (the extending portion 39 in the present example) and the dummy trench portion 30 (the extending portion 29 in the present example) in the top view of the FIG. 1. The width in the Y-axis direction of the contact hole 54 may be smaller or larger than the width in the Y-axis direction of the emitter region 12 and the contact region 15.

In the transistor portion 70 except the boundary portion 90, the contact hole 54 may be continuously provided from above the contact region 15 provided on the most negative side in the X-axis direction of the first mesa portion 60 to above the contact region 15 provided on the most positive side in the X-axis direction in the top view of FIG. 1. In this specification, the relative positions in each axis direction may be referred to as the positive side or the negative side. In each figure, the direction of the arrow in each axis is referred to as positive, while the reverse direction is referred to as negative. The contact hole 54 may be provided such that it overlaps at least part of the contact region 15 provided at the most negative side in the X-axis direction of the first mesa portion 60 in the top view of the FIG. 1. The contact hole 54 may be provided such that it overlaps at least part of the contact region 15 provided at the most positive side in the X-axis direction of the first mesa portion 60 in the top view.

In the boundary portion 90, the contact hole 54 is formed above the contact region 15. In the second mesa portion 62, the contact hole 54 may or may not be provided such that it overlaps the dummy trench portion 30 (the extending portion 29 in the present example) in the top view. The width in the Y-axis direction of the contact hole 54 may be smaller or larger than the width in the Y-axis direction of the contact region 15.

On the boundary portion 90, the contact hole 54 may be provided above the contact region 15 provided in the second mesa portion 62. The contact hole 54 may be provided such that it overlaps at least part of the contact region 15 provided in the second mesa portion 62 in the top view of FIG. 1.

In the diode portion 80, the contact hole 54 is formed above the base region 14 and the contact region 15. In the third mesa portion 64, the contact hole 54 may or may not be provided such that it overlaps the dummy trench portion 30 (the extending portion 29 in the present example) in the top view of FIG. 1. The width in the Y-axis direction of the contact hole 54 may be smaller or larger than the width in the Y-axis direction of the base region 14 and the contact region 15.

In the diode portion 80, the contact hole 54 may be continuously provided from above the contact region 15 provided on the most negative side in the X-axis direction of the third mesa portion 64 to above the contact region 15 provided on the most positive side in the X-axis direction. The contact hole 54 may be provided such that it overlaps at least part of the contact region 15 provided on the negative side in the X-axis direction of the third mesa portion 64 in the top view of FIG. 1. The contact hole 54 may be provided such that it overlaps at least part of the contact region 15 provided on the positive side in the X-axis direction of the third mesa portion 64 in the top view of FIG. 1.

In the semiconductor device 100 of the present example, an accumulation region 16 of the first conductivity type is provided below the base region 14 inside the semiconductor substrate. The accumulation region 16 of the present example is of, for example, the N+ type. FIG. 1 uses a dashed line to show a range where the accumulation region 16 is formed. The end in the X-axis direction of the accumulation region 16 may be placed on the inner side in the X-axis direction relative to the end in the X-axis direction of the contact hole 54. Here, the inner side in the X-axis direction refers to the side in the X-axis direction closer to the center of each mesa portion.

Figure 2A:
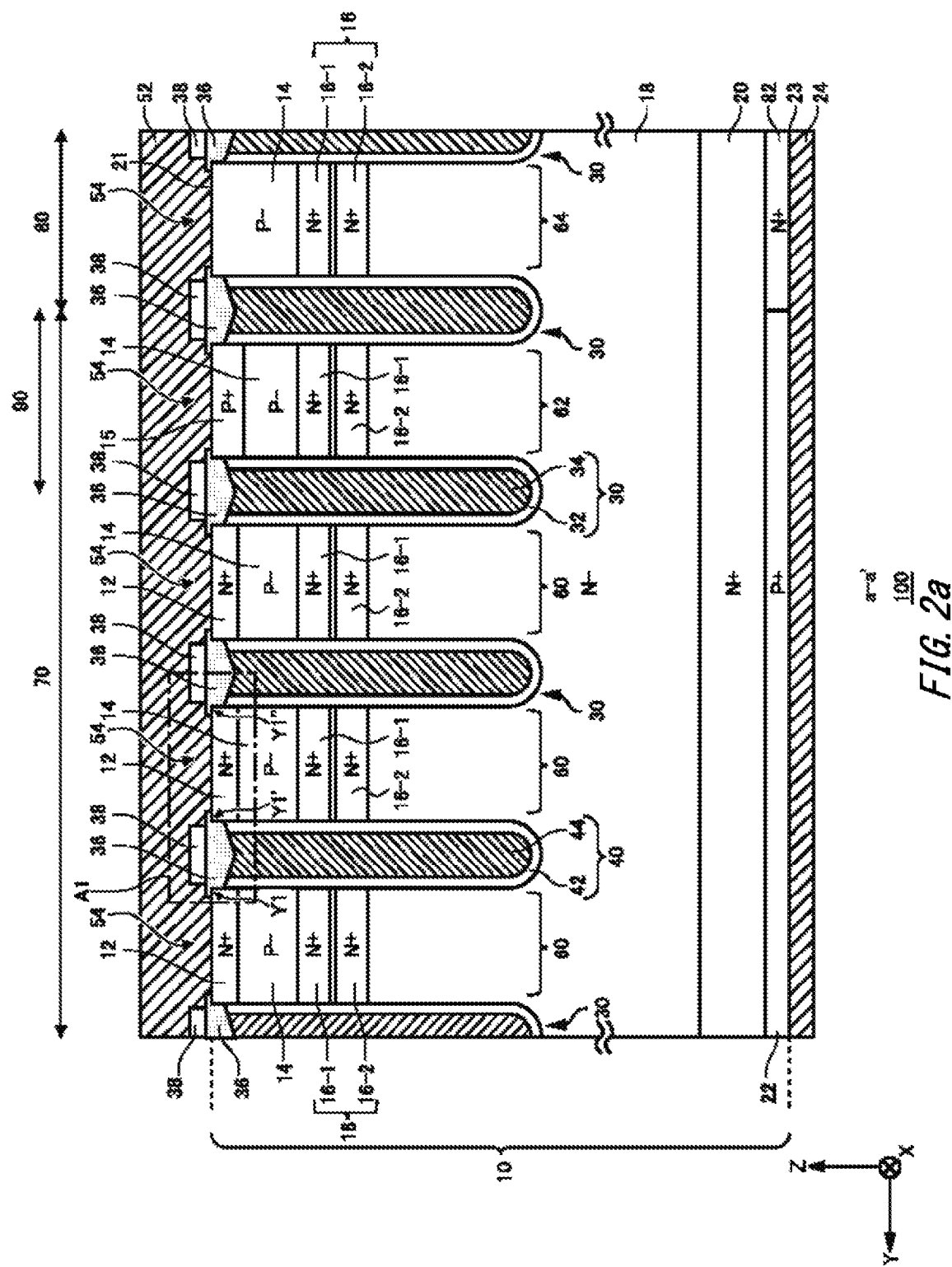
FIG. 2a shows one example of the cross section a-a' in FIG. 1.

FIG. 2a shows one example of the cross section a-a' in FIG. 1. The cross section a-a' is a Y-Z plane passing through the emitter region 12 of the transistor portion 70, the contact region 15 of the boundary portion 90, and the base region 14 of the diode portion 80. The semiconductor device 100 of the present example includes, in the cross section a-a', the semiconductor substrate 10, the interlayer dielectric film 38, the protective insulating film 36, the emitter electrode 52, and the collector electrode 24. The emitter electrode 52 is provided on the upper surface 21 of the semiconductor substrate 10, a part of the upper surface of the protective insulating film 36, and the upper surface of the interlayer dielectric film 38.

The collector electrode 24 is provided on a lower surface 23 of the semiconductor substrate 10. The emitter electrode 52 and the collector electrode 24 are formed of a conductive material such as a metal. In this specification, the direction connecting the emitter electrode 52 and the collector electrode 24 is referred to as the depth direction (Z-axis direction).

The semiconductor substrate 10 may be a silicon substrate, may be a silicon carbide substrate, may be a nitride semiconductor substrate such as gallium nitride, or the like. In the present example, the semiconductor substrate 10 is a silicon substrate.

The semiconductor substrate 10 includes a first conductivity type drift region 18. In the present example, the drift region 18 is of N− type. The drift region 18 may be the remaining region of the semiconductor substrate 10 in which the other doped regions are not provided.

One or more gate trench portions 40 and one or more dummy trench portions 30 are provided in the upper surface 21 of the semiconductor substrate 10. Each trench portion is provided from the upper surface 21 to pass through the base region 14 and reach the drift region 18.

The gate trench portion 40 includes the gate trench provided in the upper surface 21, and the gate insulating film 42 and the gate conductive portion 44 provided in the gate trench. The gate insulating film 42 is provided to cover the inner wall of the gate trench. The gate insulating film 42 may be formed by oxidizing or nitriding the semiconductor material of the inner wall of the gate trench. The gate conductive portion 44 is provided inside the gate trench and at an inner side relative to the gate insulating film 42. That is, the gate insulating film 42 insulates the gate conductive portion 44 and the semiconductor substrate 10 from each other. The gate conductive portion 44 is formed of a conductive material such as polysilicon.

The gate conductive portion 44 is provided inside the gate trench portion 40 such that it is surrounded by the gate insulating film 42. The gate conductive portion 44 includes a region facing the base region 14, with the gate insulating film 42 sandwiched therebetween in the depth direction. In this cross section, the gate trench portion 40 is covered by the interlayer dielectric film 38 on the upper surface 21. When a predetermined voltage is applied to the gate conductive portion 44, a channel as an inversion layer of electrons is formed in the interfacial surface layer of the base region 14 in contact with the gate trench.

In FIGS. 2a, Y1 and Y1' are the upper ends of the gate trench portion 40. The positions in the Z-axis direction of the upper end Y1 and the upper end Y1' are the same as the position in the Z-axis direction of the upper surface 21. The gate trench portion 40 may be a region below the positions in the Z-axis direction of the upper end Y1 and the upper end Y1'. That is, the gate trench portion 40 may be a region below the upper surface 21 in the Z-axis direction. It is noted that the positions of the upper ends of the gate trench portion 40 in the Y-Z plane other than the cross section a-a', such as the Y-Z plane passing through the contact region 15 in the first mesa portion 60, may also be the same as the positions of the upper end Y1 and the upper end Y1'.

The dummy trench portion 30 may have the same structure as the gate trench portion 40 in the cross section. The dummy trench portion 30 includes the dummy trench provided in the semiconductor substrate on the upper surface 21 side, and the dummy insulating film 32 and the dummy conductive portion 34 provided in the dummy trench. The position in the Z-axis direction of the upper end of the dummy trench may be the same as that of the upper surface 21. The dummy insulating film 32 is provided such that it covers the inner wall of the dummy trench. The dummy conductive portion 34 is provided inside the dummy trench portion 30 such that it is surrounded by the dummy insulating film 32. The dummy insulating film 32 insulates the dummy conductive portion 34 and the semiconductor substrate 10 from each other.

The dummy conductive portion 34 may be formed of the same material as that of the gate conductive portion 44. For example, the dummy conductive portion 34 is formed of a conductive material such as polysilicon. The dummy conductive portion 34 may have the same length in the depth direction as the gate conductive portion 44. Note that, the bottom portions of the dummy trench portions 30 and gate trench portions 40 may have a shape of a downwardly-convex curved surface (curved shape in the cross section).

The Y1" is the upper end of the dummy trench portion 30. The position in the Z-axis direction of the upper end Y1" is the same as the position in the Z-axis direction of the upper surface 21. The dummy trench portion 30 may be in the region below the position in the Z-axis direction of the upper end Y1". That is, the dummy trench portion 30 may be a region below the upper surface 21 in the Z-axis direction. It is noted that the position of the upper end of the dummy trench portion 30 in another Y-Z plane other than the a-a' cross section, such as the Y-Z plane passing through the contact region 15 in the first mesa portion 60, may be the same as the position of the upper end Y1".

In the first mesa portion 60, one or more accumulation regions 16 are provided, above the drift region 18, in contact with the gate trench portion 40. If a plurality of accumulation regions 16 are provided, the accumulation regions 16 are arranged in an array along the Z-axis direction. The accumulation region 16 is a region of the first conductivity type which has higher doping concentration than the drift region 18. The accumulation region 16 is, for example, of the N+ type. By providing the accumulation region 16, the carrier injection enhancement effect (IE effect) can be increased, and an on-voltage can be reduced.

In the first mesa portion 60, one or more accumulation regions 16 may be in contact with or may be separated apart from dummy trench portions 30. FIG. 2a shows one example in which the accumulation region 16 is provided in contact with the dummy trench portion 30. It is noted that the second mesa portion 62 and the third mesa portion 64 may or not may be provided with the accumulation region 16. FIG. 2a shows one example in which the second mesa portion 62 and the third mesa portion 64 are provided with the accumulation region 16.

In the first mesa portion 60, second mesa portion 62, and the third mesa portion 64, a plurality of accumulation regions 16 may be provided in the Z-axis direction. FIG. 2a shows one example in which two accumulation regions 16-1 and 16-2 are provided in the Z-axis direction. In the Z-axis direction, a drift region 18 may be provided between the accumulation region 16-1 and the accumulation region 16-2. By providing a plurality of the accumulation regions 16, electronic current can easily flow through around the center of the first mesa portion 60. Thus, the distribution of holes near the bottom of the first mesa portion 60 can be divided at around the center of the first mesa portion 60. This can inhibit the accumulation of the hole in the lower end of the gate trench portion 40. As a result, the displacement current of the transistor portion 70 can be reduced.

In the first mesa portion 60, the base region 14 is provided, above the accumulation region 16, in contact with the gate trench portion 40. The base region 14 is, for example, of the N− type. In the first mesa portion 60, the base region 14 may be provided in contact with the dummy trench portion 30.

In the second mesa portion 62 of the boundary portion 90, the base region 14 is provided, above the drift region 18, in contact with the dummy trench portion 30. In the third mesa portion 64 of the diode portion 80, the base region 14 is provided, above the drift region 18, in contact with the dummy trench portion 30. In the third mesa portion 64, the base region 14 is provided in contact with the upper surface 21.

In the first mesa portion 60, an emitter region 12 is provided, in the cross section a-a', in contact with the upper surface 21 and in contact with the gate trench portion 40. The doping concentration of the emitter region 12 is higher than the doping concentration of the drift region 18. As shown in FIG. 1, the first mesa portion 60 is provided with the emitter region 12 and the contact region 15 along the X-axis direction. In the YZ cross section passing through the contact region 15 of the first mesa portion 60, the contact region 15 is provided, instead of the emitter region 12 in FIG. 2a. The contact region 15 is provided in contact with the upper surface 21 and in contact with the gate trench portion 40.

The second mesa portion 62 is provided with the contact region 15. The contact region 15 may be in contact with, or may be separated from, the dummy trench portion 30 in the top view. FIG. 2a shows one example in which the contact region 15 is provided in contact with the dummy trench portion 30.

A first conductivity type buffer region 20 may be provided below the drift region 18. The buffer region 20 is of, for example, the N+ type. The doping concentration of the buffer region 20 is higher than the doping concentration of the drift region 18. The buffer region 20 may act as a field stop layer to prevent the depletion layer extending from the upper end side of the drift region 18 from reaching the collector region 22 of the P+ type and the cathode region 82 of the N+ type.

In the transistor portion 70, a collector region 22 of P+ type is provided below the buffer region 20 and exposed on the lower surface 23. In the diode portion 80, a cathode region 82 of N+ type is provided below the buffer region 20 and exposed on the lower surface 23. In the boundary portion 90, either the collector region 22 or the cathode region 82 is provided below the buffer region 20. In the present example, in the boundary portion 90, the collector region 22 is provided below the buffer region 20.

Note that the diode portion 80 is the region overlapping with the cathode region 82 in the direction perpendicular to the lower surface 23. The transistor portion 70 other than the boundary portion 90 is a region in which predetermined unit structures including the emitter region 12 and the contact region 15 are regularly arranged, among the regions overlapping the collector region 22 in the direction perpendicular to the lower surface 23.

The interlayer dielectric film 38 is provided above the gate trench portion 40 and the dummy trench portion 30. The interlayer dielectric film 38 may be a silicate glass such as PSG and BPSG. The interlayer dielectric film 38 may also be an oxide film, a nitride film, or the like.

The semiconductor device 100 of the present example includes the protective insulating film 36 between the interlayer dielectric film 38 and the gate trench portion 40 in the depth direction (the Z-axis direction) of the semiconductor substrate 10. The protective insulating film 36 is made of different material from the interlayer dielectric film 38 and the gate insulating film 42. In the present example, the protective insulating film 36 is provided inside the gate trench portion 40 and inside the dummy trench portion 30, i.e., below the upper surface 21. The protective insulating film 36 is provided in contact with the gate insulating film 42. The oxygen content ratio of the protective insulating film 36 may be smaller than the oxygen content ratio of the gate insulating film 42. The the oxygen content ratio of the protective insulating film 36 may be less than or equal to one tenth of the oxygen content ratio of the gate insulating film 42. The oxygen content ratio may be the number of oxygen atom included in the unit volume.

The protective insulating film 36 is, for example, SiN (silicon nitride). In addition, the protective insulating film 36 may be a high dielectric constant (high-k) insulating film such as $HfO_2$ (hafnium oxide), $TiO_2$ (titanium oxide), $Ta_2O_5$ (tantalum pentoxide), TiN (titanium nitride), and HfSiO (hafnium silicate).

Figure 2B:
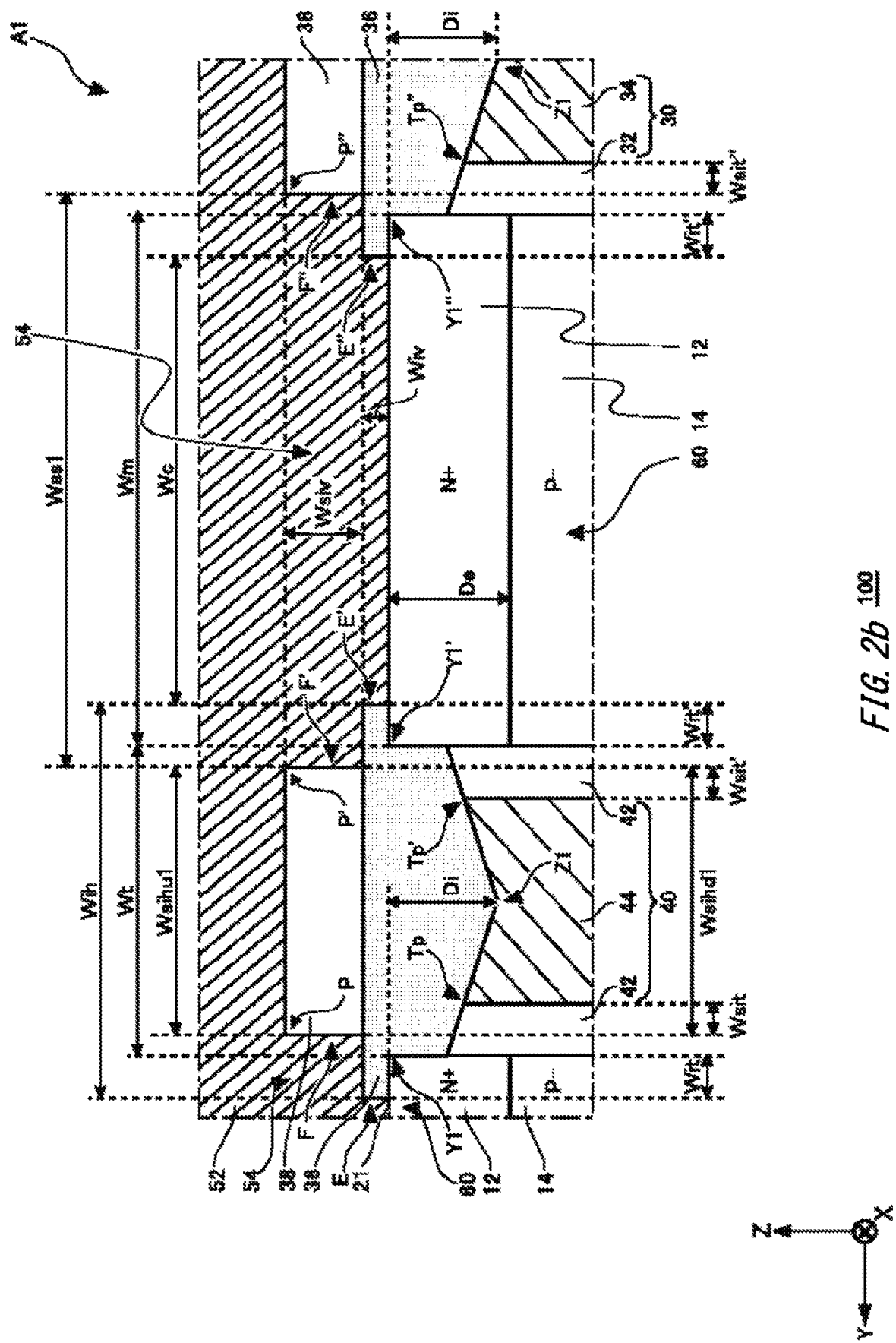

FIG. 2b is an enlarged view of the region A1 in FIG. 2a. FIG. 2b shows an enlarged view near the upper surface 21 of the first mesa portion 60.

In the present example, Tp and Tp' are the upper ends of the gate conductive portion 44. In the present example, the upper end Tp and the upper end Tp' of the gate conductive portion 44 are placed below the upper surface 21. The upper end Tp may have the same position in the Z-axis direction as the upper end Tp'. In the gate conductive portion 44 of the present example, the center portion of the upper ends Tp and Tp' furthest from the gate insulating film 42 in the Y-axis direction is the lowest. In the gate conductive portion 44 of the present example, portions of the upper ends Tp and Tp' in contact with the gate insulating film 42 are placed in the highest side.

In the semiconductor device 100 of the present example, the protective insulating film 36 is provided, inside the gate trench portion 40, above at least part of the gate conductive portion 44. The present example is one example in which the protective insulating film 36 is provided, inside the gate trench portion 40, above the entire upper surface of the gate conductive portion 44. The protective insulating film 36 may also be in contact with the gate conductive portion 44.

In the present example, Tp" is the upper end of the dummy conductive portion 34. In the present example, the upper end Tp" of the dummy conductive portion 34 is placed below the upper surface 21. The position in the Z-axis direction of the upper end Tp" may be the same as the position in the Z-axis direction of the upper end Tp and the upper end Tp'.

In the present example, the protective insulating film 36 is provided above at least part of the dummy conductive portion 34 in the direction parallel to the upper surface 21. The present example is one example in which the protective insulating film 36 is provided above the entire upper surface of the dummy conductive portion 34 in the direction parallel to the upper surface 21. The protective insulating film 36 may also be in contact with the dummy conductive portion 34. The shape of the dummy conductive portion 34 may be the same as the shape of the gate conductive portion 44.

The depth Di is the depth in the Z-axis direction from the position in the Z-axis direction of the upper surface 21 to the lower end Z1 of the protective insulating film 36. The depth De is the depth in the Z-axis direction from the position in the Z-axis direction of the upper surface 21 to the lower surface of the emitter region 12. As the depth Di increases, the position of the upper surface of the gate conductive portion 44 is lowered. In this case, the dopant is implanted to a deeper position from the upper surface 21 to form the emitter region 12. When the dopant is implanted to a deeper position from the upper surface 21, thermal history increases in the step of heat process forming the emitter region 12. Therefore, the depth Di is preferably 0.7 times to 0.9 times as large as the depth De.

The depth Di may be 0.2 µm to 0.4 µm. The depth Di is, for example, 0.3 µm. The depth De may be 0.35 µm to 0.45 µm. The depth De is, for example, 0.4 µm.

In the present example, the width Wiv is the thickness of the protective insulating film 36 above the upper surface 21. That is, the width Wiv is the width in the Z-axis direction from the upper surface 21 to the upper surface of the protective insulating film 36. The width Wsiv is the thickness of the interlayer dielectric film 38 provided on the upper surface of the protective insulating film 36. That is, the width Wsiv is the width in the Z-axis direction from the upper surface of the protective insulating film 36 to the upper surface of the interlayer dielectric film 38.

The width Wiv may be smaller than the width Wsiv. The width Wiv may be one-twentieth to one-fifth of the width Wsiv. With the width Wiv smaller than the width Wsiv, the positioning precision of the protective insulating film 36 in the direction parallel to the upper surface 21 can be higher than the positioning precision of the interlayer dielectric film 38.

The width Wiv may be 0.05 µm to 0.20 µm. The width Wiv is, for example, 0.1 µm. The width Wsiv may be 0.6 µm to 1.0 µm. The width Wsiv may be, for example, 0.8 µm.

In the semiconductor device 100 of the present example, because the width Wiv is smaller than the width Wsiv, the protective insulating film 36 can be positioned in the direction parallel to the upper surface 21 with higher precision than the interlayer dielectric film 38. Thus, the short circuit between G and E can be prevented even if the first mesa portion 60 is narrowed. Thus, the property of the semiconductor device 100 can be improved while the semiconductor device 100 is further miniaturized.

In the present example, the width Wt is the width 40 in the Y-axis direction of the gate trench portion. The end portion E is the end on the positive side in the Y-axis direction of the protective insulating film 36 provided above the gate trench portion 40. The end portion E' is the end on the negative side in the Y-axis direction of the protective insulating film 36. The end portion E" is the end on the positive side in the Y-axis direction of the protective insulating film 36 provided above the dummy trench portion 30.

In the present example, the end portion E is placed such that it is separated by the width Wit in the Y-axis direction from the side wall on the positive side in the Y-axis direction of the gate trench portion 40. The end portion E' is placed such that it is separated by the width Wit' in the Y-axis direction from the side wall on the negative side in the Y-axis direction of the gate trench portion 40. The end portion E and E' are placed at both ends in the Y-axis direction of the gate trench portion 40. That is, the width Wih is larger than the width Wt. The end portion E" is placed such that it is separated by the width Wit" in the Y-axis direction from the side wall on the positive side in the Y-axis direction of the dummy trench portion 30. The shape of the protective insulating film 36 provided on the dummy trench portion 30 and the dummy trench portion 30 is similar to the shape of the gate trench portion 40 and the protective insulating film 36 provided on the gate trench portion 40.

In the present example, the end portion F is the end on the positive side in the Y-axis direction of the interlayer dielectric film 38 provided above the gate trench portion 40. The end portion F' is the end on the negative side in the Y-axis direction of the interlayer dielectric film 38. The end portion F" is the end on the positive side in the Y-axis direction of the interlayer dielectric film 38 provided above the dummy trench portion 30.

In the present example, the end portion F is placed such that it is separated by the width Wsit in the Y-axis direction from the side surface on the positive side in the Y-axis direction of the gate conductive portion 44. The end portion F' is placed such that it is separated by the width Wsit' in the Y-axis direction from the side surface of the negative side in the Y-axis direction of the gate trench portion 40. The end portion F" is placed such that it is separated by the width Wsit" in the Y-axis direction from the side surface on the positive side in the Y-axis direction of the dummy conductive portion 34.

In the present example, the protective insulating film 36 is provided in contact with the first mesa portion 60. That is, the protective insulating film 36 is provided in contact with a part of the upper surface 21 in the first mesa portion 60. On the upper surface 21, the first mesa portion 60 is, over the width Wit, in contact with a portion of the protective insulating film 36 provided on the gate trench portion 40, the portion being placed on the positive side in the Y-axis direction relative to the gate trench portion 40. The first mesa portion is, over the width Wit', in contact with a portion of the protective insulating film 36 provided on the gate trench portion 40, the portion being placed on the negative side in the Y-axis direction relative to the gate trench portion 40. The width Wit may be equal to or may be different from the width Wit'. On the positive side in the Y-axis direction of the protective insulating film 36 provided above the dummy trench portion 30, the width of the first mesa portion 60 in contact with a protective insulating film 36 is the width Wit".

In the semiconductor device 100 of the present example, the protective insulating film 36 is in contact with the first mesa portion 60, and the width Wih is larger than the width Wt. The protective insulating film 36 can be positioned with precision higher than the interlayer dielectric film 38. Thus, the width Wit and the width Wit' can be reliably provided while the width Wih is increased above the width Wt. That is, the protective insulating film 36 enables the gate conductive portion 44 to be reliably covered. In this way, the short circuit between the gate conductive portion 44 and the contact provided on the contact hole 54 can be inhibited even if the interlayer dielectric film 38 deviates to the positive side in the Y-axis direction by more than width Wsit', or to the negative side in the Y-axis direction by more than the width Wsit due to the variation in the process. That is, the semiconductor device 100 of the present example can prevent the short circuit between G and E, i.e., the short circuit between the gate metal layer 50 and the emitter electrode 52, because the protective insulating film 36 protects the gate insulating film 42 and the gate conductive portion 44. Thus, the mesa width is narrowed while the short circuit between G and E is prevented, and the on-voltage of the transistor portion 70 can be reduced by increasing the IE effect.

In the present example, the vertex P is the vertex on the positive side in the Y-axis direction of the interlayer dielectric film 38 provided above the gate trench portion 40. The vertex P' is the vertex on the negative side in the Y-axis direction of the interlayer dielectric film 38. The vertex P''' is the vertex on the positive side in the Y-axis direction of the interlayer dielectric film 38 provided above the dummy trench portion 30. The positions in the Z-axis direction of the vertex P, the vertex P', and the vertex P''' are equal to the position of the upper surface of the interlayer dielectric film 38.

In the present example, the width Wih is the width in the Y-axis direction of the protective insulating film 36. The width Wsihu1 is the width in the Y-axis direction from the vertex P to the vertex P' of the interlayer dielectric film 38. The width Wsihd1 is the width in the Y-axis direction of the interlayer dielectric film 38 in the position where the interlayer dielectric film 38 is in contact with the protective insulating film 36 in the Z-axis direction. In the present example, the width Wsihu1 is equal to the width Wsihd1, because the side surface of the interlayer dielectric film 38 is equal to the X-Z plane. The width Wsihu1 and the width Wsihd1 are equal to the width of the interlayer dielectric film. The width Wih may be larger than the width Wsihu1 and the width Wsihd1.

In the present example, the width Wc is the width in the Y-axis direction from the end portion E' to the end portion E''. That is, the width Wc is the width in the Y-axis direction of the upper surface 21 of the contact hole 54. The width Wm is the mesa width of the first mesa portion 60. The width Wss1 is the width in the Y-axis direction from the vertex P' to the the vertex P'''. That is, in the present example, the width Wss1 is the width in the Y-axis direction between the side surface on the negative side in the Y-axis direction of the interlayer dielectric film 38 provided above the gate trench portion 40, and the side surface on the positive side in the Y-axis direction of the interlayer dielectric film 38 provided above the dummy trench portion 30.

The width Wss1 can be larger than the width Wc, because, in the semiconductor device 100 of the present example, the width Wsihu1 and the width Wsihd1 are smaller than the width Wih. Thus, the contact to be filled in the contact hole 54 is easily filled to the lower end of the contact hole 54 as compared with the case in which the width Wss1 is equal to the width Wc. That is, the contact can more easily contact to the upper surface 21 over the width Wc. Thus, the contact resistance between the the contact and the emitter region 12 can be reduced in the first mesa portion 60. In the first mesa portion 60, the contact resistance between the contact and the contact regions 15 provided on the positive side and the negative side in the X-axis direction of the emitter region 12 can be reduced.

Figure 2C:
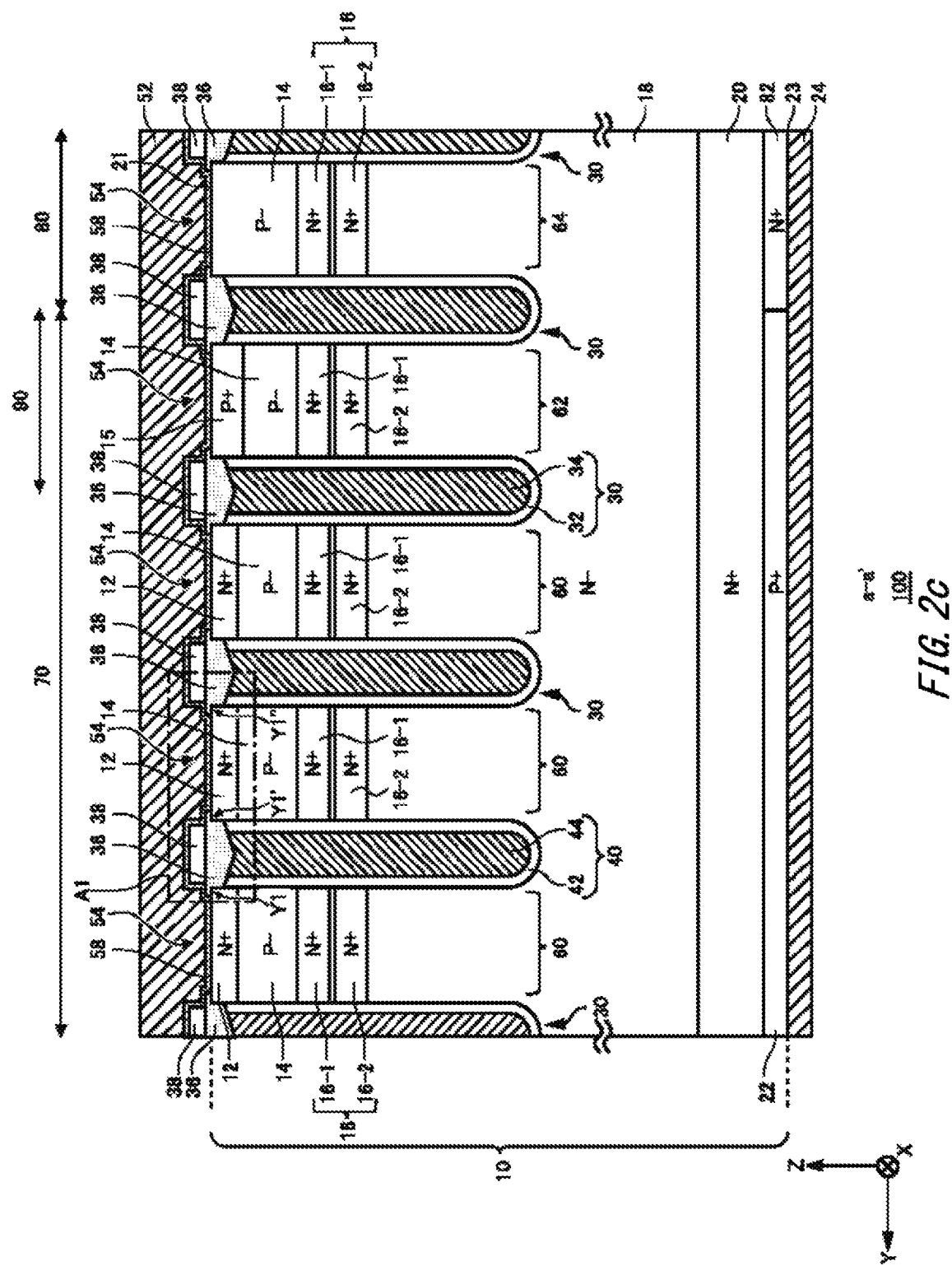
FIG. 2c shows another example of the cross section a-a' in FIG. 1.

FIG. 2c shows another example of the cross section a-a' in FIG. 1. The example shown in FIG. 2c is one example in which the barrier metal 58 is provided on the first mesa portion 60, each upper surface of the second mesa portion 62 and the third mesa portion, the upper surface and the side surface of the protective insulating film 36, and the upper surface and the side surface of the interlayer dielectric film 38 in the example of FIG. 2a. As shown in FIG. 2c, the barrier metal 58 may be continuously provided on the first mesa portion 60, each upper surface of the second mesa portion 62 and the third mesa portion, the upper surface and the side surface of the protective insulating film 36, and the upper surface and the side surface of the interlayer dielectric film 38.

The contact provided in the contact hole 54 can be, for example, made of aluminum (Al). The barrier metal 58 inhibits the diffusion of the aluminum into the semiconductor substrate 10. The barrier metal 58 can be, for example, made of titanium nitride (TiN).

Figure 3A:
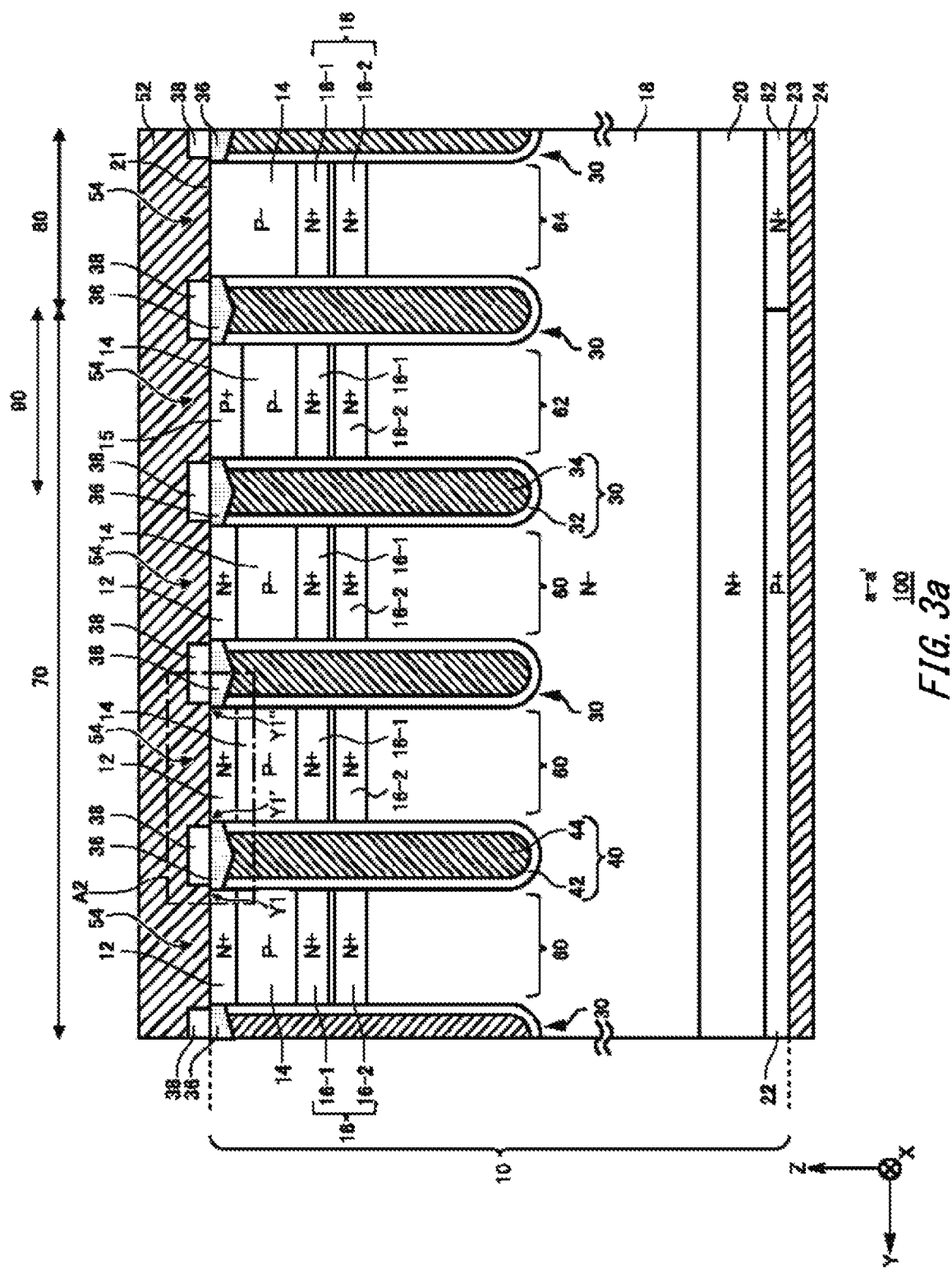
FIG. 3a shows another example of the cross section a-a' in FIG. 1.

FIG. 3a shows another example of the cross section a-a' in FIG. 1. The semiconductor device 100 in the present example is different from the semiconductor device 100 shown in FIG. 2a in that the protective insulating film 36 is not provided above the upper surface 21 in the semiconductor device 100 shown in FIG. 2a. In the present example, the position in the Z-axis direction of the upper surface of the first mesa portion 60, the second mesa portion 62, and the third mesa portion 64 are equal to the position of the upper surface of the protective insulating film 36.

Figure 3B:
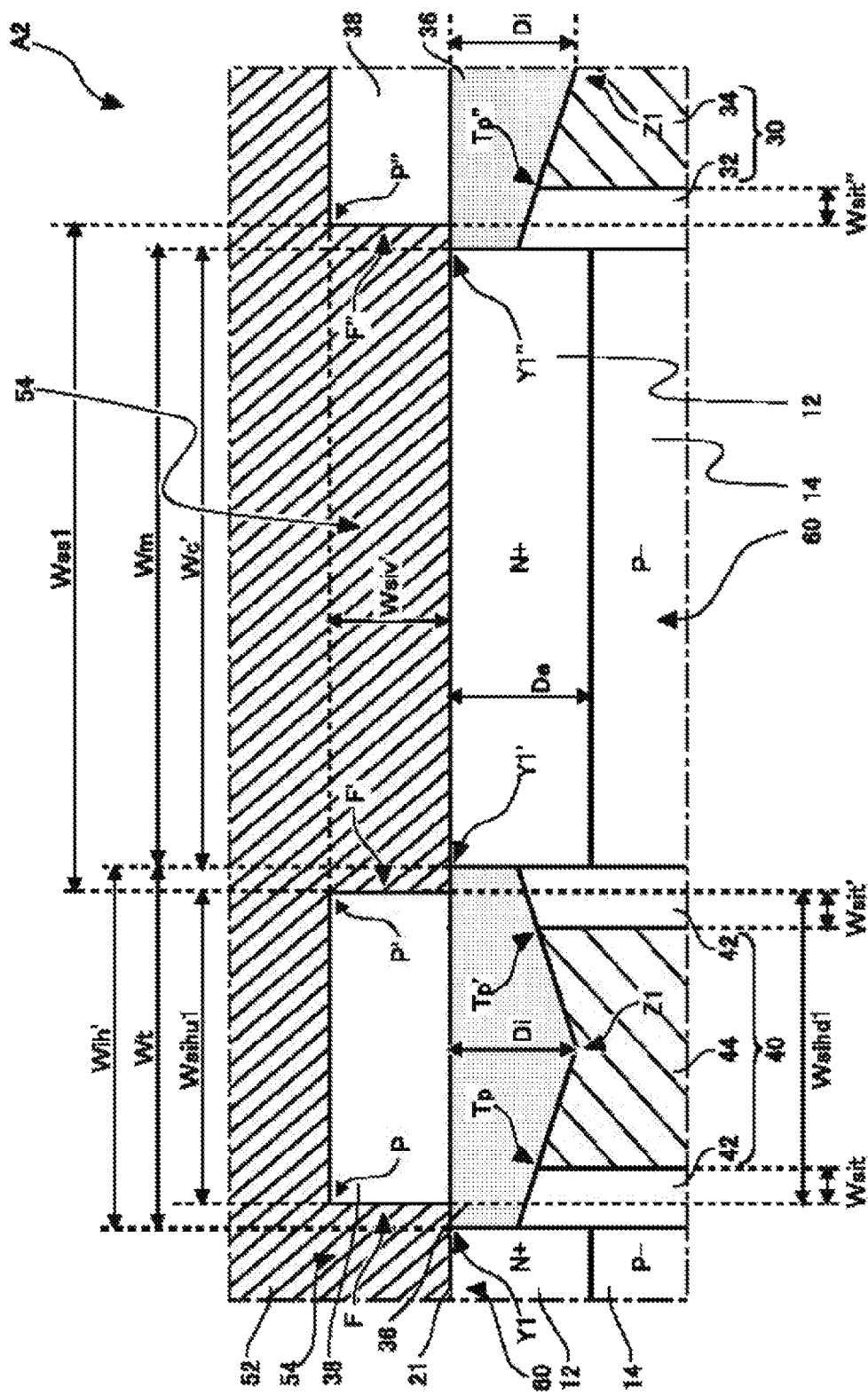

FIG. 3b is an enlarged view of the region A2 in FIG. 3a. As shown in FIG. 3b, in the semiconductor device 100 of the present example, the position in the Z-axis direction of the upper surface of the first mesa portion 60 is equal to the position of the upper surface of the protective insulating film 36.

The width Wih' in the Y-axis direction of the protective insulating film 36 of the present example is smaller than the width Wih in the semiconductor device 100 shown in FIG. 2b. In the present example, the width Wih' is equal to the width Wt.

The thickness of the interlayer dielectric film 38 in the present example, i.e., the width Wsiv', is larger than the width Wsiv in the semiconductor device 100 shown in FIG.

2b. The width Wc' in the Y-axis direction of the upper surface 21 of the contact hole 54 in the present example is larger than the width Wc in the semiconductor device 100 shown in FIG. 2b.

The width Wss1 can be larger than the width Wc', because, in the semiconductor device 100 of the present example, the width Wsihu1 and the width Wsihd1 are smaller than the width Wih'. In the present example, the width Wc' is equal to the width Wm. The width Wc' is larger than the width Wc in the semiconductor device 100 shown in FIG. 2b. Therefore, the contact filled in the contact hole 54 is in contact with the upper surface 21 over the width Wc' larger than the width Wc in the example shown in FIG. 2b. Therefore, in the first mesa portion 60, the contact resistance between the the contact, and the emitter region 12 and the contact region 15 can be further reduced, as compared with the semiconductor device 100 shown in FIG. 2b.

Figure 4A:
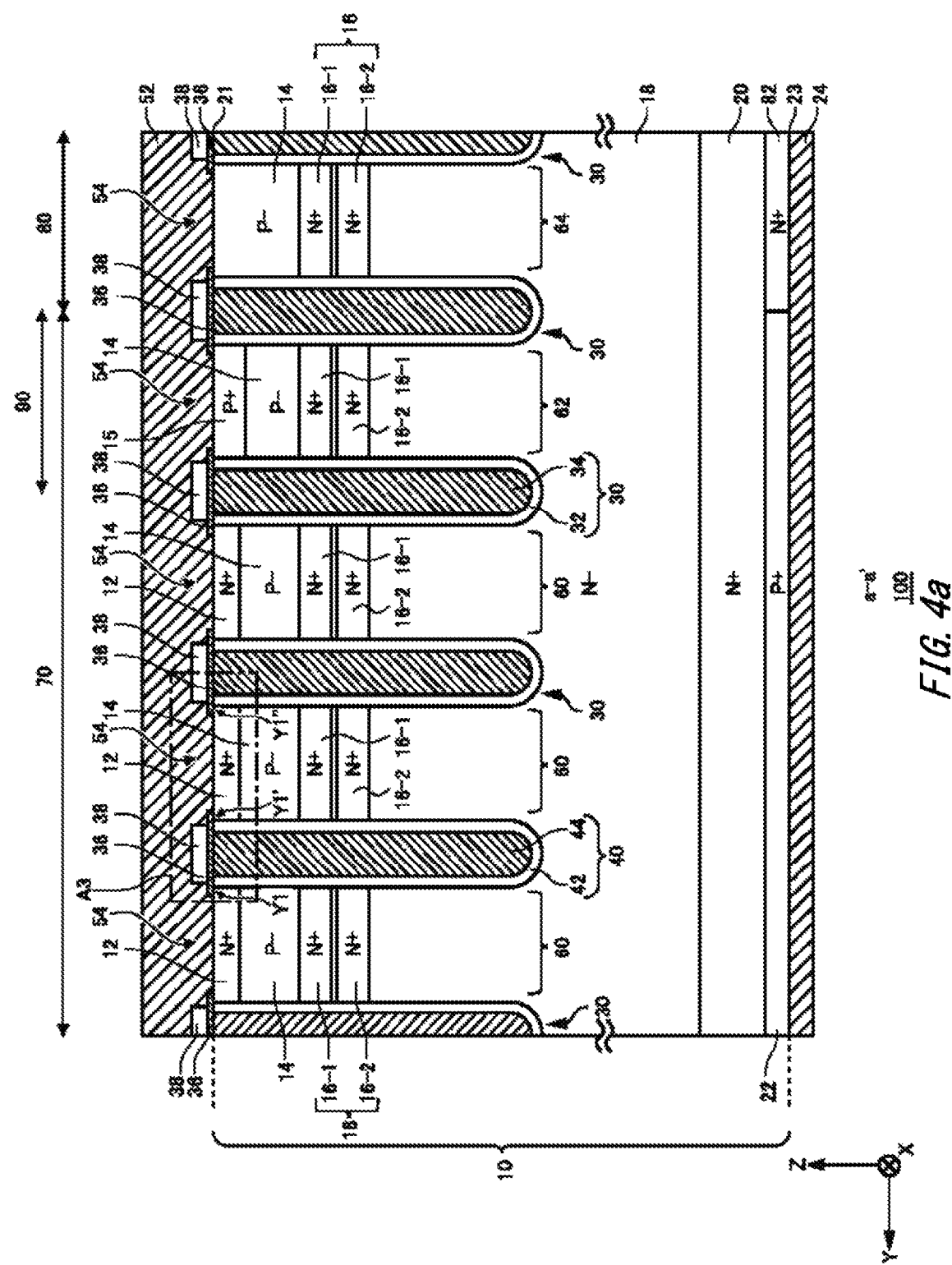
FIG. 4a shows another example of the cross section a-a' in FIG. 1.

FIG. 4a shows another example of the cross section a-a' in FIG. 1. The semiconductor device 100 in the present example is different from the semiconductor device 100 shown in FIG. 2a in that the protective insulating film 36 is not provided below the upper surface 21 in the semiconductor device 100 shown in FIG. 2a. In the present example, the position in the Z-axis direction of the upper surface of the first mesa portion 60, the second mesa portion 62, and the third mesa portion 64 are equal to the position of the lower surface of the protective insulating film 36.

Figure 4B:
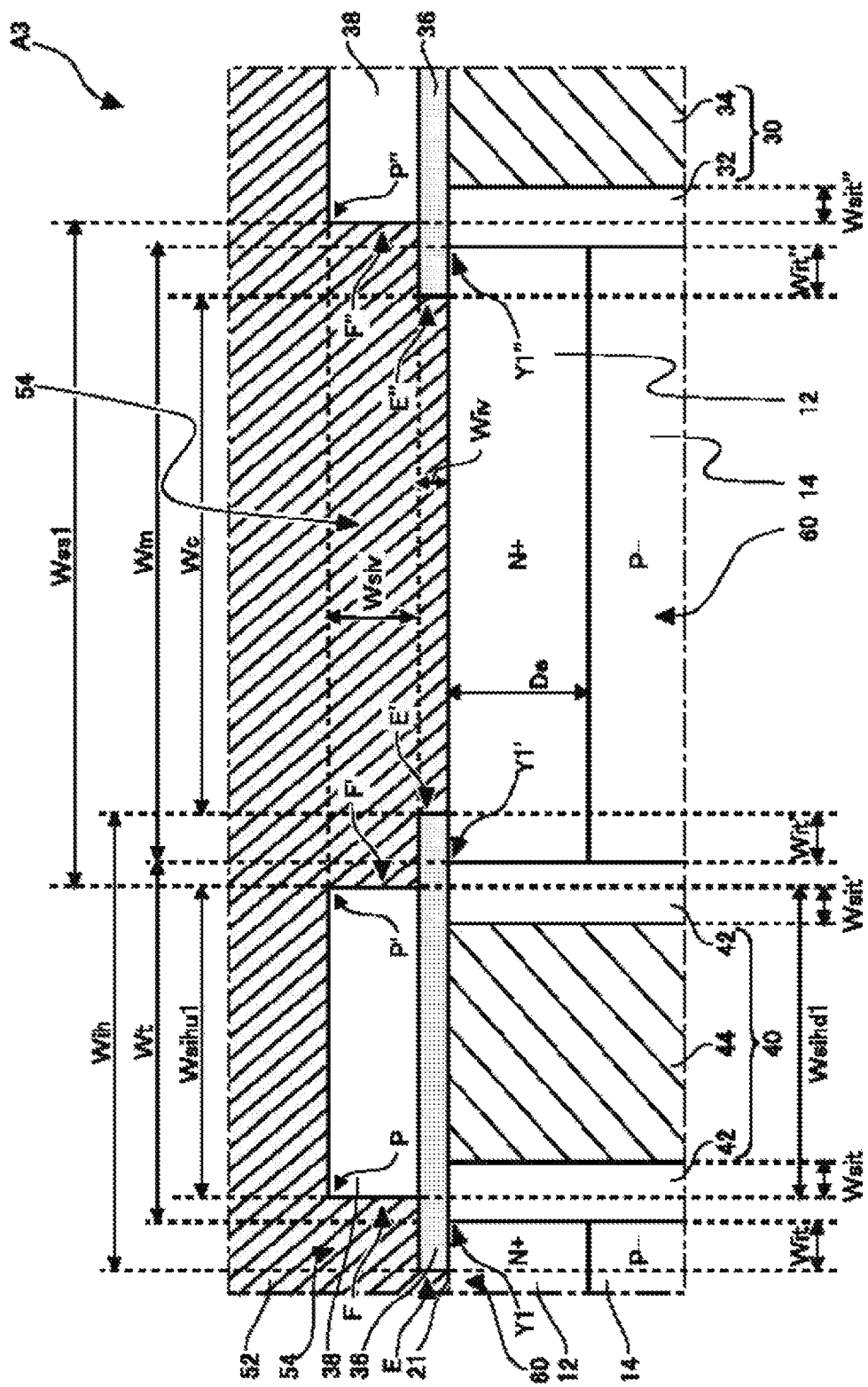

FIG. 4b is an enlarged view of the region A3 in FIG. 4a. As shown in FIG. 4b, in the semiconductor device 100 of the present example, the position in the Z-axis direction of the upper surface of the gate conductive portion 44 and the position in the Z-axis direction of the upper surface of the gate insulating film 42 are equal to the position in the Z-axis direction of the upper surface 21. The protective insulating film 36 is in contact with the gate conductive portion 44 and the gate insulating film 42 at the position in the Z-axis direction of the upper surface 21.

In the semiconductor device 100 of the present example, the protective insulating film 36 can be positioned in the direction parallel to the upper surface 21 with precision higher than the interlayer dielectric film 38, because the width Wiv is smaller than the width Wsiv. Thus, the short circuit between G and E can be prevented even if the first mesa portion 60 is further narrowed. Thus, the mesa width is narrowed while the short circuit between G and E is prevented, and the on-voltage of the transistor portion 70 can be reduced by increasing the IE effect.

In the semiconductor device 100 of the present example, the protective insulating film 36 is in contact with the first mesa portion 60, and the width Wih is larger than the width Wt. The protective insulating film 36 can be positioned with precision higher than the interlayer dielectric film 38. Thus, the width Wit and the width Wit' can be reliably provided while the width Wih is increased above the width Wt. In this way, the short circuit between the gate conductive portion 44 and the contact provided on the contact hole 54 can be inhibited even if the interlayer dielectric film 38 deviates to the positive side in the Y-axis direction by more than width Wsit', or to the negative side in the Y-axis direction by more than the width Wsit due to the variation in the process. That is, the semiconductor device 100 of the present example can prevent the short circuit between G and E, i.e., the short circuit between the gate metal layer 50 and the emitter electrode 52, because the protective insulating film 36 protects the gate insulating film 42 and the gate conductive portion 44. Thus, the mesa width is narrowed while the short circuit between G and E is prevented, and the on-voltage of the transistor portion 70 can be reduced by increasing the IE effect.

The width Wss1 can be larger than the width Wc, because, in the semiconductor device 100 of the present example, the width Wsihu1 and the width Wsihd1 are smaller than the width Wih. Thus, the contact to be filled in the contact hole 54 is easily filled to the lower end of the contact hole 54 as compared with the case in which the width Wss1 is equal to the width Wc. That is, the contact can more easily contact to the upper surface 21 over the width Wc. Thus, the contact resistance between the contact and the emitter region 12 can be reduced in the first mesa portion 60. In the first mesa portion 60, the contact resistance between the contact and the contact regions 15 provided on the positive side and the negative side in the X-axis direction of the emitter region 12 can be reduced.

Figure 5A:
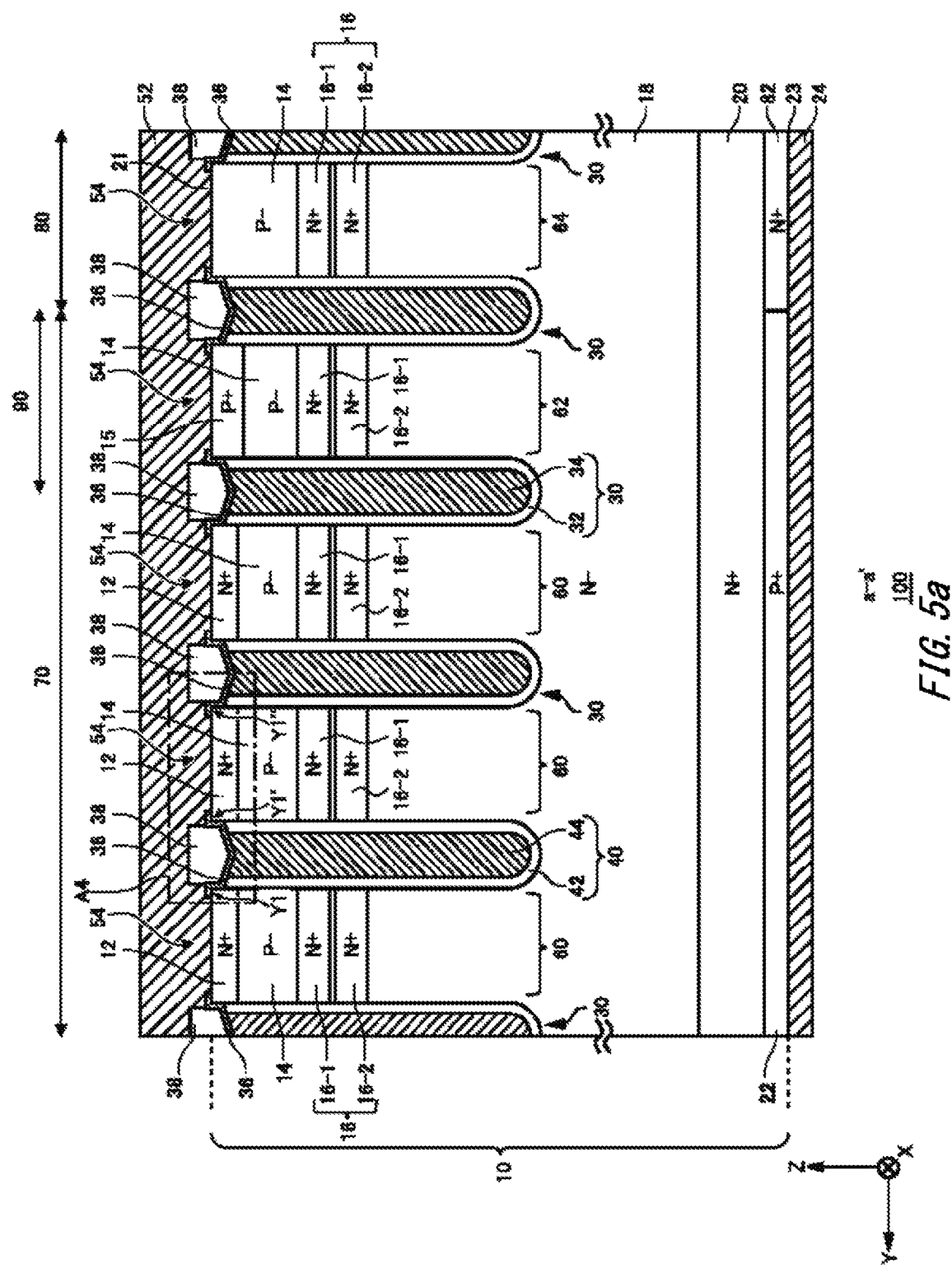
FIG. 5a shows another example of the cross section a-a' in FIG. 1.

FIG. 5a shows another example of the cross section a-a' in FIG. 1. The semiconductor device 100 in the present example is different from the semiconductor device 100 shown in FIG. 2a in that the protective insulating film 36 covers the inner wall of the gate trench portion 40, the upper surface of the gate insulating film 42, the upper surface of the gate conductive portion 44, the inner wall of the dummy trench portion 30, the upper surface of the dummy insulating film 32, and the upper surface of the dummy conductive portion 34, and the interlayer dielectric film 38 is also provided below the upper surface 21, in the semiconductor device 100 shown in FIG. 2a. In the present example, the interlayer dielectric film 38 is also provided inside the gate trench portion 40 and the dummy trench portion 30.

Figure 5B:
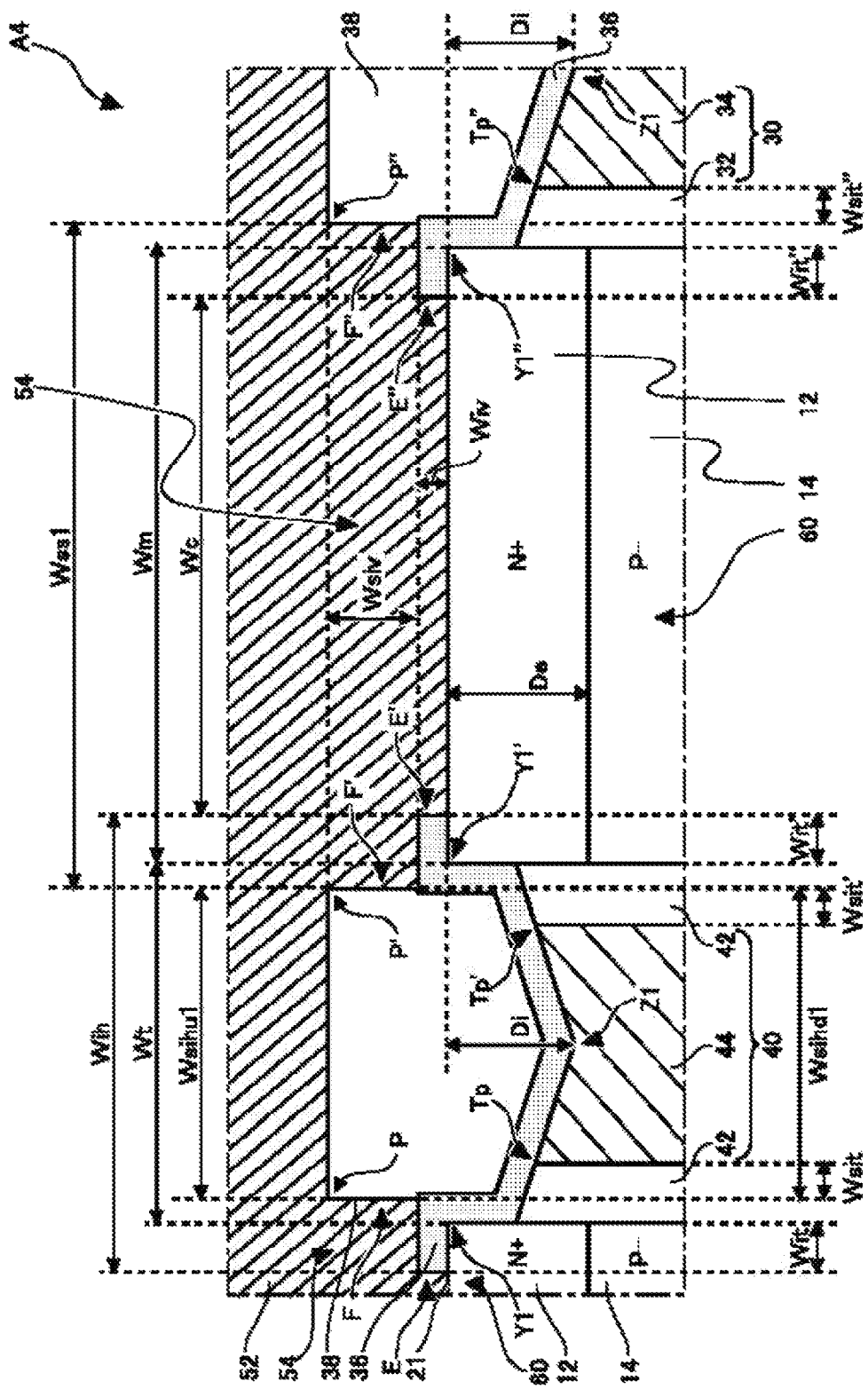

FIG. 5b shows an enlarged view of the region A4 in FIG. 5a. As shown in FIG. 5b, the semiconductor device 100 in the present example is provided with the protective insulating film 36 covering the inner wall of the gate trench portion 40, the upper surface of the gate insulating film 42, the upper surface of the gate conductive portion 44, the inner wall of the dummy trench portion 30, the upper surface of the dummy insulating film 32, and the upper surface of the dummy conductive portion 34. The interlayer dielectric film 38 is provided from above the upper surface 21 into the gate trench portion 40 and the dummy trench portion 30.

In the semiconductor device 100 of the present example, the protective insulating film 36 can be positioned in the direction parallel to the upper surface 21 with precision higher than the interlayer dielectric film 38, because the width Wiv is smaller than the width Wsiv. Thus, the short circuit between G and E can be prevented even if the first mesa portion 60 is further narrowed. Thus, the mesa width is narrowed while the short circuit between G and E is prevented, and the on-voltage of the transistor portion 70 can be reduced by increasing the IE effect.

In the semiconductor device 100 of the present example, the protective insulating film 36 is in contact with the first mesa portion 60, and the width Wih is larger than the width Wt. The protective insulating film 36 can be positioned with precision higher than the interlayer dielectric film 38. Thus, the width Wit and the width Wit' can be reliably provided while the width Wih is increased above the width Wt. In this way, the short circuit between the gate conductive portion 44 and the contact provided on the contact hole 54 can be inhibited even if the interlayer dielectric film 38 deviates to the positive side in the Y-axis direction by more than width Wsit', or to the negative side in the Y-axis direction by more than the width Wsit due to the variation in the process. That is, the semiconductor device 100 of the present example can prevent the short circuit between G and E, i.e., the short circuit between the gate metal layer 50 and the emitter electrode 52, because the protective insulating film 36 protects the gate insulating film 42 and the gate conductive portion 44. Thus, the mesa width is narrowed while the short circuit between G and E is prevented, and the on-voltage of the transistor portion 70 can be reduced by increasing the IE effect.

The width Wss1 can be larger than the width Wc, because, in the semiconductor device 100 of the present example, the width Wsihu1 and the width Wsihd1 are smaller than the width Wih. Thus, the contact to be filled in the contact hole 54 is easily filled to the lower end of the contact hole 54 as compared with the case in which the width Wss1 is equal to the width Wc. That is, the contact can more easily contact to the upper surface 21 over the width Wc. Thus, the contact resistance between the the contact and the emitter region 12 can be reduced in the first mesa portion 60. In the first mesa portion 60, the contact resistance between the contact and the contact regions 15 provided on the positive side and the negative side in the X-axis direction of the emitter region 12 can be reduced.

Figure 6:
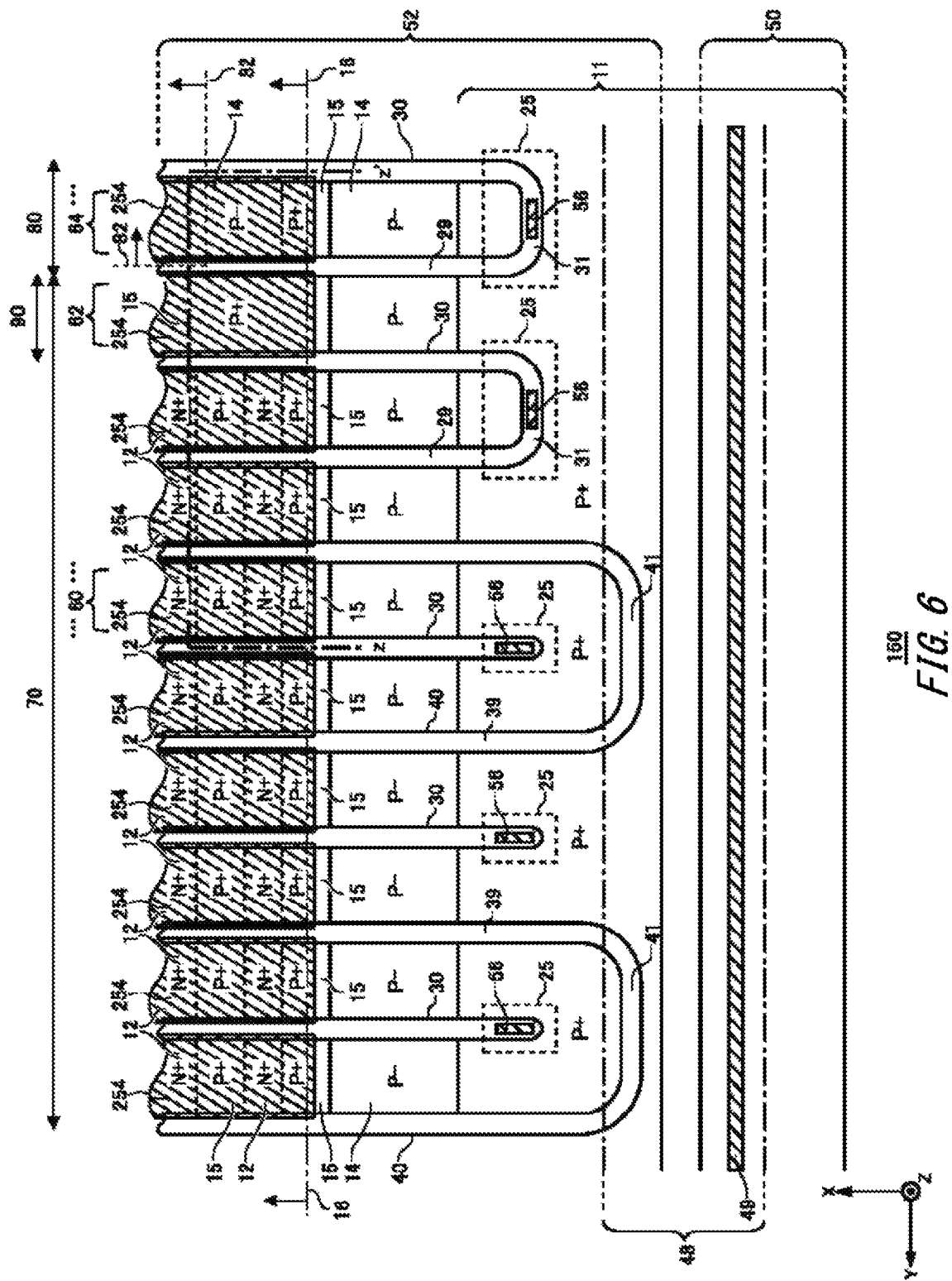
FIG. 6 shows a part of an upper surface of the semiconductor device 150 in a comparative example.

FIG. 6 shows a part of the upper surface of the semiconductor device 150 in the comparative example. The semiconductor device 150 in the comparative example is different from the semiconductor device 100 shown in FIG. 1 in that the contact hole 254 is provided above the first mesa portion 60, the second mesa portion 62, and the third mesa portion 64 in the semiconductor device 100 shown in FIG. 1.

Figure 7A:
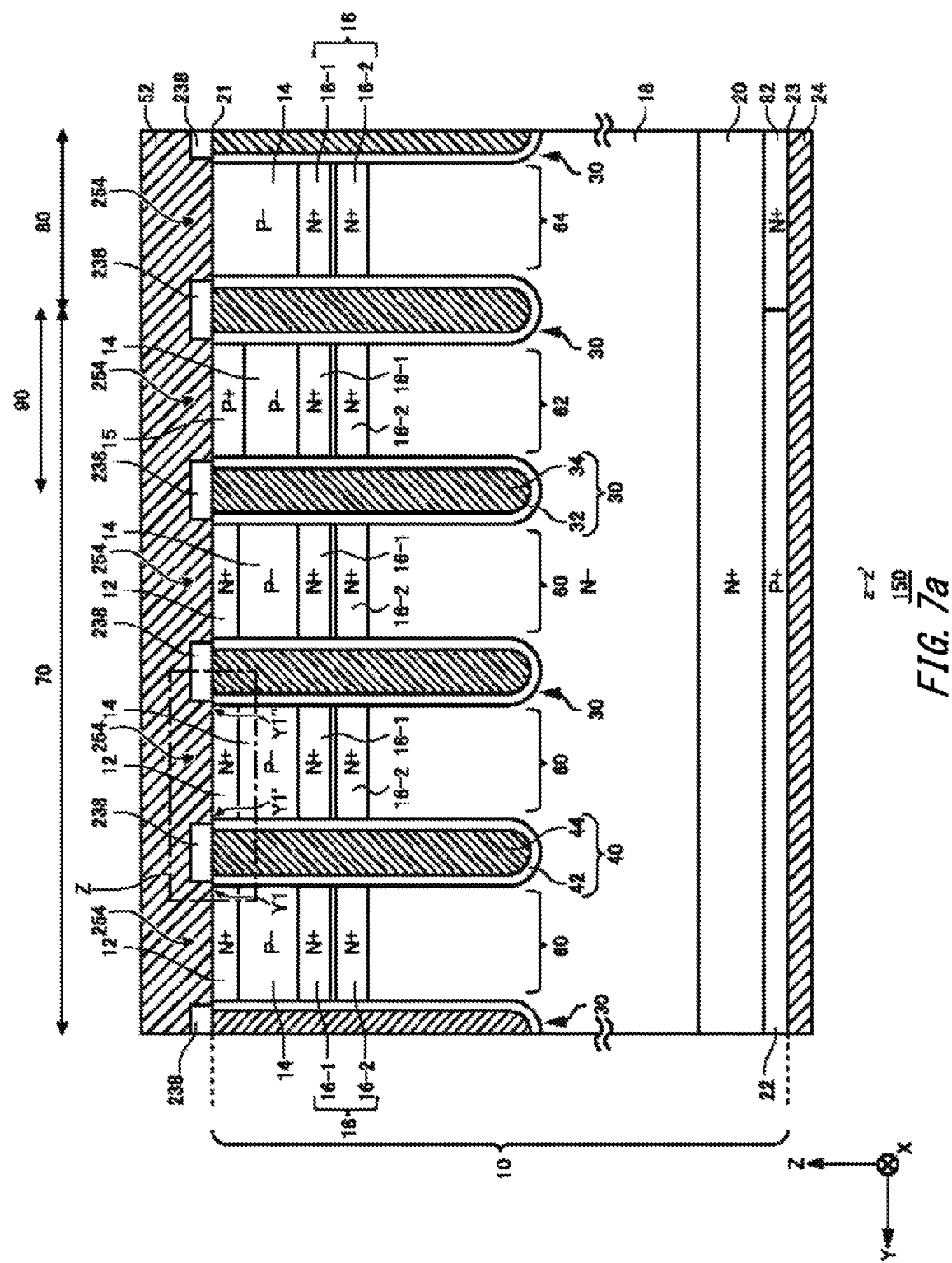
FIG. 7a shows one example of the cross section z-z' in FIG. 6.

FIG. 7a shows the cross section z-z' in FIG. 6. As shown in FIG. 7a, the semiconductor device 150 in the comparative example is not provided with the protective insulating film 36. In the semiconductor device 150 of the comparative example, the interlayer dielectric film 238 is provided on the upper surface 21. That is, the position in the Z-axis direction of the upper surface 21 is equal to the position of the lower surface of the interlayer dielectric film 238.

Figure 7B:
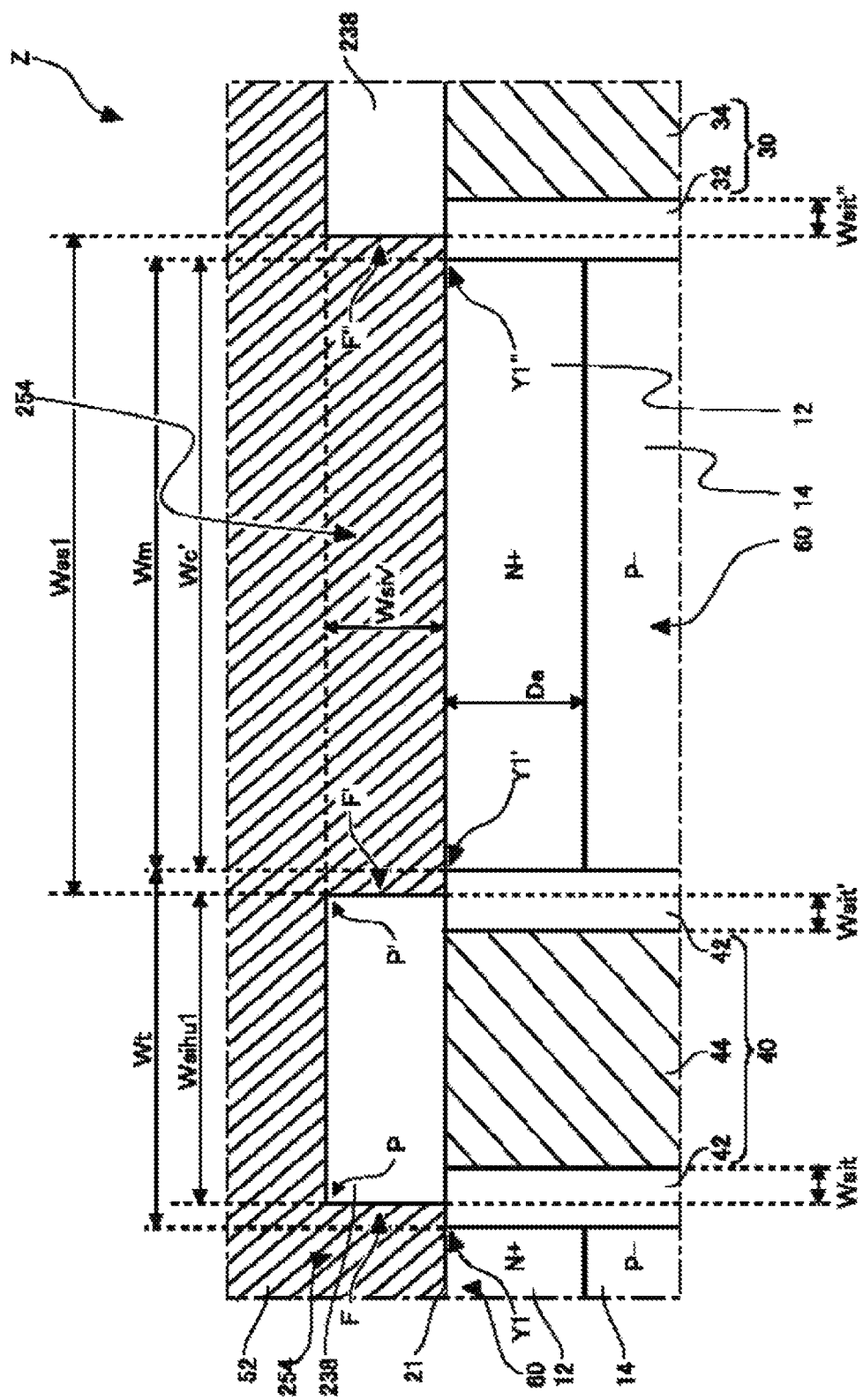

FIG. 7b is an enlarged view of the region Z in FIG. 7a. As shown in FIG. 7b, the semiconductor device 150 in the comparative example is not provided with the protective insulating film 36.

The width Wsit is the width in the Y-axis direction between the end on the positive side in the Y-axis direction of the interlayer dielectric film 238 provided above the gate trench portion 40 and the end on the positive side in the Y-axis direction of the gate conductive portion 44. The width Wsit is the width in the Y-axis direction between the end on the negative side in the Y-axis direction of the contact hole 254 provided on the positive side in the Y-axis direction of the gate trench portion 40 and the end on the positive side in the Y-axis direction of the gate conductive portion 44.

The width Wsit' is the width in the Y-axis direction between the end on the negative side in the Y-axis direction of the interlayer dielectric film 238 provided above the gate trench portion 40 and the end on the negative side in the Y-axis direction of the gate conductive portion 44. The width Wsit' is the width in the Y-axis direction between the end on the positive side in the Y-axis direction of the contact hole 254 provided on the negative side in the Y-axis direction of the gate trench portion 40 and the end on the positive side in the Y-axis direction of the gate conductive portion 44. The width Wsit is equal to the width Wsit'.

The width Wsit" is the width in the Y-axis direction between the end on the positive side in the Y-axis direction of the interlayer dielectric film 238 provided above the dummy trench portion 30 and the end on the positive side in the Y-axis direction of the dummy conductive portion 34.

The width Wsit" is the width in the Y-axis direction between the end on the negative side in the Y-axis direction of the contact hole 254 provided on the positive side in the Y-axis direction of the dummy trench portion 30 and the end on the positive side in the Y-axis direction of the dummy conductive portion 34.

The semiconductor device 150 in the comparative example is not provided with the protective insulating film 36. Therefore, the short circuit between the gate conductive portion 44 and the contact provided in the contact hole 254, i.e., the short circuit between G and E occurs if the interlayer dielectric film 238 deviates to the positive side in the Y-axis direction by more than the width Wsit', or to the negative side in the Y-axis direction by more than the width Wsit due to the variation in the process. Therefore, in the semiconductor device 150 of the comparative example, it is difficult to narrow the mesa width while preventing the short circuit between G and E, and reduce the on-voltage of the transistor portion 70 by increasing the IE effect.

The thickness of the interlayer dielectric film 238, i.e., the width Wsiv' is larger than the thickness of the protective insulating film 36 in the semiconductor device 100 shown in FIG. 2b, i.e., the width Wiv. Therefore, the interlayer dielectric film 238 can not be positioned with as much precision as the protective insulating film 36. Therefore, the interlayer dielectric film 238 more readily deviates to the positive side in the Y-axis direction by more than the width Wsit' or to the negative side in the Y-axis direction of the width Wsit than the protective insulating film 36, causing more short circuit between G and E.

Figure 8A:
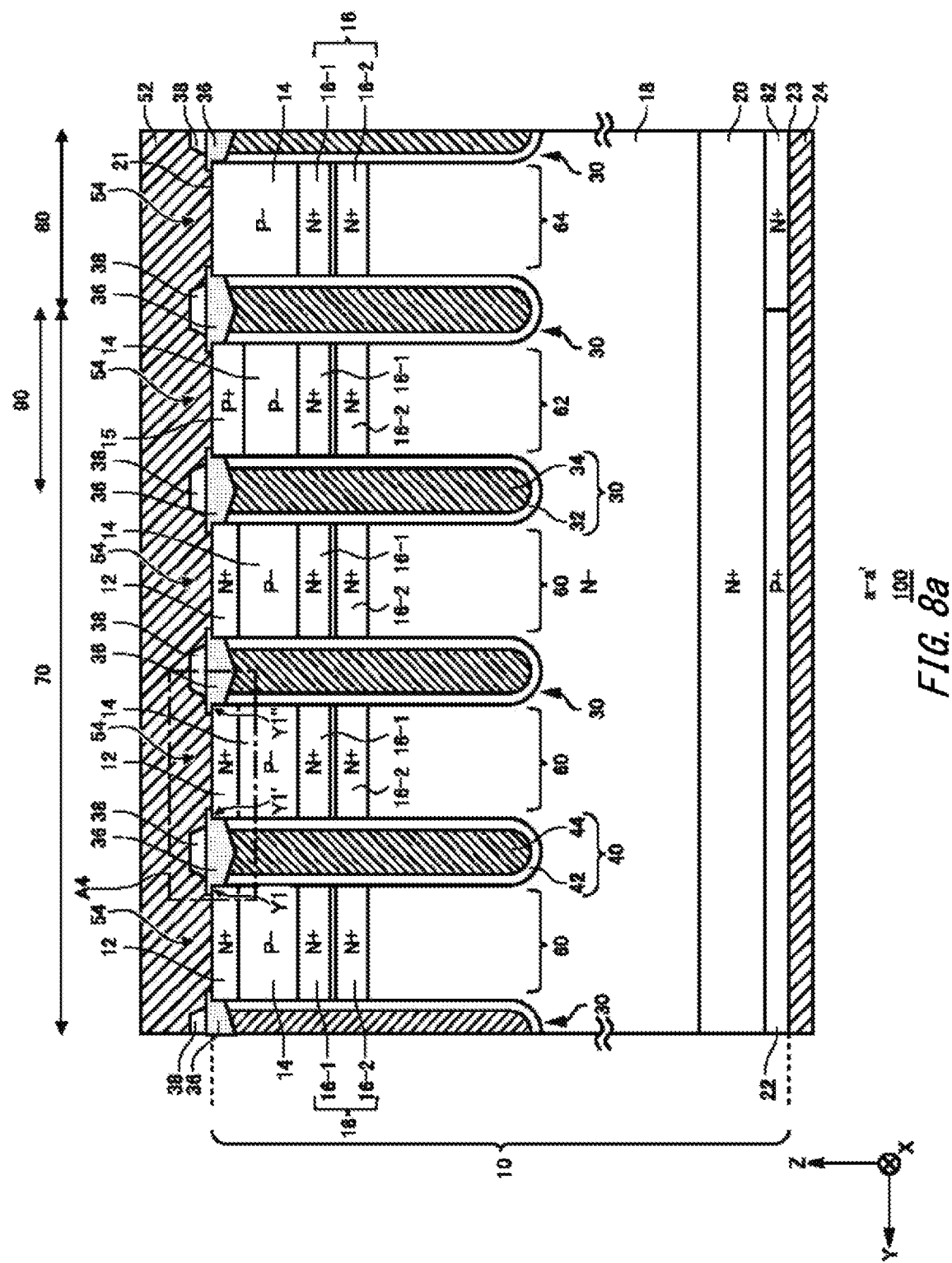
FIG. 8a shows another example of the cross section a-a' in FIG. 1.

FIG. 8a shows another example of the cross section a-a' in FIG. 1. The semiconductor device 100 of the present example is different from the semiconductor device 100 shown in FIG. 2a in that the side surface of the interlayer dielectric film 38 is tapered in the semiconductor device 100 shown in FIG. 2a.

Figure 8B:
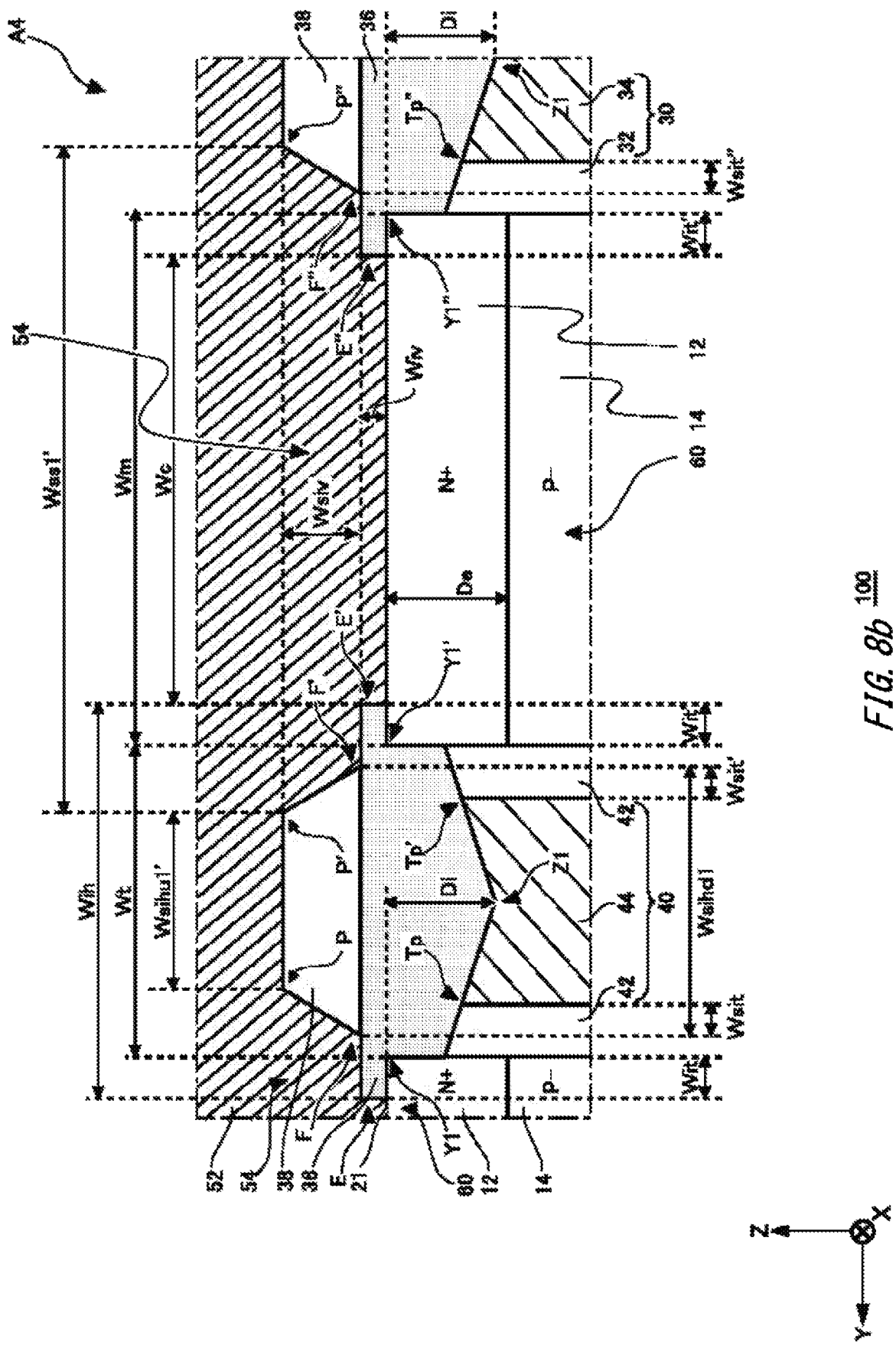

FIG. 8b is an enlarged view of the region A4 in FIG. 8a. As shown in FIG. 8b, the side surface of the interlayer dielectric film 38 is tapered in the semiconductor device 100 of the present example. In the present example, the end portion F, the end portion F', and the end portion F" may be the end of the tapered side surface of the interlayer dielectric film 38 in contact with the protective insulating film 36 in the Z-axis direction.

The vertex P in the present example is provided on a more negative side in the Y-axis direction than the vertex P in the example shown in FIG. 2b. The vertex P' in the present example is provided on a more positive side in the Y-axis direction than the vertex P' in the example shown in FIG. 2b. The vertex P'" in the present example is provided on a more negative side in the Y-axis direction than the vertex P'" in the example shown in FIG. 2b.

The width Wss1' in the Y-axis direction between the vertex P' and the vertex P'" in the present example is the width in the Y-axis direction between the vertex P' of the interlayer dielectric film 38 provided above the gate trench portion 40 and the vertex P'" of the interlayer dielectric film 38 provided above the dummy trench portion 30. In the present example, because the vertex P' is provided on a more positive side in the Y-axis direction and the vertex P'" is provided on a more negative side in the Y-axis direction as compared with the example shown in FIG. 2b, the width Wss1' is larger than the width Wss1 in the example shown in FIG. 2b.

The width Wsihu1' in the Y-axis direction between the vertex P and the vertex P' in the present example is the width between the vertex P and the vertex P' in the Y-axis direction of the interlayer dielectric film 38 provided above the gate trench portion 40. In the present example, because the vertex P is provided on a more negative side in the Y-axis direction and the vertex P' is provided on a more positive side in the Y-axis direction as compared with the example shown in FIG. 2b, the width Wsihu1' is smaller than the width Wsihd1.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 2b. Thus, in the first mesa portion 60, the contact resistance between the the contact and the emitter region 12 can be further reduced as compared with the semiconductor device 100 shown in FIG. 2b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 2b.

Figure 9A:
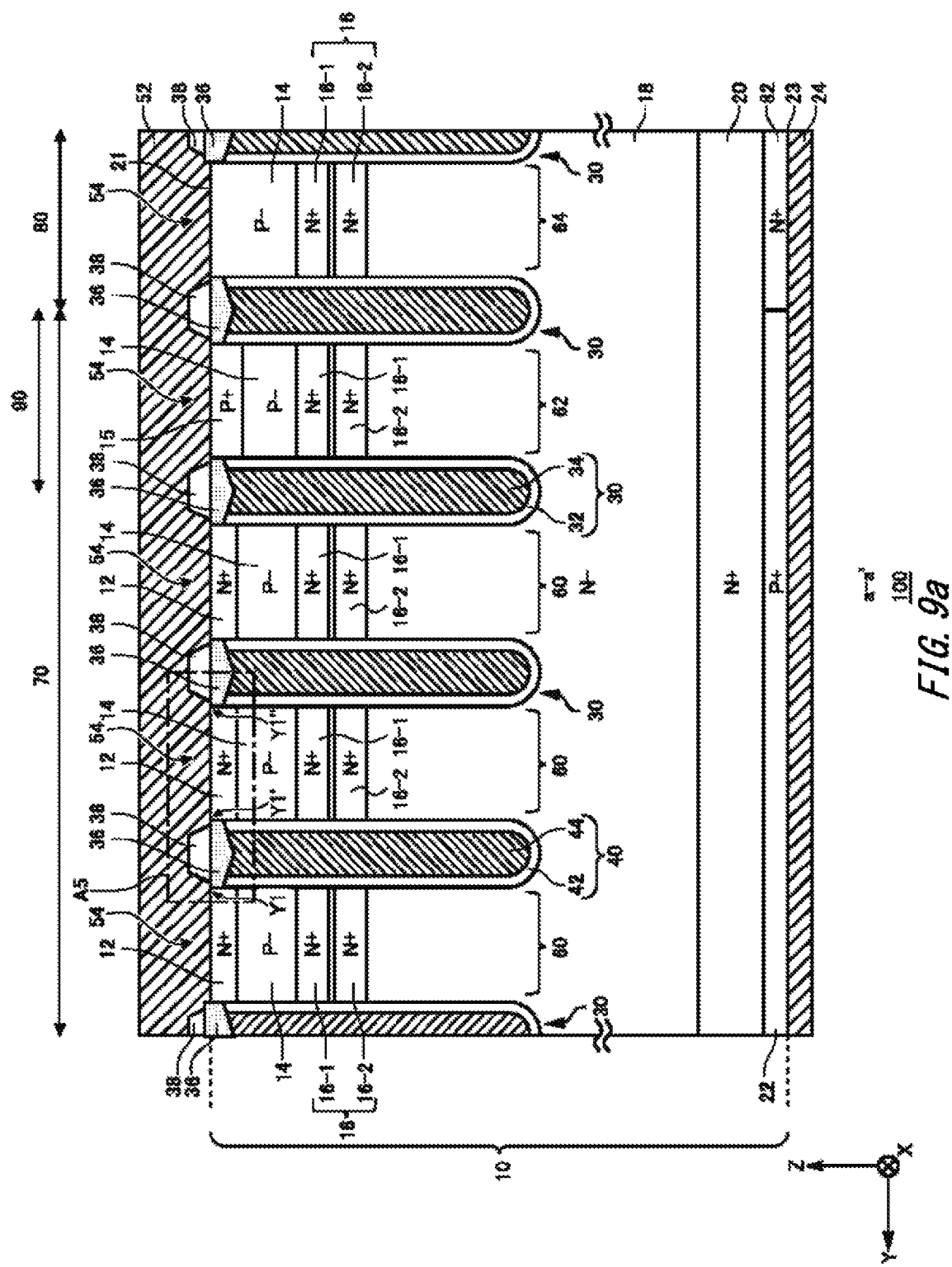
FIG. 9a shows another example of the cross section a-a' in FIG. 1.

FIG. 9a shows another example of the cross section a-a' in FIG. 1. The semiconductor device 100 of the present example is different from the semiconductor device 100 shown in FIG. 3a in that the side surface of the interlayer dielectric film 38 is tapered in the semiconductor device 100 shown in FIG. 3a.

Figure 9B:
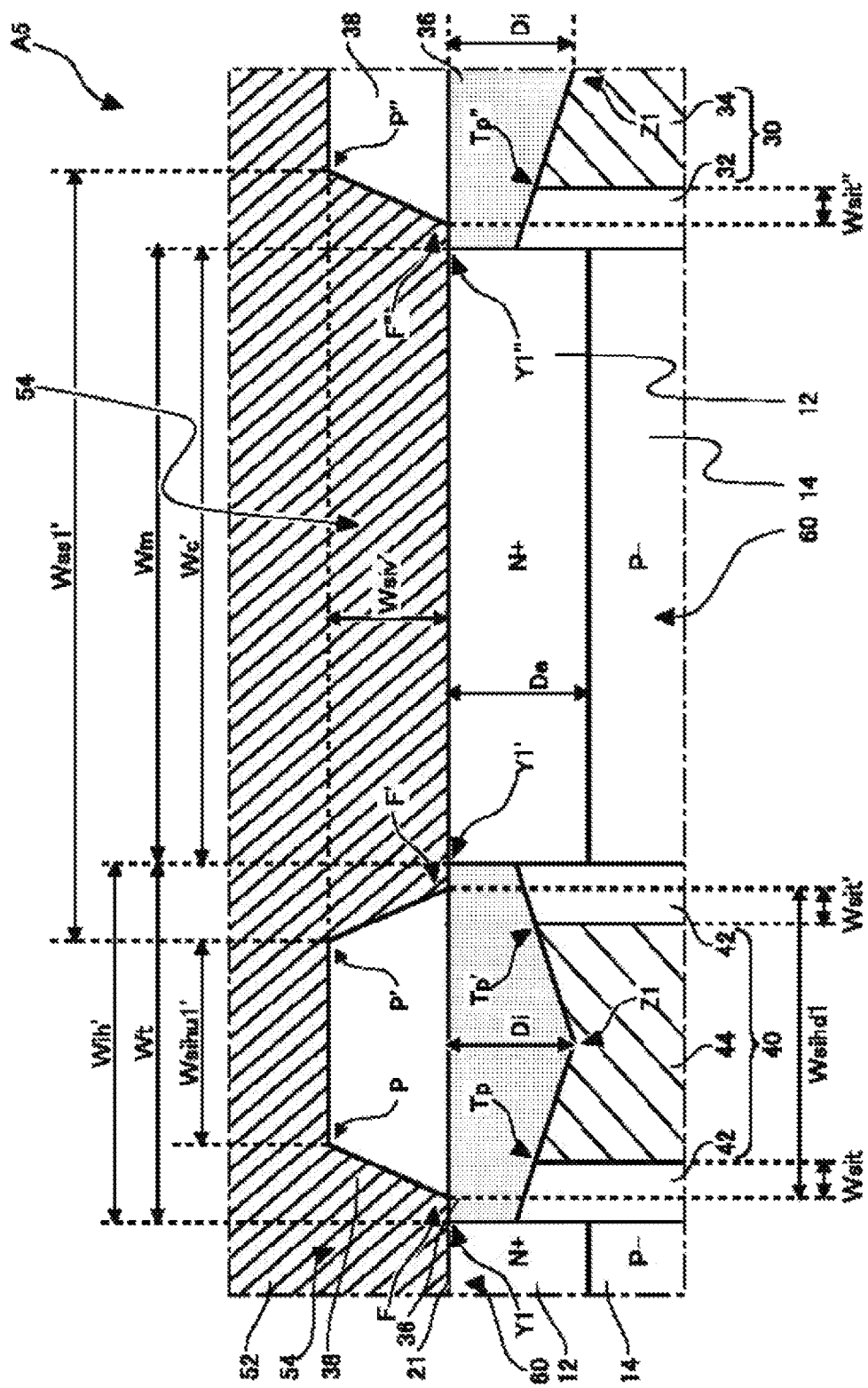

FIG. 9b is an enlarged view of the region A5 in FIG. 9a. As shown in FIG. 9b, in the semiconductor device 100 of the present example, the side surface of the interlayer dielectric film 38 is tapered. In the semiconductor device 100 of the present example, the positions in the Y-axis direction of the vertex P, the vertex P', and the vertex P''' are equal to the positions in the Y-axis direction of the vertex P, the vertex P', and the vertex P''' in the example shown in FIG. 8b, respectively.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 3b. Thus, in the first mesa portion 60, the contact resistance between the the contact and the emitter region 12 can be further reduced as compared with the semiconductor device 100 shown in FIG. 3b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 3b.

Figure 10A:
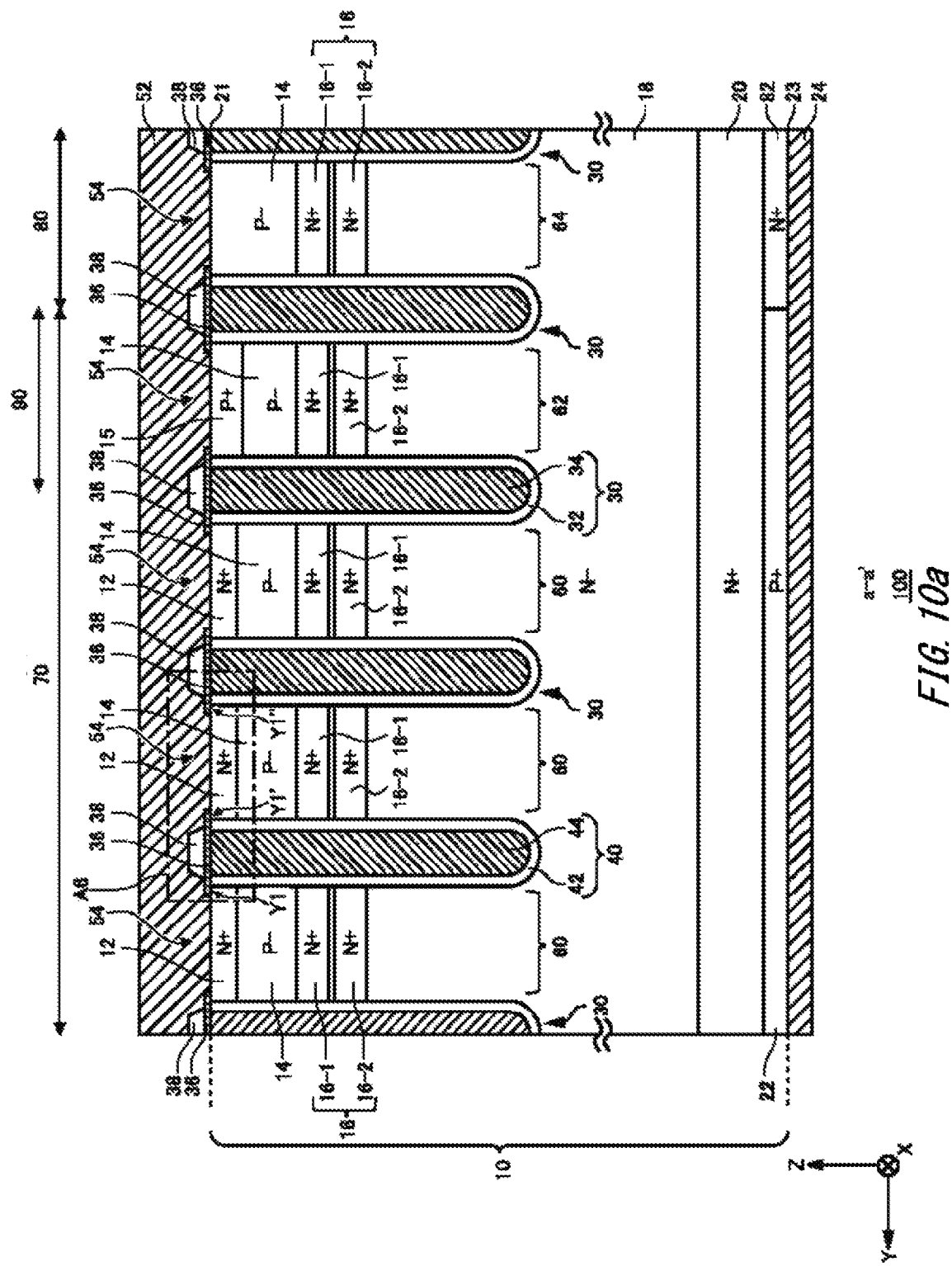
FIG. 10a shows another example of the cross section a-a' in FIG. 1.

FIG. 10a shows another example of the cross section a-a' in FIG. 1. The semiconductor device 100 of the present example is different from the semiconductor device 100 shown in FIG. 4a in that the side surface of the interlayer dielectric film 38 is tapered in the semiconductor device 100 shown in FIG. 4a.

Figure 10B:
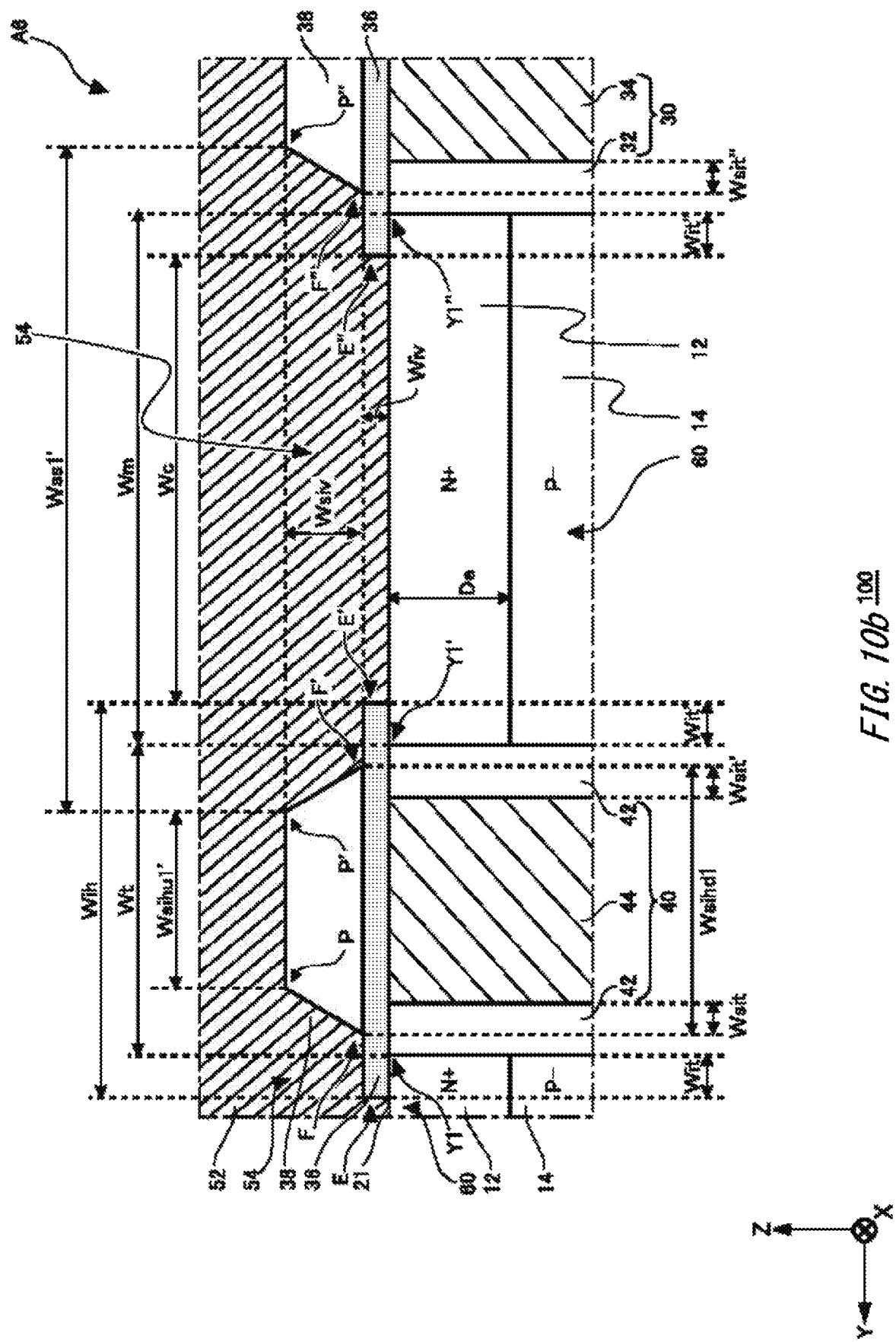

FIG. 10b is an enlarged view of the region A6 in FIG. 10a. As shown in FIG. 10b, in the semiconductor device 100 of the present example, the side surface of the interlayer dielectric film 38 is tapered. In the semiconductor device 100 of the present example, the positions in the Y-axis direction of the vertex P, the vertex P', and the vertex P''' are equal to the positions in the Y-axis direction of the vertex P, the vertex P', and the vertex P''' in the example shown in FIG. 8b and FIG. 9b, respectively.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 4b. Thus, in the first mesa portion 60, the contact resistance between the the contact and the emitter region 12 can be further reduced as compared with the semiconductor device 100 shown in FIG. 4b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 4b.

Figure 11:
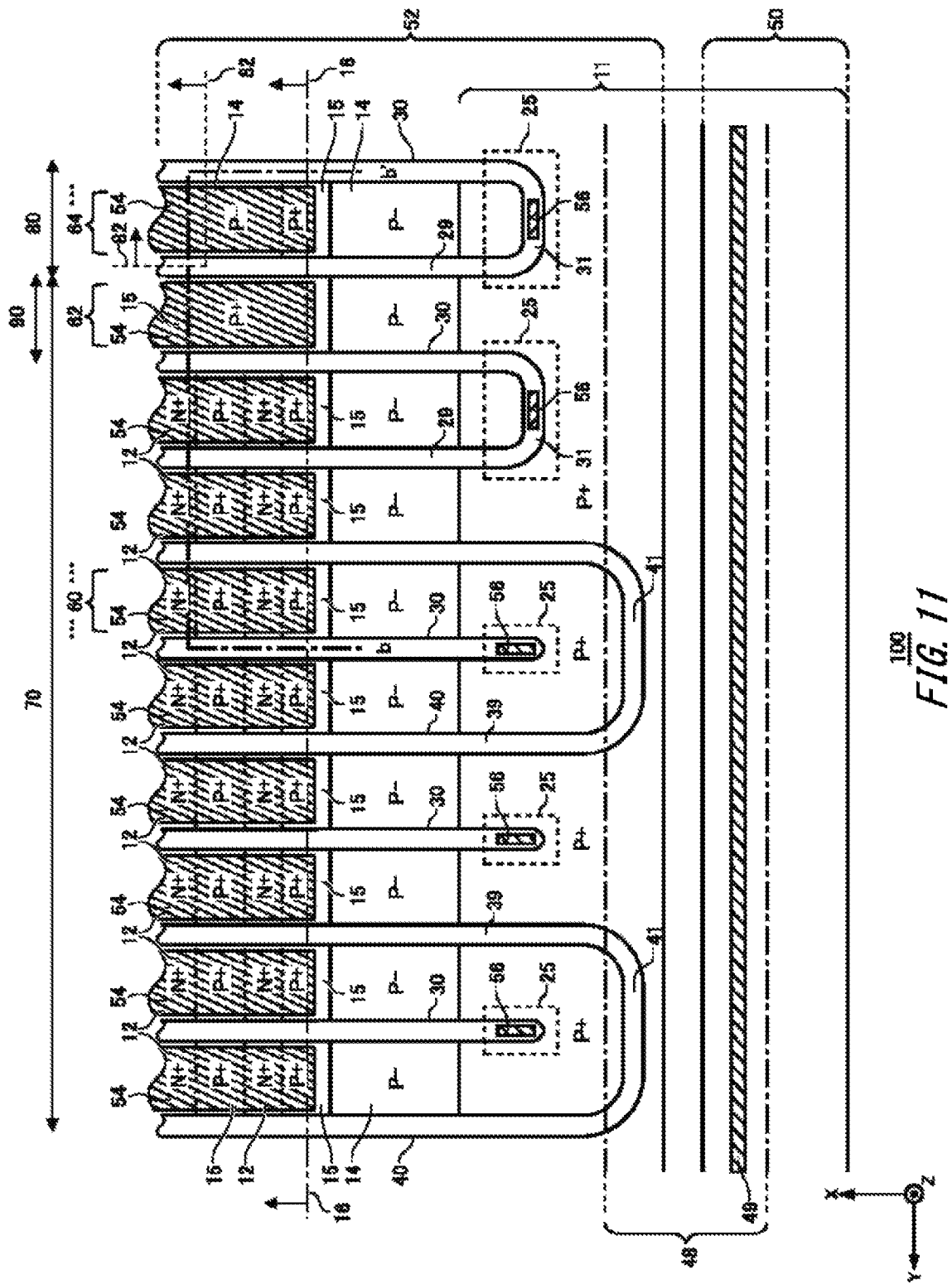
FIG. 11 shows a part of another example of an upper surface of the semiconductor device 100 according to the present embodiment.

FIG. 11 shows a part of another example of the upper surface of the semiconductor device 100 according to the present embodiment. The semiconductor device 100 shown in FIG. 11 in one example in which the width in the Y-axis direction of the contact hole 54 is smaller as compared with the semiconductor device 100 shown in the FIG. 1. The contact hole 54 may be provided such that it is separated in the Y-axis direction from the gate trench portion 40 and the dummy trench portion 30 in the top view of FIG. 11.

Figure 12A:
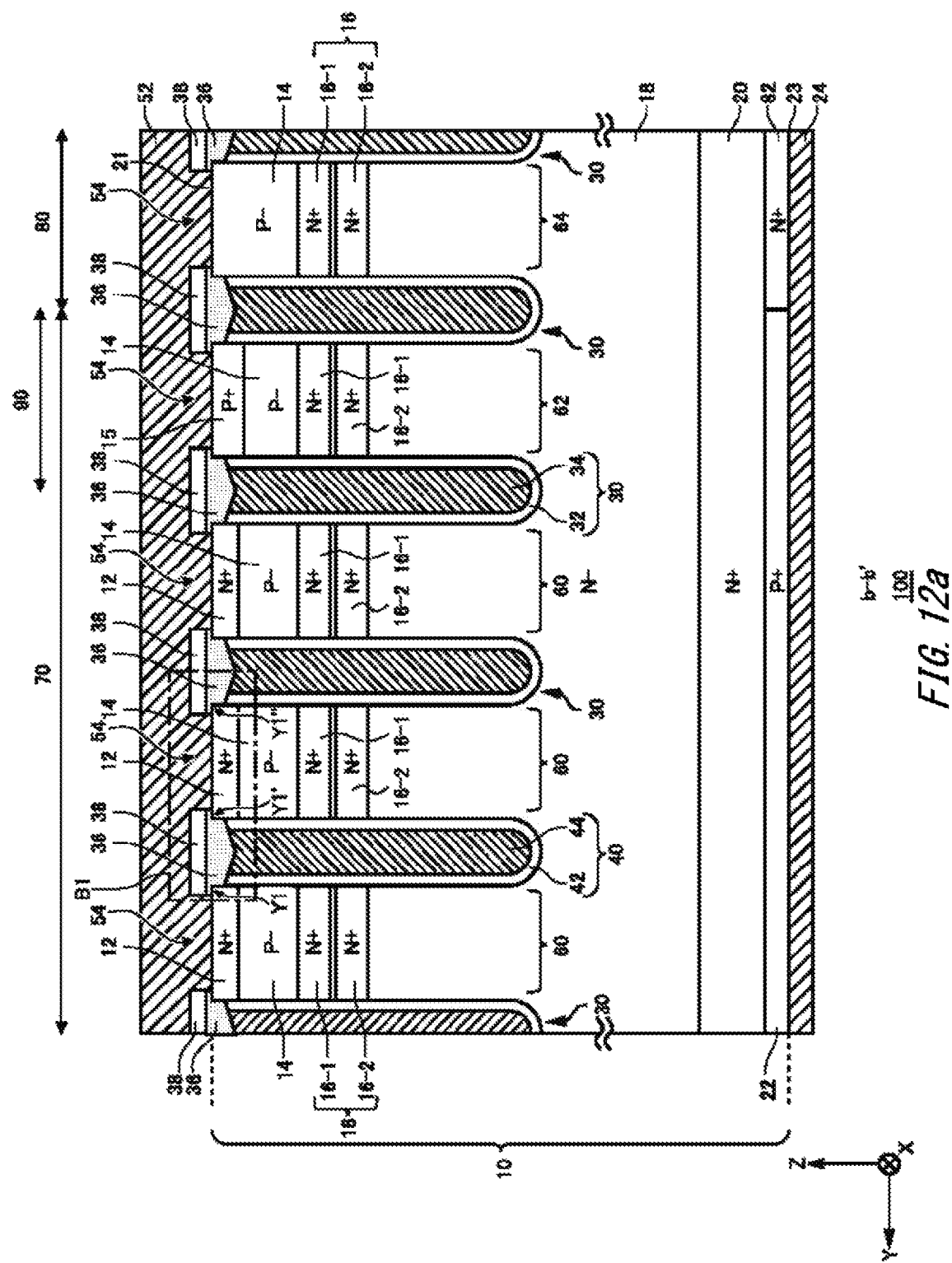
FIG. 12a shows one example of the cross section b-b' in FIG. 11.

FIG. 12a shows one example of the cross section b-b' in FIG. 11. The semiconductor device 100 shown in FIG. 12a is different from the semiconductor device 100 shown in FIG. 2a in that the width in the Y-axis direction of the interlayer dielectric film 38 is equal to the width in the Y-axis direction of the protective insulating film 36. The semiconductor device 100 shown in FIG. 12a is different from the semiconductor device 100 shown in FIG. 2a in that the width in the Y-axis direction of the contact hole 54 is smaller as compared with the example shown in FIG. 2a.

Figure 12B:
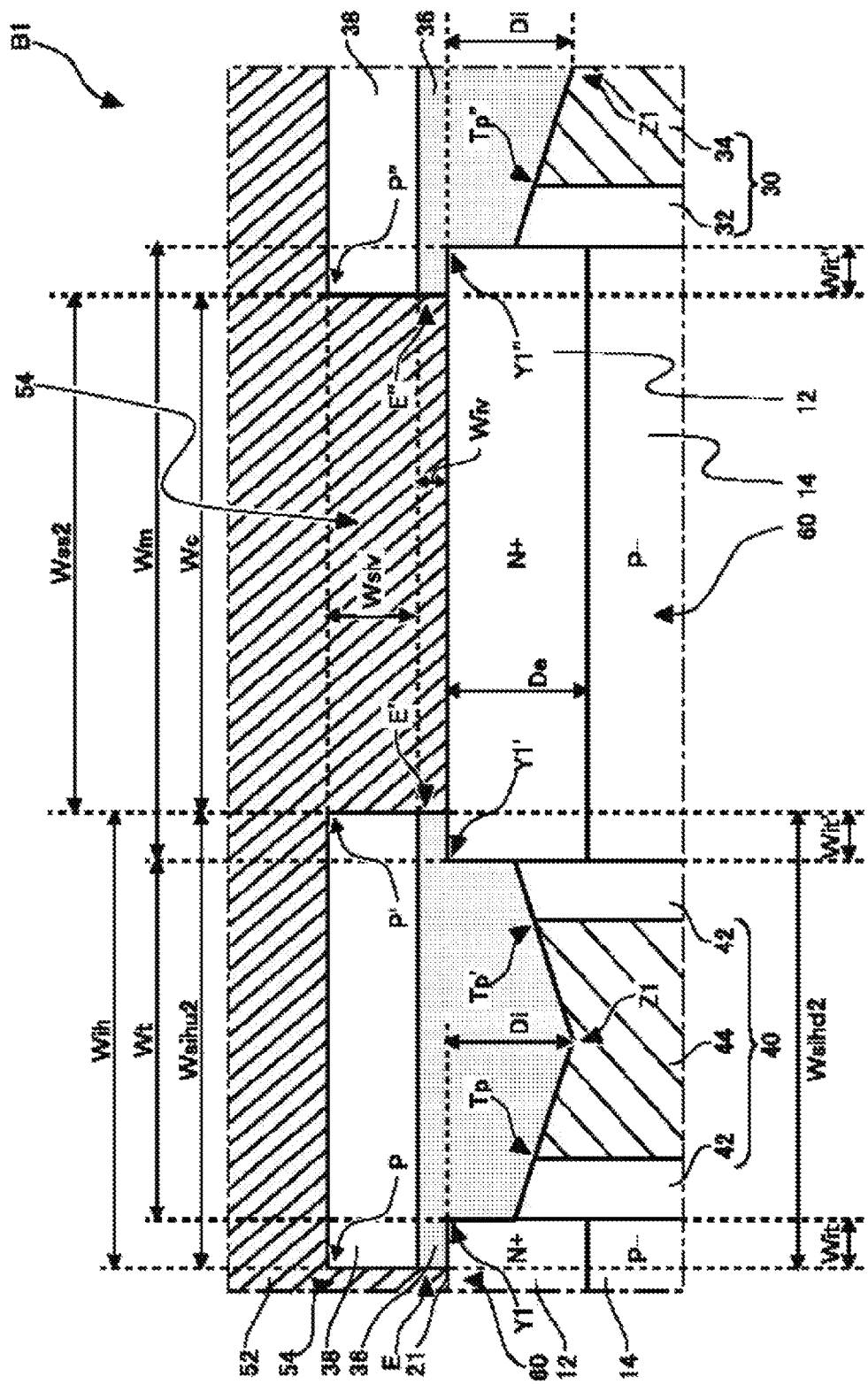

FIG. 12b is an enlarged view of the region B1 in FIG. 12a. In the present example, the width Wsihu2 is the width in the Y-axis direction between the vertex P and the vertex P' of the interlayer dielectric film 38. The width Wsihd2 is the width in the Y-axis direction of the interlayer dielectric film 38 in a position where the interlayer dielectric film 38 is in contact with the protective insulating film 36 in the Z-axis direction. In the present example, because the side surface of the interlayer dielectric film 38 is equal to the X-Z plane, the width Wsihu2 is equal to the width Wsihd2. The width Wsihu2 and the width Wsihd2 are equal to the width of the interlayer dielectric film.

As shown in FIG. 12b, in the semiconductor device 100 of the present example, on the boundary where the interlayer dielectric film 38 is in contact with the protective insulating film 36, the width Wsihd2 in the Y-axis direction of the interlayer dielectric film 38 is equal to the width Wih in the Y-axis direction of the protective insulating film 36. The width Wss2 in the Y-axis direction between the vertex P' of the interlayer dielectric film 38 provided above the gate trench portion 40 and the vertex P''' of the interlayer dielectric film 38 provided above the dummy trench portion 30 is equal to the width Wc of the contact hole 54.

In the semiconductor device 100 of the present example, the protective insulating film 36 can be positioned in the direction parallel to the upper surface 21 with higher precision than the interlayer dielectric film 38, because the width Wiv is smaller than the width Wsiv. Thus, the short circuit between G and E can be prevented even if the first mesa portion 60 is further narrowed. Thus, the on-voltage of the transistor portion 70 can be reduced by narrowing the mesa width to increase the IE effect, while the short circuit between G and E is prevented.

In the semiconductor device 100 of the present example, because the protective insulating film 36 is in contact with the first mesa portion 60 and the width Wih is larger than the width Wt, the short circuit between the contact provided on the contact hole 54 and the gate conductive portion 44 can be inhibited. That is, in the semiconductor device 100 of the present example, because the protective insulating film 36 protects the gate insulating film 42 and the gate conductive portion 44, the short circuit between G and E, i.e., the short circuit between the gate metal layer 50 and the emitter electrode 52 can be prevented.

Figure 13A:
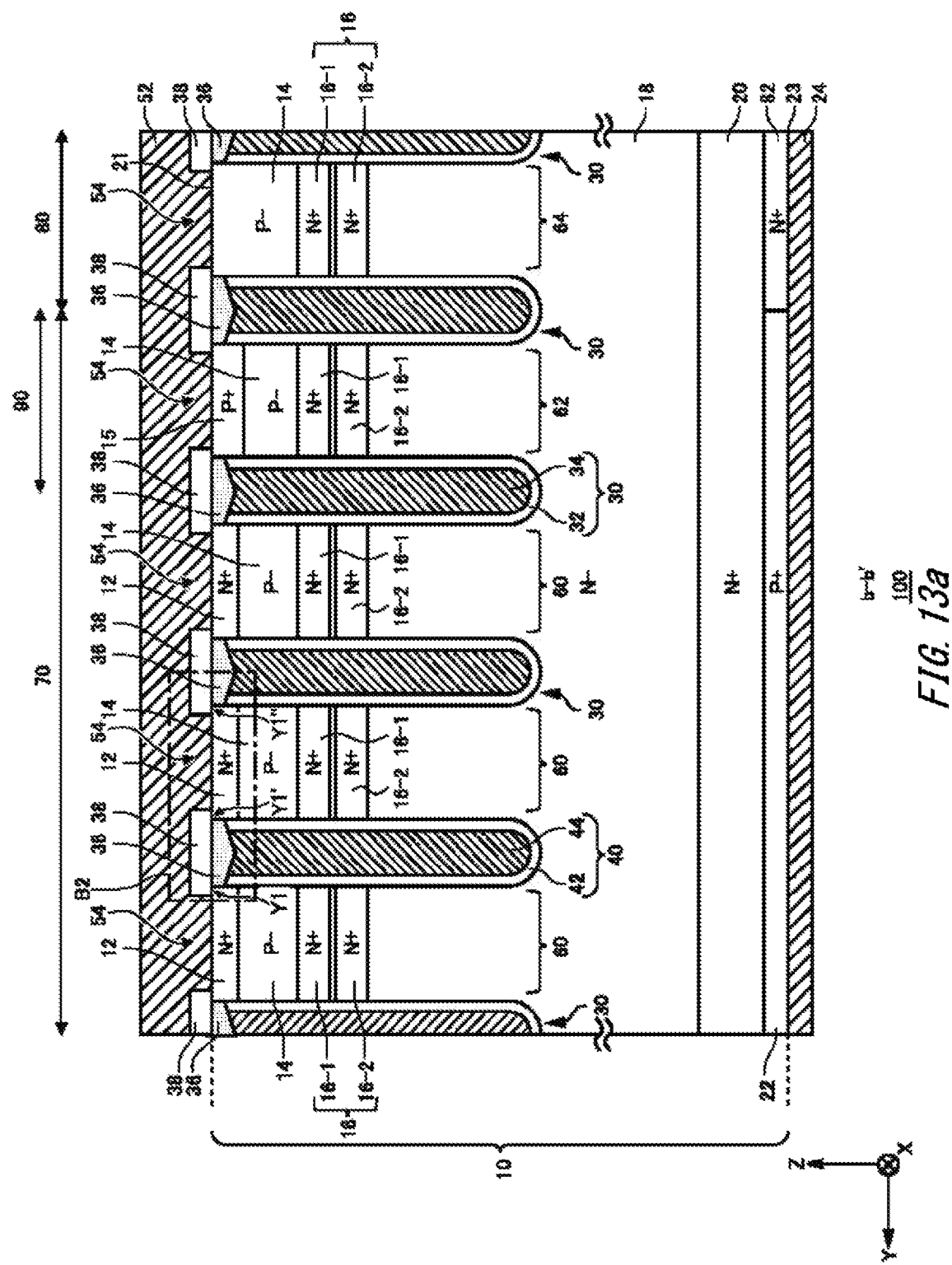
FIG. 13a shows another example of the cross section b-b' in FIG. 11.

FIG. 13a shows another example of the cross section b-b' in FIG. 11. The semiconductor device 100 in the present example is different from the semiconductor device 100 shown in FIG. 12a in that the protective insulating film 36 is not provided above the upper surface 21 in the semiconductor device 100 shown in FIG. 12a. In the present example, the position in the Z-axis direction of the upper surface of the first mesa portion 60, the second mesa portion 62, and the third mesa portion 64 are equal to the position of the upper surface of the protective insulating film 36.

Figure 13B:
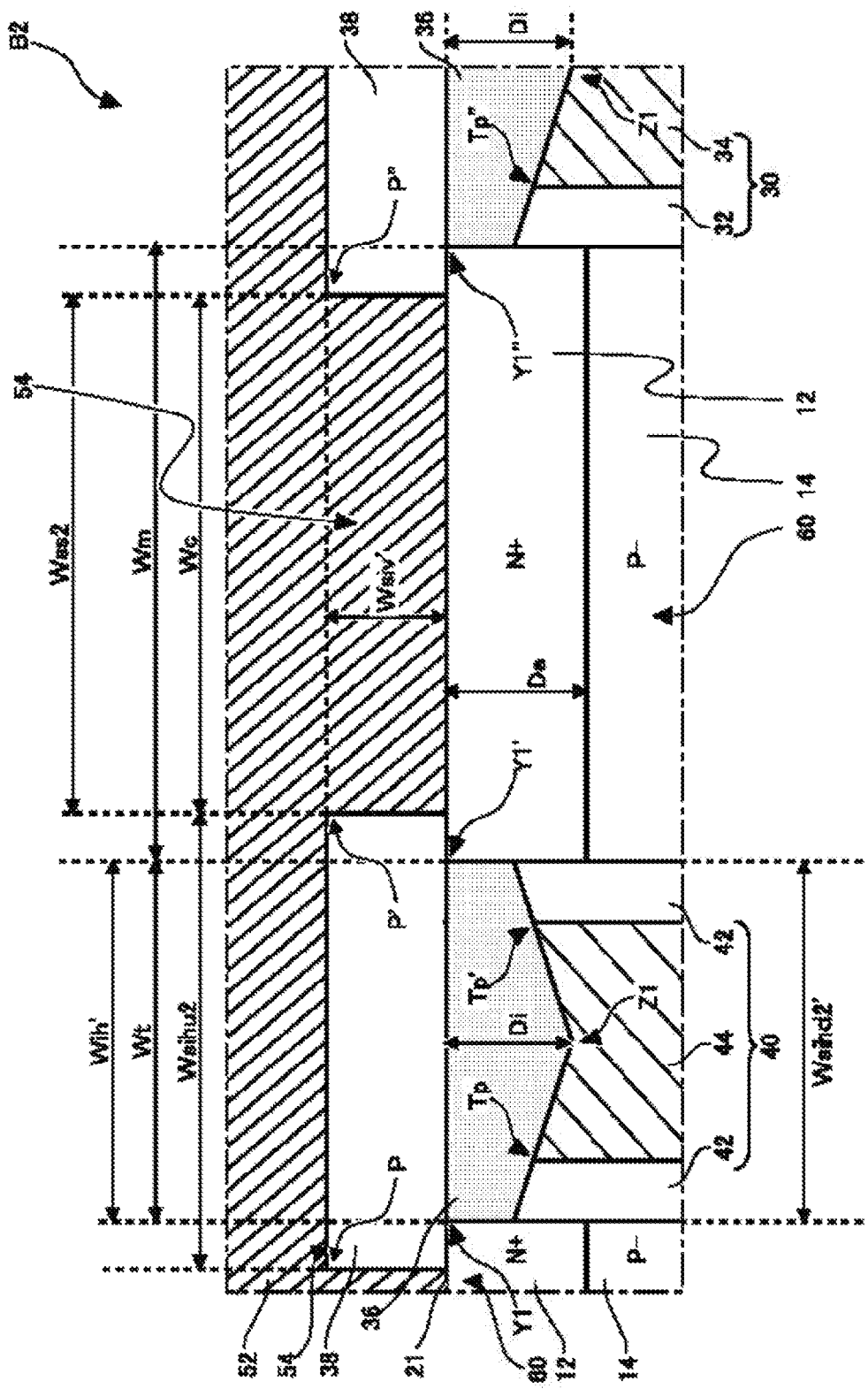

FIG. 13b is an enlarged view of the region B2 in FIG. 3a. As shown in FIG. 13b, in the semiconductor device 100 of the present example, the position in the Z-axis direction of the upper surface of the first mesa portion 60 is equal to the position of the upper surface of the protective insulating film 36. In the present example, the width Wt is equal to the width Wih' in the Y-axis direction of the protective insulating film 36, and the width Wsihd2' in the Y-axis direction of the interlayer dielectric film 38 in a position where the interlayer dielectric film 38 is in contact with the protective insulating film 36 in the Z-axis direction. The width Wsihu2 is larger than the width Wt, the width Wih' and the width Wsihd2'.

In the semiconductor device 100 of the present example, because the width Wsihu2 is larger than the width Wt, the short circuit between the contact provided in the contact hole 54 and the gate conductive portion 44 can be inhibited. That is, the semiconductor device 100 of the present example can prevent the short circuit between G and E, i.e., the short circuit between the gate metal layer 50 and the emitter electrode 52, because the protective insulating film 36 protects the gate insulating film 42 and the gate conductive portion 44.

Figure 14A:
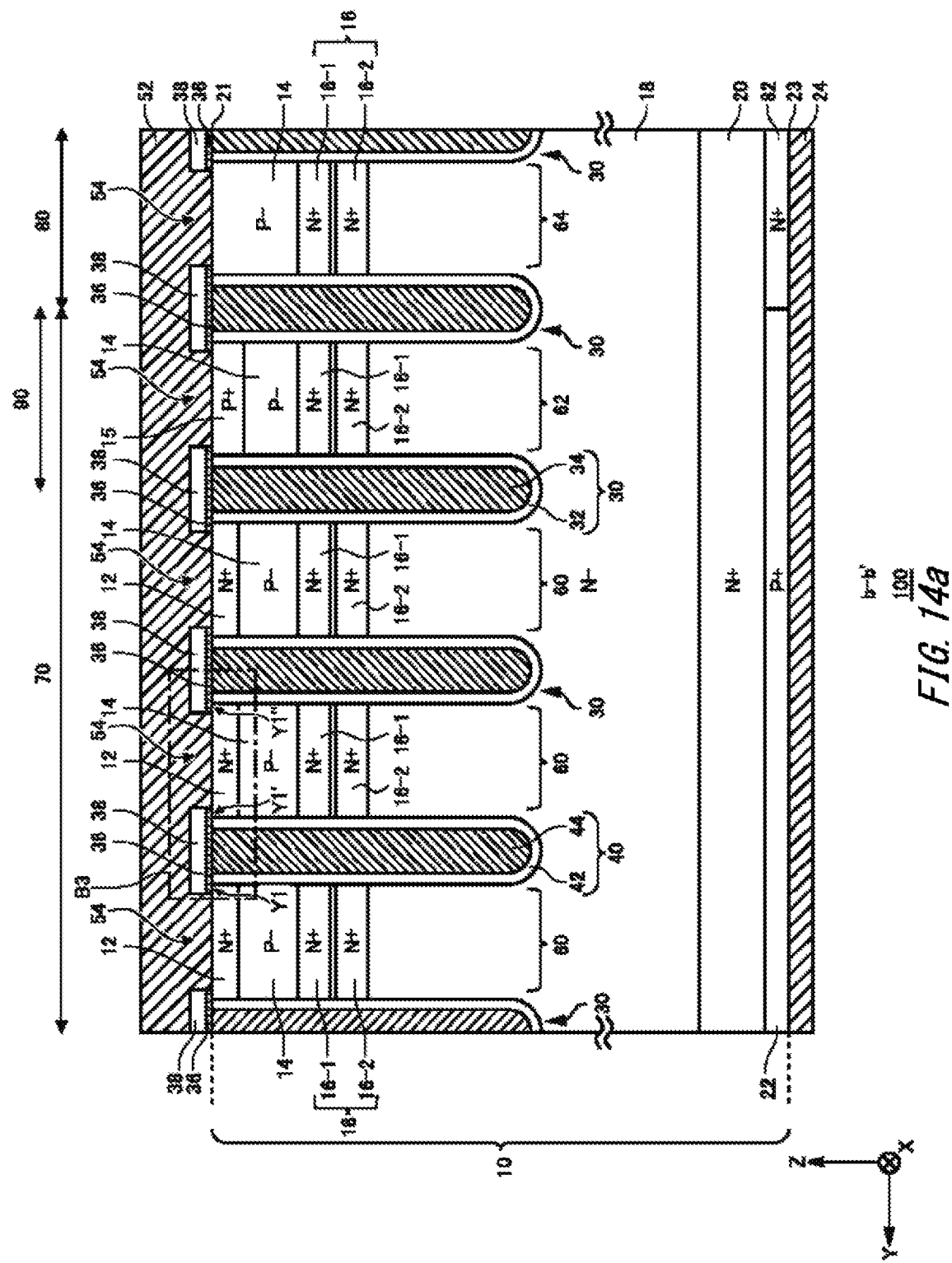
FIG. 14a shows another example of the cross section b-b' in FIG. 11.

FIG. 14a shows another example of the cross section b-b' in FIG. 11. The semiconductor device 100 in the present example is different from the semiconductor device 100 shown in FIG. 12a in that the protective insulating film 36 is not provided below the upper surface 21 in the semiconductor device 100 shown in FIG. 12a. In the present example, the position in the Z-axis direction of the upper surface of the first mesa portion 60, the second mesa portion 62, and the third mesa portion 64 are equal to the position of the lower surface of the protective insulating film 36.

Figure 14B:
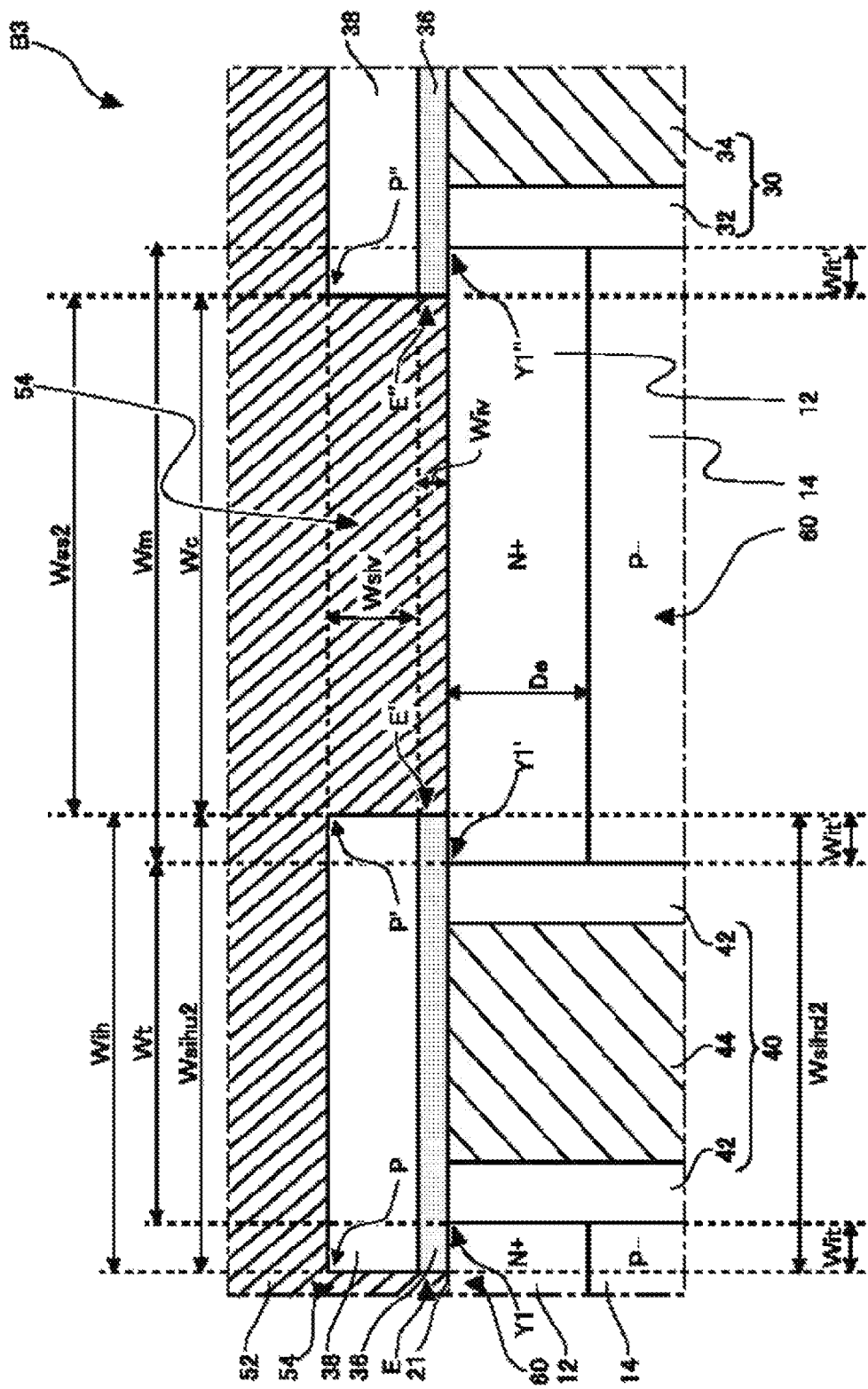

FIG. 14b is an enlarged view of the region B3 in FIG. 14a. In the semiconductor device 100 of the present example, the position in the Z-axis direction of the upper surface of the gate conductive portion 44 and the position in the Z-axis direction of the upper surface of the gate insulating film 42 is equal to the position in the Z-axis direction of the upper surface 21. The protective insulating film 36 is in contact with the gate conductive portion 44 and the gate insulating film 42 at the position in the Z-axis direction of the upper surface 21.

In the semiconductor device 100 of the present example, on the boundary where the interlayer dielectric film 38 is in contact with the protective insulating film 36, the width Wsihd2 in the Y-axis direction of the interlayer dielectric film 38 is equal to the width Wih in the Y-axis direction of the protective insulating film 36. The width Wss2 in the Y-axis direction between the vertex P' of the interlayer dielectric film 38 provided above the gate trench portion 40 and the vertex P''' of the interlayer dielectric film 38 provided above the dummy trench portion 30 is equal to the width Wc of the contact hole 54.

In the semiconductor device 100 of the present example, the protective insulating film 36 can be positioned in the direction parallel to the upper surface 21 with higher precision than the interlayer dielectric film 38, because the width Wiv is smaller than the width Wsiv. Thus, the short circuit between G and E can be prevented even if the first mesa portion 60 is further narrowed. Thus, the mesa width is narrowed while the short circuit between G and E is prevented, and the on-voltage of the transistor portion 70 can be reduced by increasing the IE effect.

In the semiconductor device 100 of the present example, because the protective insulating film 36 is in contact with the first mesa portion 60 and the width Wih is larger than the width Wt, the short circuit between the contact provided on the contact hole 54 and the gate conductive portion 44 can be inhibited. That is, in the semiconductor device 100 of the present example, because the protective insulating film 36 protects the gate insulating film 42 and the gate conductive portion 44, the short circuit between G and E, i.e., the short circuit between the gate metal layer 50 and the emitter electrode 52 can be prevented.

Figure 15A:
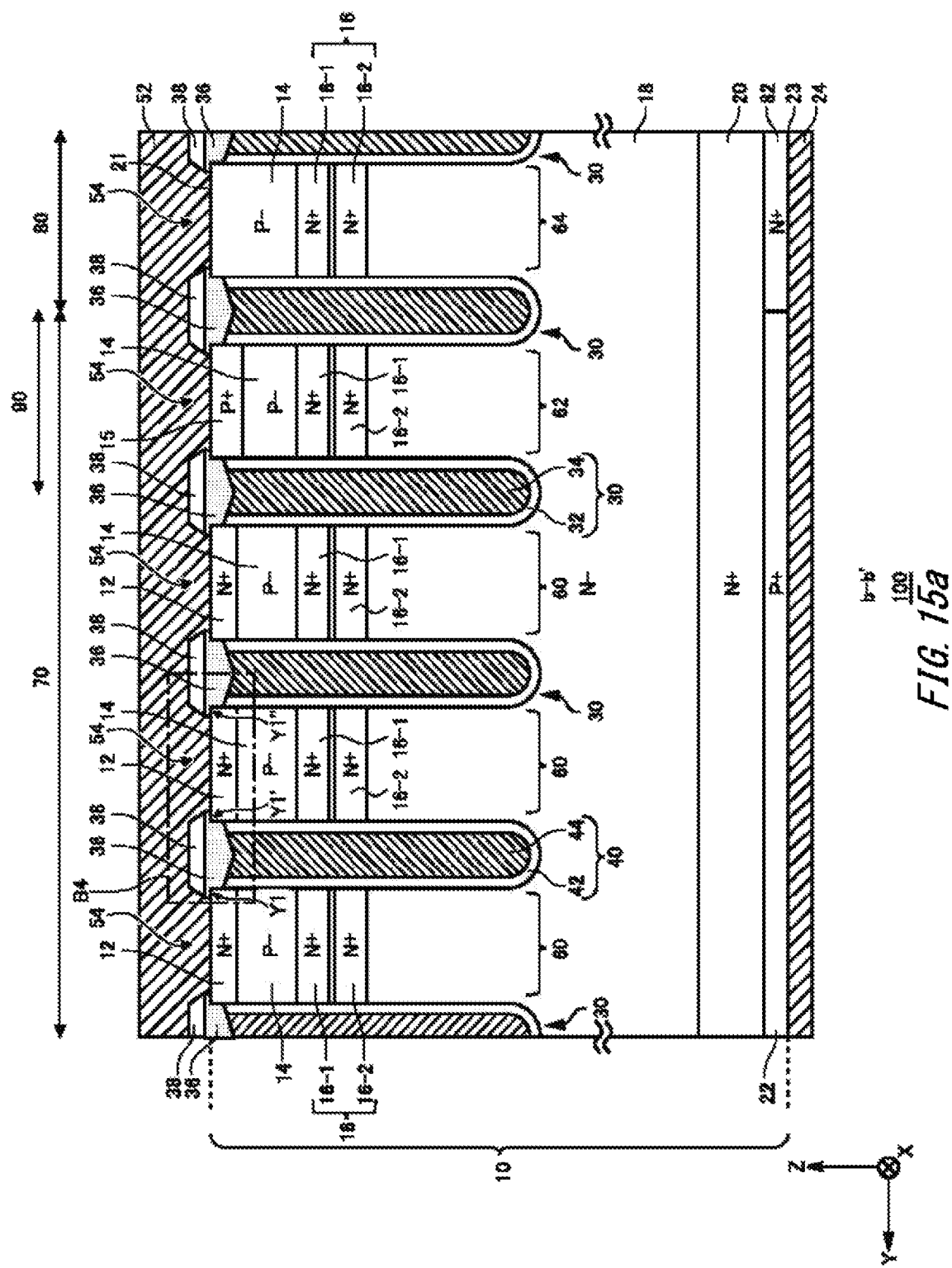
FIG. 15a shows another example of the cross section b-b' in FIG. 11.

FIG. 15a shows another example of the cross section b-b' in FIG. 11. The semiconductor device 100 of the present example is different from the semiconductor device 100 shown in FIG. 12a in that the side surface of the interlayer dielectric film 38 is tapered in the semiconductor device 100 shown in FIG. 12a.

Figure 15B:
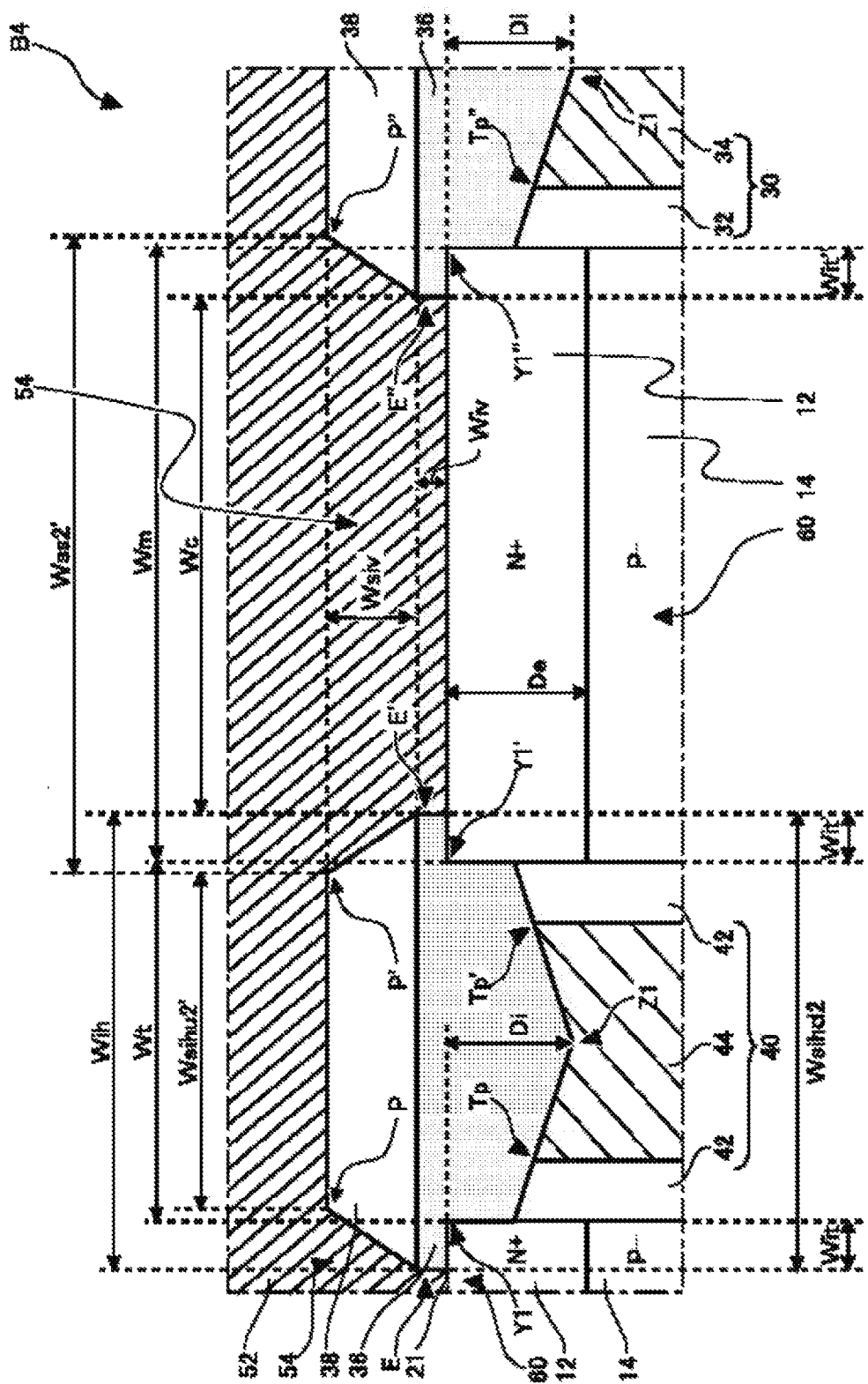

FIG. 15b is an enlarged view of the region B4 in FIG. 15a. As shown in FIG. 15b, the side surface of the interlayer dielectric film 38 is tapered in the semiconductor device 100 of the present example.

The vertex P in the present example is provided on a more negative side in the Y-axis direction than the vertex P in the example shown in FIG. 12b. The vertex P' in the present example is provided on a more positive side in the Y-axis direction than the vertex P' in the example shown in FIG. 12b. The vertex P'' in the present example is provided on a more negative side in the Y-axis direction than the vertex P''' in the example shown in FIG. 12b.

The width Wss2' in the Y-axis direction between the vertex P' and the vertex P''' in the present example is the width in the Y-axis direction between the vertex P' of the interlayer dielectric film 38 provided above the gate trench portion 40 and the vertex P''' of the interlayer dielectric film 38 provided above the dummy trench portion 30. In the present example, because the vertex P'' is provided on a more positive side in the Y-axis direction and the vertex P''' is provided on the negative side in the Y-axis direction as compared with the example shown in FIG. 12b, the width Wss2' is larger than the width Wss2 in the example shown in FIG. 12b. On the boundary where the interlayer dielectric film 38 is in contact with the protective insulating film 36, the width in the Y-axis direction of the lower surface of the interlayer dielectric film 38 is equal to the width Wih in the Y-axis direction of the protective insulating film 36.

The width Wsihu2' in the Y-axis direction between the vertex P and the vertex P' in the present example is the width in the Y-axis direction between the vertex P and the vertex P' of the interlayer dielectric film 38 provided above the gate trench portion 40. In the present example, because the vertex P is provided on a more negative side in the Y-axis direction and the vertex P' is provided on a more positive side in the Y-axis direction as compared with the example shown in FIG. 12b, the width Wsihu2' is smaller than the width Wsihd2.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 12b. Thus, in the first mesa portion 60, the contact resistance between the the contact and the emitter region 12 can be further reduced as compared with the semiconductor device 100 shown in FIG. 12b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 12b.

Figure 16A:
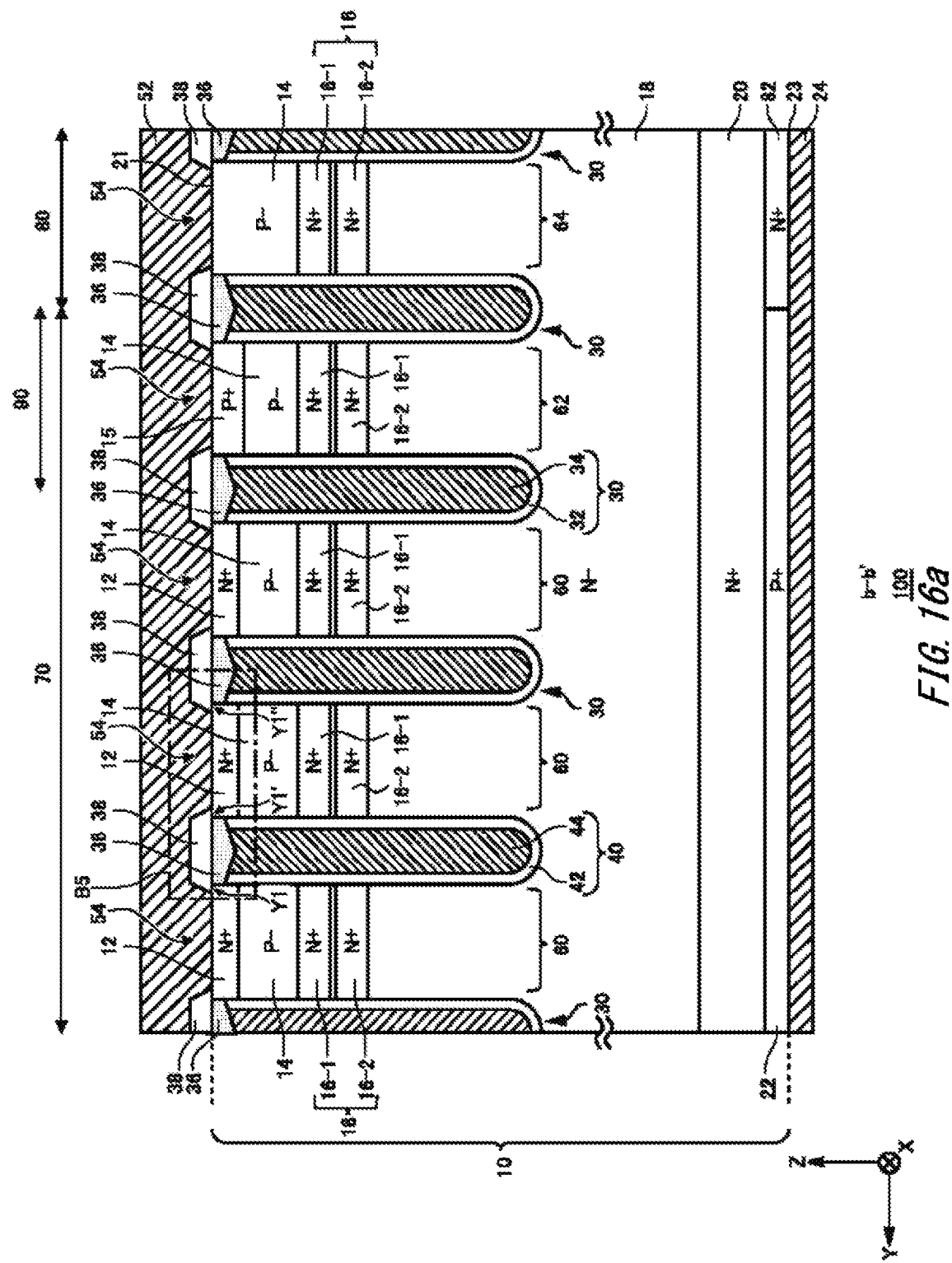
FIG. 16a shows another example of the cross section b-b' in FIG. 11.

FIG. 16a shows another example of the cross section b-b' in FIG. 11. The semiconductor device 100 of the present example is different from the semiconductor device 100 shown in FIG. 13a in that the side surface of the interlayer dielectric film 38 is tapered in the semiconductor device 100 shown in FIG. 13a.

Figure 16B:
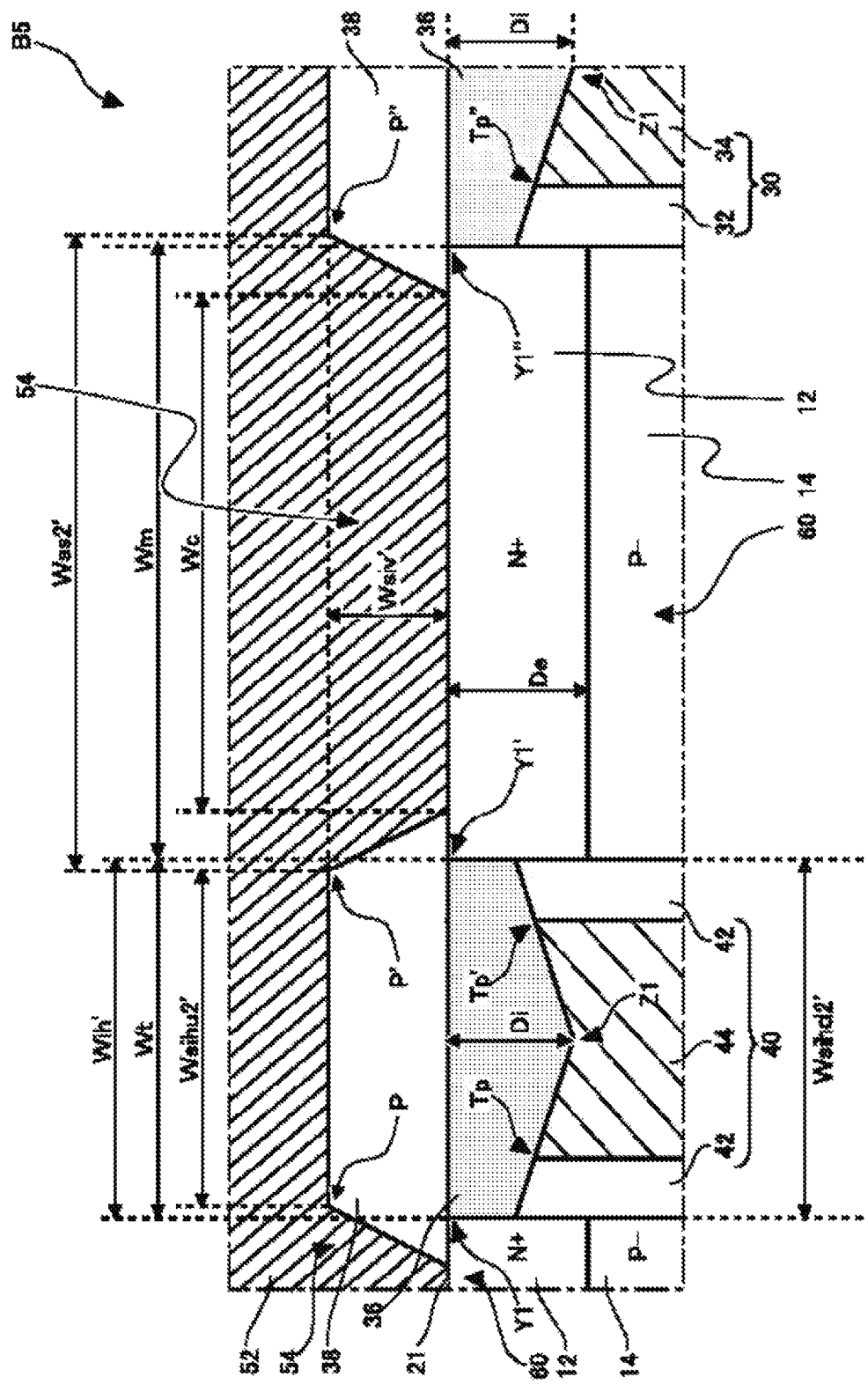

FIG. 16b is an enlarged view of the region B5 in FIG. 16a. As shown in FIG. 16b, in the semiconductor device 100 of the present example, the side surface of the interlayer dielectric film 38 is tapered. The positions in the Y-axis direction of the vertex P, the vertex P', and the vertex P''' in the semiconductor device 100 of the present example are equal to the positions in the Y-axis direction of the vertex P, the vertex P', and the vertex P''' in the example shown in FIG. 15b, respectively.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 13b. Thus, in the first mesa portion 60, the contact resistance between the the contact and the emitter region 12 can be further reduced as compared with the semiconductor device 100 shown in FIG. 13b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 13b.

Figure 17A:
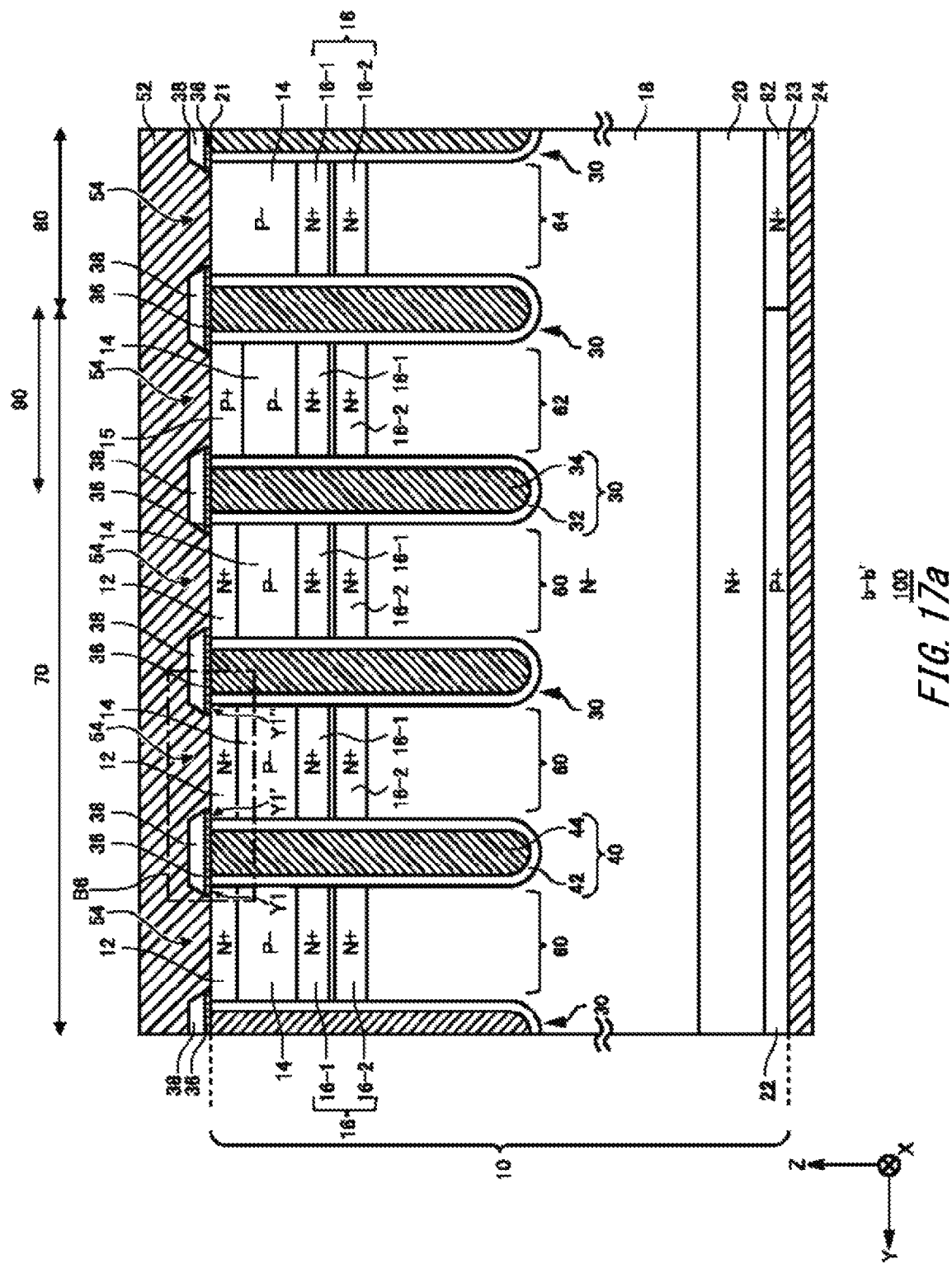
FIG. 17a shows another example of the cross section b-b' in FIG. 11.

FIG. 17a shows another example of the cross section b-b' in FIG. 11. The semiconductor device 100 of the present example is different from the semiconductor device 100 shown in FIG. 14a in that the side surface of the interlayer dielectric film 38 is tapered in the semiconductor device 100 shown in FIG. 14a.

Figure 17B:
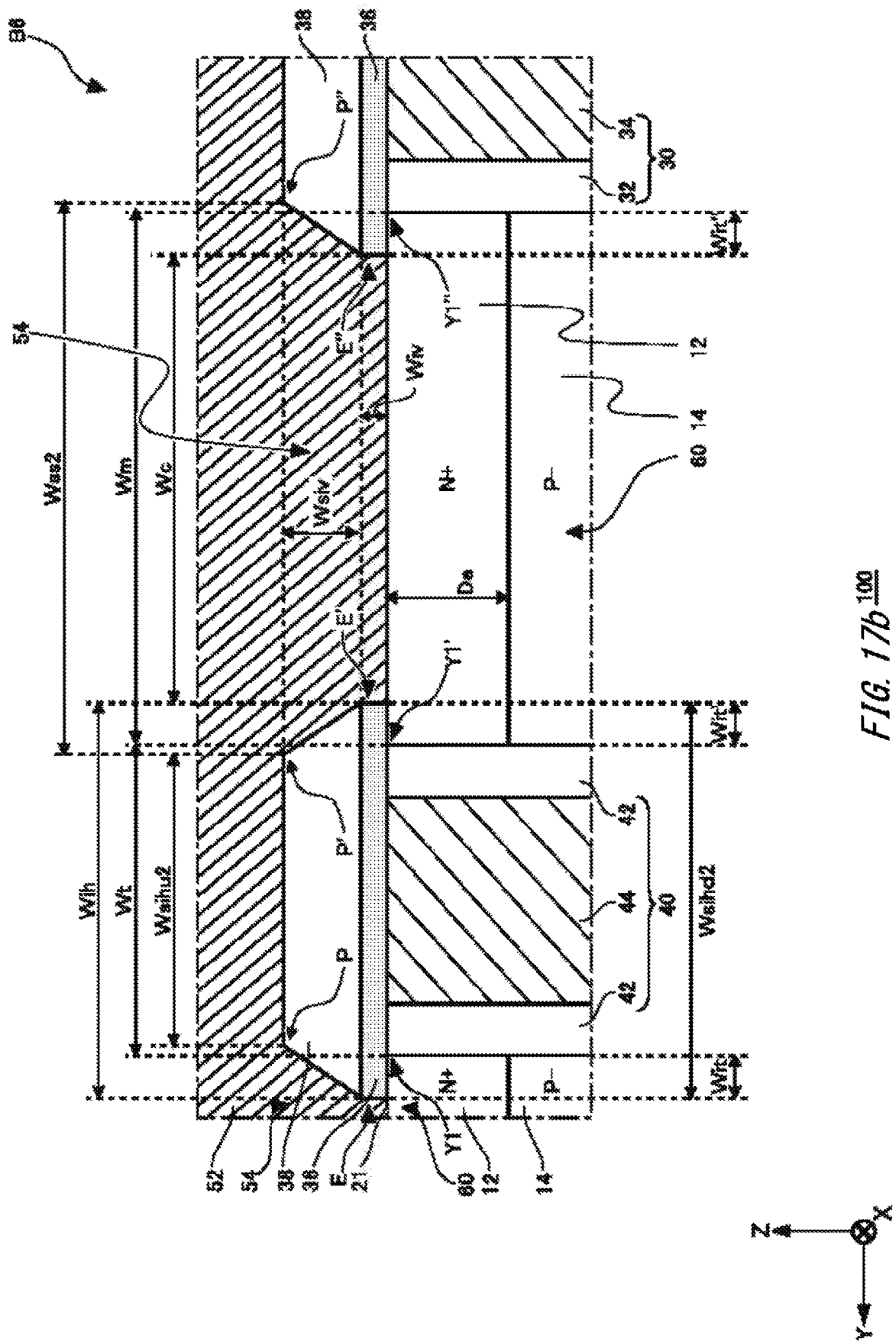

FIG. 17b is an enlarged view of the region B6 in FIG. 17a. As shown in FIG. 17b, in the semiconductor device 100 of the present example, the side surface of the interlayer dielectric film 38 is tapered. The positions in the Y-axis direction of the vertex P, the vertex P', and the vertex P''' in the semiconductor device 100 of the present example are equal to the positions in the Y-axis direction of the vertex P, the vertex P', and the vertex P''' in the example shown in FIG. 15b and FIG. 16b, respectively. On the boundary where the interlayer dielectric film 38 is in contact with the protective insulating film 36, the width in the Y-axis direction of the lower surface of the interlayer dielectric film 38 is equal to the width Wih in the Y-axis direction of the protective insulating film 36.

In the semiconductor device 100 of the present example, because the side surface of the interlayer dielectric film 38 is tapered, the contact provided in the contact hole 54 is more readily filled to the lower end of the contact hole 54 as compared with the semiconductor device 100 shown in FIG. 14b. Thus, in the first mesa portion 60, the contact resistance between the the contact and the emitter region 12 can be further reduced as compared with the semiconductor device 100 shown in FIG. 14b. In the first mesa portion 60, the contact resistance between the the contact and the contact regions 15 provided on the positive side and the negative side in the X-axis direction of the emitter region 12 can be further reduced as compared with the semiconductor device 100 shown in FIG. 14b.

Figure 18A:
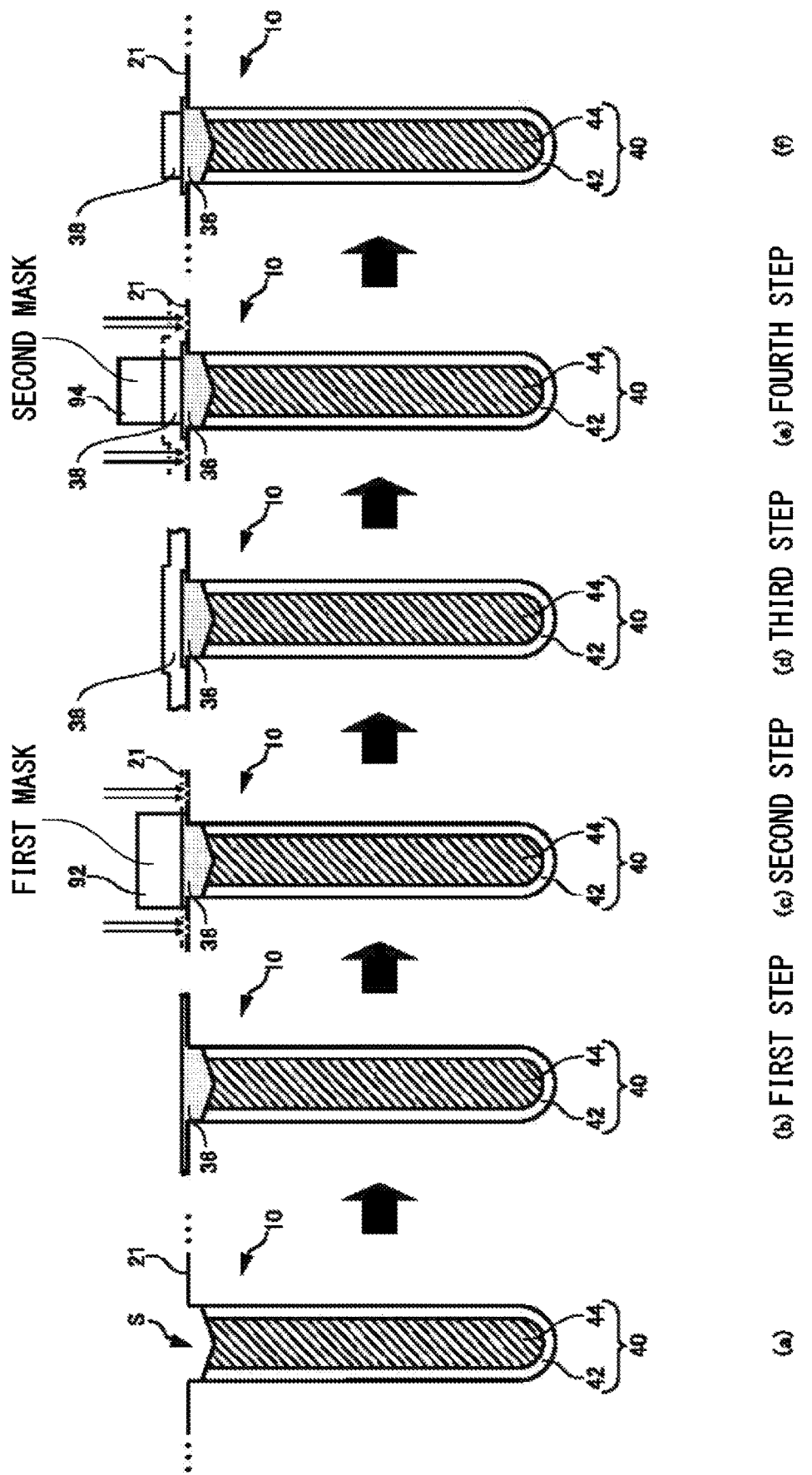
FIG. 18a shows one example for a manufacturing method of the semiconductor device 100 according to the present embodiment.

FIG. 18a shows one example of the manufacturing method of the semiconductor device 100 according to the present embodiment. FIG. 18a is one example of the manufacturing method to manufacture the semiconductor device 100 shown in FIG. 2a and FIG. 2b.

In (a), the gate insulating film 42 and the gate conductive portion 44 in the upper portion of the gate trench portion 40 are formed below the upper surface 21, and the recessed portion S is formed in the upper portion of the gate trench portion 40. Then, in the (b) first step, the protective insulating film 36 is formed on the semiconductor substrate 10. In the present example, the protective insulating film 36 is formed such that it fills the recessed portion S. Then, in the (c) second step, the protective insulating film 36 is patterned and etched with the first mask 92 to expose the upper surface 21 of the semiconductor substrate 10. Then, in the (d) third step, the interlayer dielectric film 38 is formed on the protective insulating film 36. Then, in the (e) fourth step, the interlayer dielectric film 38 is patterned and etched with the second mask 94 to expose the upper surface 21 of the semiconductor substrate 10 and the protective insulating film 36. In the fourth step, the regions in the protective insulating film 36 which is not cover with the interlayer dielectric film 38 in the top view of the semiconductor substrate 10 is exposed. Then, the (f) second mask 94 is removed, and the semiconductor device 100 shown in FIG. 2a and FIG. 2b is completed.

In the manufacturing method of the present example, the (c) second step and the (d) fourth step may be performed by dry etching. The etching gas in the dry etching may be $CF_4$ and $SF_6$ and the like. If the (c) second step and the (d) fourth step may be performed using dry etching, an etching gas in the (c) second step may be different from an etching gas in the (d) fourth step.

FIG. 18b shows another example of the manufacturing method of the semiconductor device 100 according to the present embodiment. FIG. 18b shows one example of the manufacturing method to manufacture the semiconductor device 100 shown in FIG. 8a and FIG. 8b.

The (e) fourth step and (f) in FIG. 18b are the same as (e) the fourth step and (f) in FIG. 18a. The manufacturing method of the semiconductor device 100 in the present example etches the side surface and the upper surface of the interlayer dielectric film 38 using wet etching and makes the side surface of the interlayer dielectric film 38 into a tapered shape in the (g) fifth step after (f). The wet etching in the (g) fifth step may be performed using hydrofluoric acid solution diluted to a predetermined concentration. The wet etching in the (g) fifth step may be performed as a pretreatment before the sputtering of the emitter electrode 52.

Figure 19:
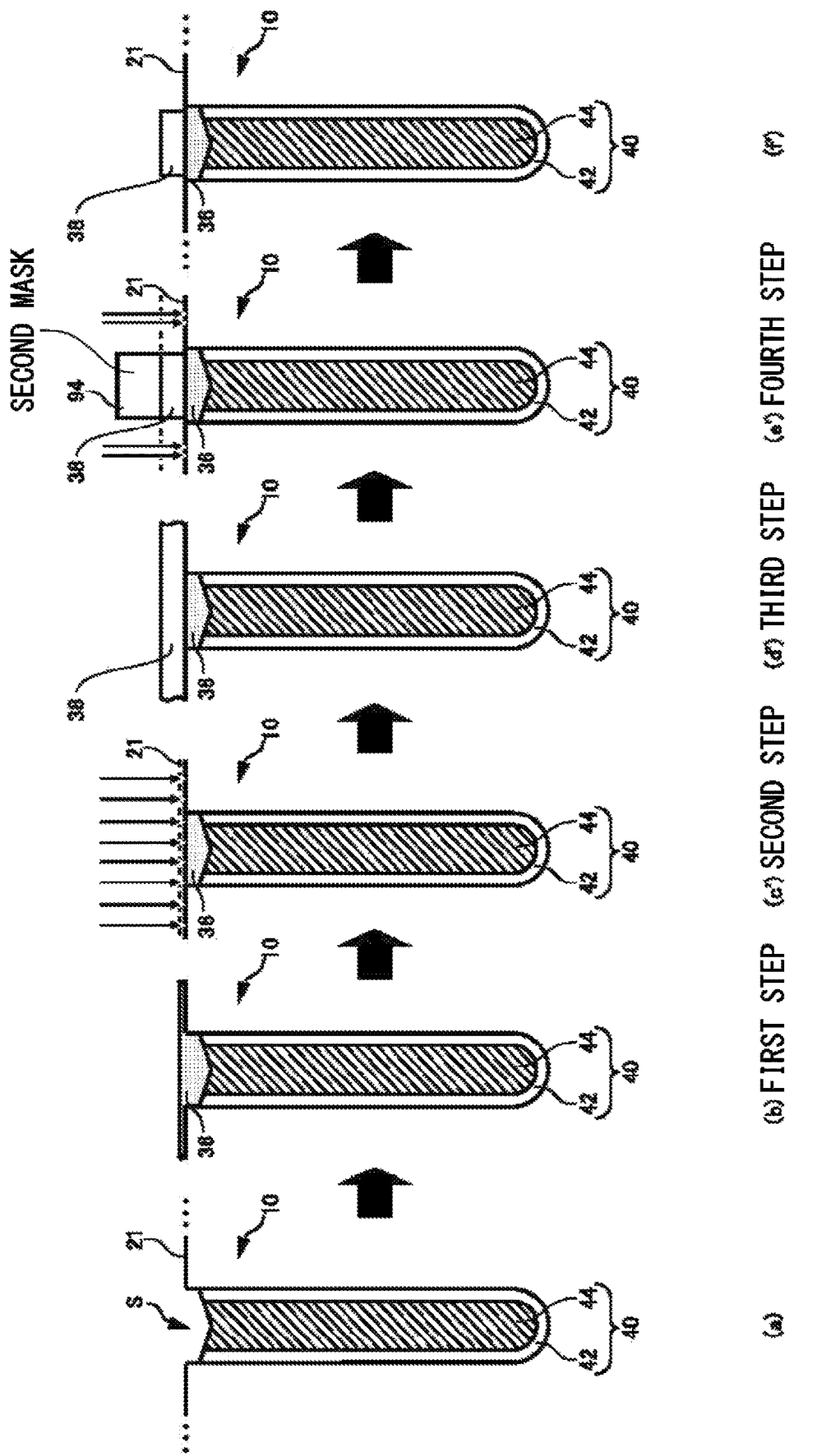
FIG. 19 shows another example for the manufacturing method of the semiconductor device 100 according to the present embodiment.

FIG. 19 shows another example of the manufacturing method of the semiconductor device 100 according to the present embodiment. The manufacturing method of the semiconductor device 100 shown in FIG. 19 is different from the manufacturing method of the semiconductor device 100 shown in FIG. 18a in that CMP (Chemical Mechanical Polishing) is used, instead of etching, in the (b) second step in one example of the manufacturing method shown in FIG. 18a. FIG. 19 is one example of the manufacturing method to manufacture the semiconductor device 100 shown in FIG. 3a and FIG. 3b.

The manufacturing method of the semiconductor device 100 of the present example polishes the protective insulating film 36 using CMP in the (b') second step. In the (b') second step, the upper surface of the protective insulating film 36 and the upper surface 21 are on the same plane. Then, the third step and the fourth step are performed like in FIG. 18a, and the semiconductor device 100 shown in FIG. 3a and FIG. 3b is completed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 semiconductor substrate, 11 well region, 12 emitter region, 14 base region, 15 contact region, 16 accumulation region, 16-1 accumulation region, 16-2 accumulation region, 18 drift region, 20 buffer region, 21 upper surface, 22 collector region, 23 lower surface, 24 collector electrode, 29 extending portion, 30 dummy trench portion, 31 connecting portion, 32 dummy insulating film, 34 dummy conductive portion, 36 protective insulating film, 38 interlayer dielectric film, 39 extending portion, 40 gate trench portion, 41 connecting portion, 42 gate insulating film, 44 gate conductive portion, 48 gate runner, 49 contact hole, 50 gate metal layer, 52 emitter electrode, 54 contact hole, 56 contact hole, 58 barrier metal, 60 first mesa portion, 62 second mesa portion, 64 third mesa portion, 70 transistor portion, 80 diode portion, 82 cathode region, 90 boundary portion, 92 first mask, 94 second mask, 100 semiconductor device, 150 semiconductor device, 238 interlayer dielectric film, 254 contact hole

What is claimed is:

1. A semiconductor device comprising:
a semiconductor substrate;
a gate trench portion provided from an upper surface of the semiconductor substrate into the semiconductor substrate and extending on the upper surface of the semiconductor substrate in a predetermined extending direction;
a gate insulating film that is an oxide film of semiconductor and provided on an inner wall of the gate trench portion;
an interlayer dielectric film provided above the semiconductor substrate;
a single layer of protective insulating film in direct contact with an upper surface of the gate insulating film at a side wall of the gate trench portion, provided between the interlayer dielectric film and the gate trench portion, and made of a different material from the interlayer dielectric film and the gate insulating film, and including a material other than silicon; and
a gate conductive portion within the gate insulating film on the inner wall of the gate trench portion;
wherein the single layer of protective insulating film is in direct contact with the gate conductive portion, and the interlayer dielectric film is in direct contact with the single layer of protective insulating film,
an upper portion of the single layer of protective insulating film protrudes above a plane of the upper surface of the semiconductor substrate, and beyond a position of the trench side wall in an arrangement direction orthogonal to the extending direction,
an upper surface of the gate insulating film is deeper than the upper surface of the semiconductor substrate,
the single layer of protective insulating film and the gate insulating film are coplanar at the side wall of the gate trench portion at a position deeper than the upper surface of the semiconductor substrate,
the single layer of protective insulating film is in direct contact with a first mesa portion, and a width of the single layer of protective insulating film is larger than a width of the gate trench portion width, and
a width of the single layer of protective insulating film is larger than a width of the interlayer dielectric film.

2. The semiconductor device according to claim 1, wherein
an upper end of the gate conductive portion is placed below the upper surface of the semiconductor substrate, and
the single layer of protective insulating film is provided above at least part of the gate conductive portion.

3. The semiconductor device according to claim 2, further comprising
a mesa portion is in contact with the gate trench portion in an arrangement direction orthogonal to the extending direction, wherein
an upper surface of the mesa portion and an upper surface of the protective insulating film are in a same plane.

4. The semiconductor device according to claim 2, further comprising
a mesa portion in direct contact with the gate trench portion in an arrangement direction orthogonal to the extending direction, wherein
the mesa portion and the single layer of protective insulating film are in contact with each other.

5. The semiconductor device according to claim 1, wherein
the interlayer dielectric film and the protective insulating film are in contact with each other, and,
on a boundary where the interlayer dielectric film and the protective insulating film are in contact with each other, a width of the interlayer dielectric film in an arrangement direction orthogonal to the extending direction is equal to a width of the protective insulating film in the arrangement direction.

6. The semiconductor device according to claim 1, wherein a width of the single layer of protective insulating film in an arrangement direction orthogonal to the extending direction is larger than a width of the interlayer dielectric film in the arrangement direction.

7. The semiconductor device according to claim 1, wherein a thickness of the protective insulating film is smaller than a thickness of the interlayer dielectric film.

8. The semiconductor device according to claim 1, wherein the single layer of protective insulating film is a nitride film.

9. A manufacturing method to manufacture the semiconductor device according to claim 1, comprising:
   forming the protective insulating film on the semiconductor substrate;
   patterning and etching the protective insulating film to expose the upper surface of the semiconductor substrate;
   forming the interlayer dielectric film on the protective insulating film; and
   patterning and etching the interlayer dielectric film to expose the upper surface of the semiconductor substrate and the protective insulating film.

10. The manufacturing method for the semiconductor device according to claim 9, wherein the patterning and etching of the protective insulating film and the patterning and etching of the interlayer dielectric film are performed using dry etching.

11. The manufacturing method for the semiconductor device according to claim 10, wherein an etching gas in the patterning and etching of the protective insulating film is different from an etching gas in the patterning and etching of the interlayer dielectric film.

12. The manufacturing method for the semiconductor device according to claim 9, further comprising etching a side surface and an upper surface of the interlayer dielectric film using wet etching.

13. A semiconductor device comprising:
   a semiconductor substrate;
   a gate trench portion provided from an upper surface of the semiconductor substrate into the semiconductor substrate and extending on the upper surface of the semiconductor substrate in a predetermined extending direction;
   a gate insulating film that is an oxide film of semiconductor and provided on an inner wall of the gate trench portion;
   an interlayer dielectric film provided above the semiconductor substrate;
   a single layer of protective insulating film in direct contact with the gate insulating film, provided between the interlayer dielectric film and the gate trench portion, and made of a different material from the interlayer dielectric film and the gate insulating film, and including a material other than silicon; and
   a gate conductive portion within the gate insulating film on the inner wall of the gate trench portion;
   wherein the single layer of protective insulating film is in direct contact with the gate conductive portion, and the interlayer dielectric film is in direct contact with the single layer of protective insulating film,
   the single layer of protective insulating film has an upper portion and a lower portion, a sidewall of the lower portion of the single layer of protective insulating film being coplanar with a sidewall of the gate insulating film,
   the upper portion of the single layer of protective insulating film is in direct contact with the semiconductor substrate and protrudes above a plane of the upper surface of the semiconductor substrate, and beyond a position of the trench side wall in an arrangement direction orthogonal to the extending direction, and
   the lower portion of the single layer of protective insulating film is in direct contact with the inner wall of the gate trench portion.

14. The semiconductor device according to claim 13, wherein
   an upper end of the gate conductive portion is placed below the upper surface of the semiconductor substrate, and
   the single layer of protective insulating film is provided above at least part of the gate conductive portion.

15. The semiconductor device according to claim 14, further comprising
   a mesa portion in direct contact with the gate trench portion in an arrangement direction orthogonal to the extending direction, wherein
   the mesa portion and the single layer of protective insulating film are in direct contact with each other.

16. The semiconductor device according to claim 13, wherein a width of the single layer of protective insulating film in an arrangement direction orthogonal to the extending direction is larger than a width of the interlayer dielectric film in the arrangement direction.

17. The semiconductor device according to claim 13, wherein the single layer of protective insulating film is a nitride film.

* * * * *